(12) United States Patent
Park et al.

(10) Patent No.: US 10,636,943 B2
(45) Date of Patent: Apr. 28, 2020

(54) LIGHT EMITTING DIODE AND LIGHT EMITTING DIODE PACKAGE

(71) Applicant: LG INNOTEK CO., LTD., Seoul (KR)

(72) Inventors: Duk Hyun Park, Seoul (KR); Sung Wook Moon, Seoul (KR); Sang Rock Park, Seoul (KR); Byung Hak Jeong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/747,167

(22) PCT Filed: Aug. 5, 2016

(86) PCT No.: PCT/KR2016/008656
§ 371 (c)(1),
(2) Date: Jan. 24, 2018

(87) PCT Pub. No.: WO2017/026753
PCT Pub. Date: Feb. 16, 2017

(65) Prior Publication Data
US 2018/0219131 A1    Aug. 2, 2018

(30) Foreign Application Priority Data

Aug. 7, 2015  (KR) .................. 10-2015-0111830
Aug. 11, 2015 (KR) .................. 10-2015-0113192
(Continued)

(51) Int. Cl.
*H01L 33/38* (2010.01)
*H01L 33/10* (2010.01)
(Continued)

(52) U.S. Cl.
CPC .......... *H01L 33/38* (2013.01); *H01L 33/0062* (2013.01); *H01L 33/0079* (2013.01);
(Continued)

(58) Field of Classification Search
None
See application file for complete search history.

(56) References Cited

U.S. PATENT DOCUMENTS

2009/0206354 A1  8/2009  Kitano et al.
2009/0212307 A1  8/2009  Baur et al.
(Continued)

FOREIGN PATENT DOCUMENTS

CN    101238591    8/2008
CN    101515614    8/2009
(Continued)

OTHER PUBLICATIONS

International Search Report dated Dec. 6, 2016 issued in Application No. PCT/KR2016/008656.
(Continued)

*Primary Examiner* — Benjamin P Sandvik
(74) *Attorney, Agent, or Firm* — KED & Associates LLP

(57) ABSTRACT

A light emitting device of an embodiment comprises: a lower electrode; a light emitting structure disposed on the lower electrode and including a first conductive semiconductor layer, an active layer, and a second conductive semiconductor layer; an upper electrode pad disposed on the light emitting structure; at least one branch electrode connected to the upper electrode pad; and an upper ohmic layer disposed below the at least one branch electrode, wherein the upper electrode pad may include at least one connecting electrode connected to at least one branch electrode, and at least one connecting electrode may be integrally formed with the upper electrode pad and may project at certain intervals from a side surface of the upper electrode pad.

25 Claims, 36 Drawing Sheets

(30) Foreign Application Priority Data

Aug. 24, 2015 (KR) .......................... 10-2015-0118775
Sep. 1, 2015 (KR) .......................... 10-2015-0123570

(51) Int. Cl.

| | | |
|---|---|---|
| H01L 33/46 | (2010.01) | |
| H01L 33/00 | (2010.01) | |
| H01L 33/06 | (2010.01) | |
| H01L 33/30 | (2010.01) | |
| H01L 33/32 | (2010.01) | |
| H01L 33/40 | (2010.01) | |
| H01L 33/50 | (2010.01) | |
| H01L 33/54 | (2010.01) | |
| H01L 33/60 | (2010.01) | |
| H01L 33/62 | (2010.01) | |
| H01L 33/64 | (2010.01) | |
| H01L 33/22 | (2010.01) | |

(52) U.S. Cl.
CPC .............. *H01L 33/06* (2013.01); *H01L 33/10* (2013.01); *H01L 33/30* (2013.01); *H01L 33/32* (2013.01); *H01L 33/405* (2013.01); *H01L 33/46* (2013.01); *H01L 33/502* (2013.01); *H01L 33/54* (2013.01); *H01L 33/60* (2013.01); *H01L 33/62* (2013.01); *H01L 33/647* (2013.01); *H01L 33/22* (2013.01); *H01L 2224/48091* (2013.01); *H01L 2924/181* (2013.01); *H01L 2933/0016* (2013.01); *H01L 2933/0025* (2013.01)

(56) References Cited

U.S. PATENT DOCUMENTS

| | | | |
|---|---|---|---|
| 2010/0065867 A1* | 3/2010 | Unno | .................. H01L 33/405 |
| | | | 257/98 |
| 2010/0283081 A1 | 11/2010 | Huang et al. | |
| 2010/0327298 A1 | 12/2010 | Konno et al. | |
| 2011/0024781 A1 | 2/2011 | Fujimoto et al. | |
| 2011/0114966 A1 | 5/2011 | Liu et al. | |
| 2012/0241808 A1* | 9/2012 | Akiyama | ................ H01L 33/22 |
| | | | 257/99 |
| 2012/0273793 A1 | 11/2012 | Nishikawa et al. | |
| 2014/0077221 A1 | 3/2014 | Genei et al. | |
| 2014/0209959 A1 | 7/2014 | Park et al. | |
| 2015/0076448 A1 | 3/2015 | Kimura et al. | |
| 2015/0171274 A1* | 6/2015 | Guo | ....................... H01L 33/382 |
| | | | 257/99 |
| 2015/0255680 A1 | 9/2015 | Atsushi et al. | |
| 2015/0325747 A1* | 11/2015 | Mitsugi | .................. H01L 33/38 |
| | | | 257/99 |

FOREIGN PATENT DOCUMENTS

| | | |
|---|---|---|
| CN | 101673794 | 3/2010 |
| CN | 101931038 | 12/2010 |
| CN | 102439741 | 5/2012 |
| CN | 102760815 | 10/2012 |
| CN | 103972362 | 8/2014 |
| CN | 104300055 | 1/2015 |
| CN | 104465908 | 3/2015 |
| CN | 104718632 | 6/2015 |
| JP | 2011-009524 | 1/2011 |
| JP | 2012-204478 | 10/2012 |
| JP | 2012-256811 | 12/2012 |
| JP | 2014-082321 | 5/2014 |
| JP | 2014-131000 | 7/2014 |
| JP | 2015-060978 | 3/2015 |
| KR | 2010-0094651 | 8/2010 |
| KR | 10-1012823 | 2/2011 |
| KR | 10-2013-0078572 | 7/2013 |

OTHER PUBLICATIONS

Extended European Search Report dated Feb. 12, 2019 issued in Application 16835393.6.
Extended European Search Report dated Jun. 7, 2019 issued in Application 16835393.6.
Chinese Office Action dated Oct. 9, 2019 issued in Application No. 201680046399.4.

* cited by examiner

LIGHT EMITTING DIODE AND LIGHT EMITTING DIODE PACKAGE

CROSS-REFERENCE TO RELATED PATENT APPLICATIONS

This application is a U.S. National Stage Application under 35 U.S.C. § 71 of PCT Application No. PCT/KR2016/008656, filed Aug. 5, 2016, which claims priority to Korean Patent Application Nos. 10-2015-0111830, filed Aug. 7, 2015, 10-2015-0113192, filed Aug. 11, 2015, 10-2015-0118775, filed Aug. 24, 2015 and 10-2015-0123570, filed Sep. 1, 2015, whose entire disclosures are hereby incorporated by reference.

TECHNICAL FIELD

Embodiments relate to a light emitting device, a method for manufacturing the light emitting device, a light emitting device package, and a lighting device.

BACKGROUND ART

Since semiconductor devices including compounds such as GaN, AlGaN, and the like have many advantages such as wide and easily adjustable bandgap energy, the semiconductor devices are being variously used as light emitting devices, light receiving devices, and various diodes. Particularly, light emitting devices using the group III-V or II-VI compound semiconductor materials of semiconductors may be p-b junction diodes having characteristics in which electrical energy is converted into light energy and may be produced by using compound semiconductors such as the groups in the periodic table to realize various colors by adjusting a composition ratio of the compound semiconductors.

In such a light emitting device, when a forward voltage is applied, electrons in an n-layer and holes in a p-layer are coupled to each other to emit energy corresponding to an energy gap between a conduction band and a valance band. Here, the energy may be mainly emitted in the form of heat or light, and also, when the energy is emitted in the form of the light, it becomes a light emitting device.

The light emitting device may adjust a composition ratio of semiconductor compounds to realize various colors. For example, the light emitting device may be a blue light emitting device, a green light emitting device, an ultraviolet (UV) light emitting device, or a red light emitting device.

A general light emitting device includes a light emitting structure including an active layer and first and second conductive type semiconductor layers, which dopants different from each other, with the active layer therebetween. In addition, the light emitting device includes electrodes connected to the first and second conductive type semiconductor layers.

The general light emitting device increases in operation voltage and decreases in output voltage due to a current crowding phenomenon which occurs by concentrating current around the electrodes. Also, the electrodes may absorb or block the light to deteriorate light extraction efficiency.

DISCLOSURE OF THE INVENTION

Technical Problem

Embodiments provide a light emitting device, which is capable of improving current crowding and reducing a light loss to improve a luminous flux, a method for manufacturing the light emitting device, a light emitting device package, and a lighting device.

Embodiments provide a light emitting device that is capable of improving light extraction efficiency and luminous intensity, a method for manufacturing the light emitting device, a light emitting device package, and a lighting device.

Technical Solution

A light emitting device according to an embodiment includes: a lower electrode; a light emitting structure disposed on the lower electrode and including a first conductive type semiconductor layer, an active layer, and a second conductive type semiconductor layer; an upper electrode pad disposed on the light emitting structure; at least one branch electrode connected to the upper electrode pad; and an upper ohmic layer disposed below the at least one branch electrode, wherein the upper electrode pad includes at least one connection electrode connected to the at least one branch electrode, and the at least one connection electrode has an integral structure with the upper electrode pad and protrudes from a side surface of the upper electrode pad by a predetermined distance.

A light emitting device according to an embodiment includes: a lower electrode; a light emitting structure disposed on the lower electrode and including a first conductive type semiconductor layer including a first conductive type semiconductor layer that includes a first conductive type dopant, an active layer, and a second conductive type semiconductor layer that includes a second conductive type dopant; a first window semiconductor layer disposed between the lower electrode and the light emitting structure and including a second conductive type dopant; an upper electrode disposed on the light emitting structure; and a second window semiconductor layer disposed between the light emitting structure and the upper electrode and including a first conductive type dopant, wherein the first window semiconductor layer directly contacts the second conductive type semiconductor layer, and the second window semiconductor layer directly contacts the first conductive type semiconductor layer and has a doping concentration and a thickness, which are greater than those of the first conductive type semiconductor layer.

A light emitting device according to an embodiment includes: a lower electrode; a light emitting structure disposed on the lower electrode and including a first conductive type semiconductor layer, an active layer, and a second conductive type semiconductor layer; a first reflection layer disposed below the light emitting structure; an upper electrode pad disposed on the light emitting structure; at least one branch electrode connected to the upper electrode pad; and a conductive layer disposed below the at least one branch electrode, wherein the lower electrode includes a lower ohmic pattern coming into ohmic contact with the light emitting structure and disposed in parallel to the first reflection layer and a second reflection layer disposed below the lower ohmic pattern and the first reflection layer, the lower ohmic pattern includes a first lower ohmic pattern and a second lower ohmic pattern disposed on an area that vertically overlaps the light emitting structure, and the second lower ohmic pattern has a surface area of 0.6% to 4.0% with respect to a surface area of the first reflection layer vertically overlapping the active layer.

A light emitting device according to an embodiment includes: a lower electrode; a light emitting structure disposed on the lower electrode and including a first conductive type semiconductor layer that includes a first conductive type dopant, an active layer, and a second conductive type semiconductor layer that includes a second conductive type dopant; a window semiconductor layer disposed between the lower electrode and the light emitting structure and including a plurality of recesses; and a first reflection layer disposed in the plurality of recesses of the window layer and extending from the recess adjacent to an edge of the window layer to an end of the edge of the window layer, wherein the first reflection layer has a pair structure of first and second dielectric layers having refractive indexes different from each other and has a thickness of $\lambda/4n$, and the first and second dielectric layers have a structure of four or more pairs.

A light emitting device package according to an embodiment may include the light emitting device.

Advantageous Effects

In the embodiments, the connection electrode protruding from the upper electrode pad and the branch electrode may be connected to each other to improve the current spreading.

In the embodiments, the connection electrode protruding from the upper electrode pad and the branch electrode may be connected to each other to reduce the surface area of the upper ohmic layer, thereby improving the light loss due to the light absorption.

In the embodiments, the current spreading and the light loss may be improved to improve the luminous flux.

In the embodiments, the window semiconductor layer may be disposed between the upper electrode and the lower electrode to improve the upper and lower current spreading of the light emitting structure.

In the embodiments, the current spreading and the light extraction efficiency may be improved to improve the luminous flux.

In the embodiments, the luminous flux of the light emitting device may be improved by the second lower ohmic pattern having the surface area corresponding to 5.0% or less of that of the first reflection layer vertically overlapping the active layer to improve the operation voltage VF.

Also, in the embodiments, the first and second lower ohmic patterns may not vertically overlap the upper electrode pad and the branch electrode to improve the droop of the light.

Also, in the embodiments, the upper electrode pad and the light emitting structure may come into schottky contact with each other, and the conductive layer may be disposed under the branch electrode, or the upper electrode pad having the resistance greater than that of the branch electrode may be provided to improve the current spreading.

In the embodiments, the light emitted from the light emitting structure may be reflected to the various directions by the reflection layer disposed on the window layer including the plurality of recesses to improve the light extraction efficiency of the light emitting device.

MODE FOR CARRYING OUT THE INVENTION

In the description of embodiments, it will be understood that when a layer (or film), region, pattern or structure is referred to as being 'con/over' or 'under' another layer (or film), region, pattern or structure, the terminology of 'con/over' and 'under' includes both the meanings of 'directly' and 'indirectly'. Further, the reference about 'on/over' and 'under' each layer will be made on the basis of drawings. The embodiments may be modified in other forms, or various embodiments may be combined with each other, and the scope of the present invention is not limited to each embodiment described below. Although contents described in the specific embodiment are not described in the other embodiments, the contents may be understood as being related to the other embodiments unless otherwise described or contradicted by those in the other embodiments. For example, if the features for configuration A are described in a particular embodiment and the features for configuration B are described in another embodiment, even if the embodiment in which configuration A and configuration B are combined with each other is not explicitly described, it is to be understood that they fall within the scope of the invention.

Figure 1:
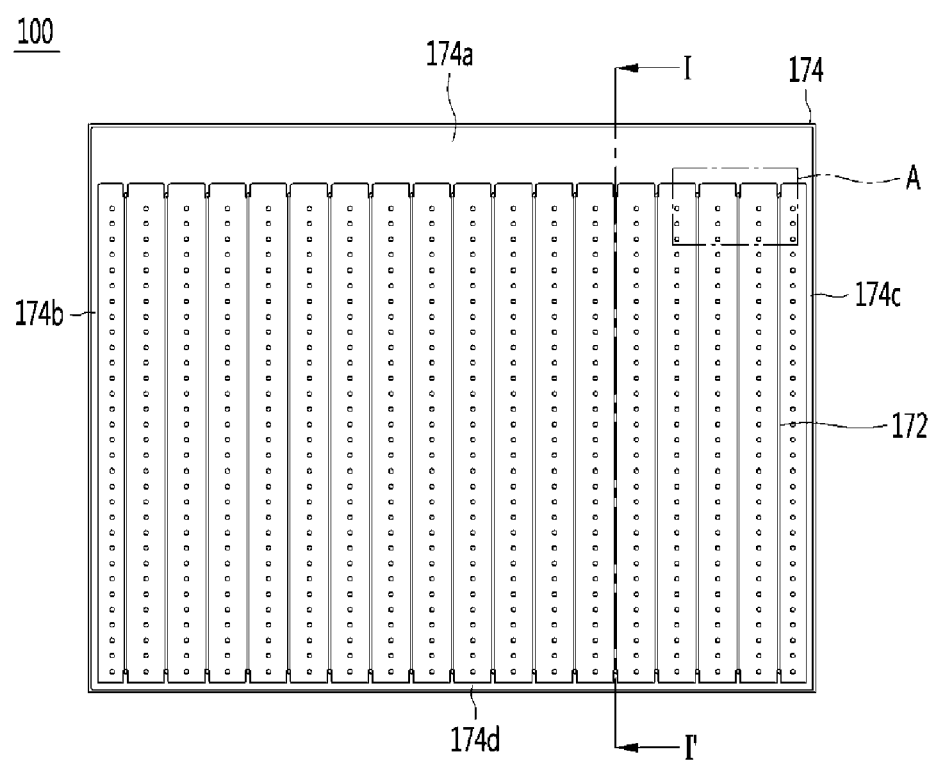
FIG. 1 is a plan view of a light emitting device according to a first embodiment.
Figure 2:
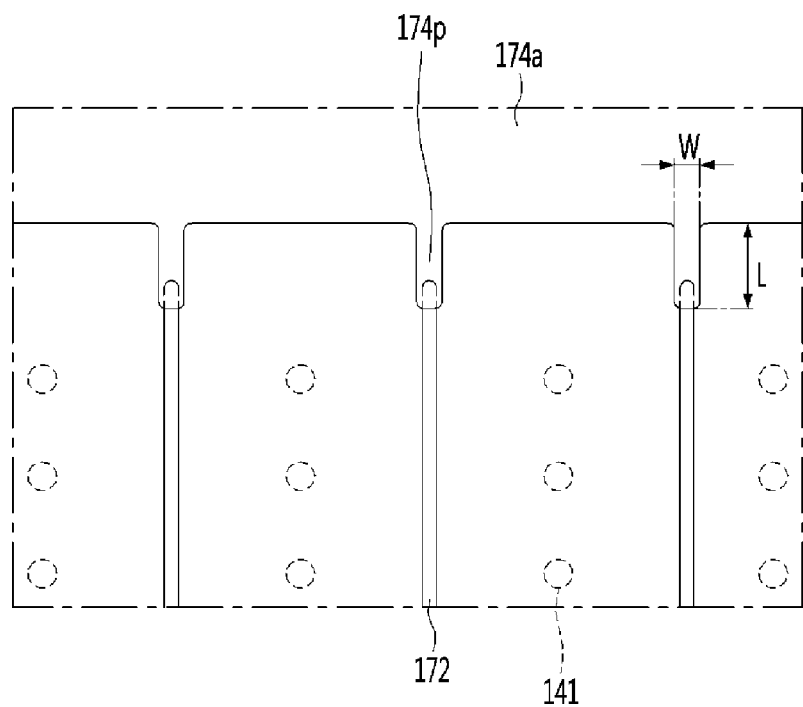
FIG. 2 is a view illustrating a portion A of FIG. 1.
Figure 3:
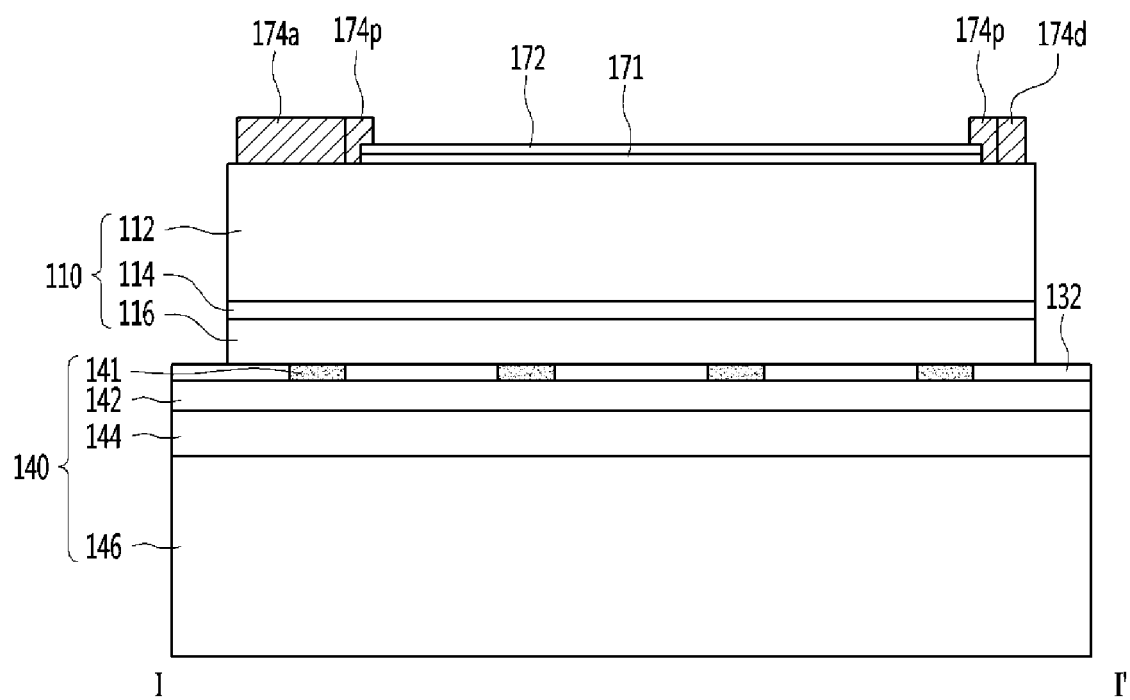
FIG. 3 is a cross-sectional view of the light emitting device, taken along line I-I' of FIG. 1.

FIG. 1 is a plan view of a light emitting device according to a first embodiment, FIG. 2 is a view illustrating a portion A of FIG. 1, and FIG. 3 is a cross-sectional view of the light emitting device, taken along line I-I' of FIG. 1.

As illustrated in FIGS. 1 to 3, a light emitting device 100 according to a first embodiment may include a light emitting structure 110, an upper electrode pad 174, a branch electrode 172, a first reflection layer 132, and a lower electrode 140.

The light emitting structure 110 may be disposed on the lower electrode 140, and the upper electrode pad 174 and the branch electrode 172 may be disposed on the light emitting structure 110.

The light emitting structure 110 may include a first conductive type semiconductor layer 112, an active layer 114 disposed below the first conductive type semiconductor layer 112, and a second conductive type semiconductor layer 116 on the active layer 114.

The lower electrode 140 may include a lower ohmic pattern 141, a second reflection layer 142, a bonding layer 144, and a support substrate 146.

The lower ohmic pattern 141 may contact a bottom surface of the light emitting structure 110. The lower ohmic pattern 141 may directly contact the light emitting structure 110. That is, the second conductive type semiconductor layer 116 may contact the lower ohmic pattern 141 and be disposed on a top surface of the lower ohmic pattern 141.

The second reflection layer 142 may be provided as a single layer or a plurality of layers, which is made of a material having superior electrical contact properties and high reflectivity.

Each of the bonding layer 144 and the support member 146 may be provided as a single layer or a plurality of layers.

The first reflection layer 132 may be disposed on the same plane as a plane of the lower ohmic pattern 141. The first reflection layer 132 may be disposed in parallel to the lower ohmic pattern 141. For example, the lower ohmic patterns 141 may be spaced apart from each other in a dot shape. The first reflection layer 132 may have a diameter or a horizontal width, which is greater than a width of the lower ohmic pattern 141 disposed between the first reflection layers 132, but is not limited thereto. The first reflection layer 132 may have the same thickness as the lower ohmic pattern 141, but is not limited thereto. The first reflection layer 132 may directly contact a bottom surface of the light emitting structure 110. The first reflection layer 132 may directly contact the second conductive type semiconductor layer 116. The first reflection layer 132 may be provided as a single layer or a plurality of layers.

The light emitting device 100 according to an embodiment may include the upper electrode pad 174 and the branch electrode 172. Although one upper electrode pad 174 and the plurality of branch electrodes 172 are described in this embodiment, the present invention is not limited thereto. For example, at least two or more upper electrode pads 174 and branch electrodes 172 may be provided. Here, in this embodiment, an upper ohmic layer 171 may be disposed between the first conductive type semiconductor layer 112 and the branch electrode 172. The upper ohmic layer 171 may be disposed below the branch electrode 172. The upper ohmic layer 171 may be provided as a single layer or a plurality of layers, which is made of a material having superior electrical contact properties with respect to the semiconductor.

The upper electrode pad 174 may be disposed along an edge of the light emitting structure 110. The upper electrode pad 174 may include four side parts along the edge of the light emitting structure 110. Particularly, the upper electrode pad 174 may include a first side part 174a connected to a wire, second and third side parts 174b and 174c respectively connected to both ends of the first side part 174a, and a fourth side part 174d connected to ends of the second and third side parts 174b and 174c to face the first side part 174a. The first side part 174a may have a surface area greater than that of each of the second to fourth side parts 174b, 174c, and 174d. The first side part 174a may have a width greater than that of each of the second to fourth side parts 174b, 174c, and 174d. For example, the first side part 174a may have a width of 100 µm or more for wire bonding, but is not limited thereto. The second to fourth side parts 174b, 174c, and 174d may have the same width, but is not limited thereto.

The upper electrode pad 174 may be disposed on a top surface of the first conductive type semiconductor layer 112. The upper electrode pad 174 may directly contact the first conductive type semiconductor layer 112. The upper electrode pad 174 may have an area coming into schottky contact with the first conductive type semiconductor layer 112. For example, current may be limited between the upper electrode pad 174 and the first conductive type semiconductor layer 112 through a potential barrier of a junction part due to reverse bias. Thus, the upper electrode pad 174 may not come into ohmic contact with the first conductive type semiconductor layer 112. Thus, in this embodiment, since current is induced to flow to the branch electrode 172 coming into ohmic contact with the first conductive type semiconductor layer 112, a current spreading effect may be generally improved to improve a light output.

The upper electrode pad 174 may include at least one connection electrode 174p. The connection electrode 174p may be provided in plurality. The connection electrode 174p may protrude from a side surface of the upper electrode pad 174. The connection electrode 174p may have an integral structure with the upper electrode pad 174 or be provided as a component separated from the upper electrode pad 174. The connection electrode 174p may protrude from the side surface of the upper electrode pad 174 and be electrically connected to the branch electrode 172. The connection electrode 174p may protrude inward from the upper electrode pad 174. For example, the connection electrode 174p may protrude from the first side part 174a of the upper electrode pad 174 toward the fourth side part 174d. Also, the connection electrode 174p may protrude from the fourth side part 174d toward the first side part 174a.

The connection electrode 174p may have a function of transmitting current from the upper electrode pad 174 to the branch electrode 172. That is, the current provided from the upper electrode pad 174 may be provided to the branch electrode 172 by the connection electrode 174a. Thus, in the light emitting device 100 according to this embodiment, the current to be concentrated into the upper electrode pad 174 by the connection electrode 174p may be transmitted to the connection electrode 174p to improve the current spreading, thereby improving luminous intensity. Also, in this embodiment, since the branch electrode 1172 has a surface area that is reduced by a length of the connection electrode 174p, the upper ohmic layer 171 disposed below the branch electrode 172 may be reduced in area. That is, since the upper ohmic layer 171 having bandgap energy greater than that of the active layer 114 is reduced in surface area, light absorption by the upper ohmic layer 171 may be reduced to improve a light loss.

The connection electrode 174p may have a thickness corresponding to that of the upper electrode pad 174, but is not limited thereto. The connection electrode 174p may protrude to be spaced apart from the side surface of the upper electrode pad 174 by a predetermined distance. The connection electrodes 174p may have a distance of 50 μm to 150 μm therebetween, but is not limited thereto. The adjacent connection electrodes 174p may be disposed at a distance of 50 μm to 150 μm to reduce the light absorption, thereby improving luminous flux and the current spreading effect. When the distance between the connection electrodes 174p is less than 50 μm, each of the connection electrode 174p and the branch electrode 172 may increase in surface area to reduce the luminous flux by the light absorption. When the distance between the connection electrodes 174p exceeds 150 μm, each of the distance between the connection electrode 174p and the distance between the branch electrodes 172 may decrease to generally decrease in current spreading effect and increase in operation voltage VF3.

The connection electrode 174p may overlap a portion of the branch electrode 172. A portion of a top surface of the connection electrode 174p may vertically overlap a portion of each of the branch electrode 172 and the upper ohmic layer 171. A portion of a bottom surface of the connection electrode 174p may directly contact a portion of a top surface of the branch electrode 172 and a portion of a side surface of the upper ohmic layer 171. For example, an overlapping area of the branch electrode 172 and the connection electrode 174p may be 1% to 90% of the entire area of the connection electrode 174p. For example, the overlapping area of the branch electrode 172 and the connection electrode 174p may be 20% to 50% of the entire area of the connection electrode 174p, but is not limited thereto. The branch electrode 172 and the connection electrode 174p may overlap each other by 1% to 90% of the entire area of the connection electrode 174p to improve the current spreading effect while maintaining reliability in connection between the branch electrode 172 and the connection electrode 174p.

When the overlapping area of the connection electrode 174p that overlaps the branch electrode 172 is less than 1% of the entire area of the connection electrode 174p, the reliability in connection between the branch electrode 172 and the connection electrode 174p may be deteriorated. When the overlapping area of the connection electrode 174p that overlaps the branch electrode 172 exceeds 90% of the entire area of the connection electrode 174p, the current spreading effect may be deteriorated. The connection electrode 174p may be disposed on the top surface of the first conductive type semiconductor layer 112 and the top surface of the branch electrode 172. The connection electrode 174p may have a width that is constant from an area adjacent to the upper electrode pad 174 to an end, but is not limited thereto. For example, the connection electrode 174p may have a width that is gradually narrowed in a direction that is away from the upper electrode pad 174. That is, the end of the connection electrode 174p may have a width less than that of the connection electrode 174p adjacent to the upper electrode pad 174. The end of the connection electrode 174p may have a curvature in a hemisphere shape.

The connection electrode 174p may have a length L of 20 μm or more. For example, the connection electrode 174p may have a length L of 20 μm to 60 μm. When the length L of the connection electrode 174p is less than 20 μm, the current spreading may be reduced. When the length L of the connection electrode 174p exceeds 60 μm, light transmittance may be reduced to deteriorate light extraction efficiency by the connection electrode 174p having the low light transmittance and increase in operation voltage VF3.

The connection electrode 174p may have a width W of 5 μm or more. For example, the connection electrode 174p may have a width W of 5 μm to 20 μm. When the width W of the connection electrode 174p is less than 5 μm, current may be crowded around the connection electrode 174p by the thin width to increase in operation voltage VF3. When the width W of the connection electrode 174p exceeds 20 μm, light transmittance may be reduced to deteriorate the light extraction efficiency by the connection electrode 174p having the low light transmittance.

The connection electrode 174p may have a width W equal to or greater than that of the branch electrode 172, but is not limited thereto.

Each of the upper electrode pad 174 and the connection electrode 174p may be provided as a single layer or a plurality of layers and also be made of at least one of Ti, Cr, Ni, Al, Pt, Au, W, Cu, Mo, and Cu—W, but is not limited thereto.

In a first embodiment, the upper electrode pad 174 is continuously disposed along the edge of the light emitting structure 110, the connection electrodes 174p are disposed to face each other from the first side part 174a and the fourth side part 174d of the upper electrode pad 174, which face each other, and the plurality of branch electrodes 172 are disposed inside the upper electrode pad 174, but are not limited thereto.

In the light emitting device 100 according to the first embodiment, the connection electrode 174p protruding from the upper electrode pad 174 and the branch electrode 172 may be connected to each other to improve the current spreading, and the upper ohmic layer 171 having the bandgap energy greater than that of the active layer 114 may have a surface area that decreases to reduce the light absorption, thereby improving the light loss.

Thus, the light emitting device 100 according to the first embodiment may be improved in current spreading to reduce the light loss, thereby improving the luminous intensity.

Figure 4:
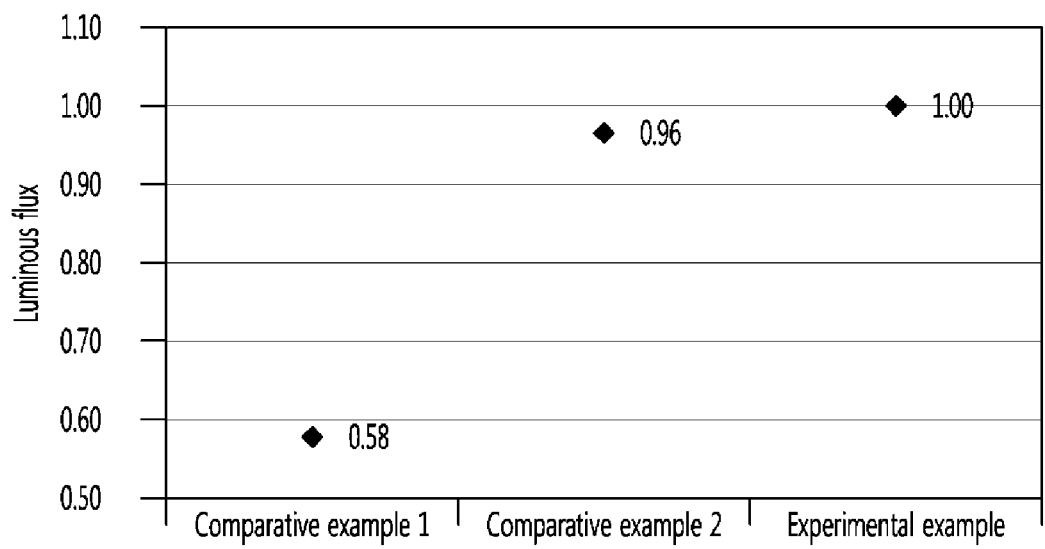
FIG. 4 is a view illustrating results obtained by comparing luminous intensities according to Comparative examples 1 and 2 to Embodiment.

FIG. 4 is a view illustrating results obtained by comparing luminous intensities according to Comparative examples 1 and 2 to Embodiment.

Comparative example 1 includes an upper electrode pad and a branch electrode, which has an integral structure with each other and made of the same resistance as each other. That is, in Comparative example 1, the upper electrode pad and the branch electrode may have the same thickness, material, and resistance, and also, the upper electrode pad and the branch electrode may directly contact a light emitting structure. That is, in Comparative example 1, an upper ohmic layer below the upper electrode pad and the branch electrode may be removed.

Comparative example 2 includes an upper electrode pad and a branch electrode and also includes an upper ohmic layer below the branch electrode. A portion of the branch electrode may be disposed below the upper electrode pad to directly contact the upper electrode pad. That is, in Comparative example 2, the branch electrode may come into direct contact with the upper electrode pad.

Embodiment may adopt the technical features of FIGS. 1 to 3. That is, Embodiment includes a connection electrode protruding from an upper electrode pad, and the connection electrode may be connected to a branch electrode.

Comparing Comparative example 1 and 2 to Embodiment, in Embodiment, a luminous flux is improved by 40% or more than that of Comparative example 1 and is improved by 4% or more than that of Comparative example 2 through the connection electrode protruding from the upper electrode pad.

Hereinafter, a method of manufacturing the light emitting device according to the first embodiment will be described with reference to FIGS. 5 to 10.

Figure 5:
FIGS. 5 to 10 are views illustrating a method for manufacturing the light emitting device according to the first embodiment.

Referring to FIG. 5, a substrate 102 is prepared. The substrate 102 may be made of a material having high thermal conductivity. Also, the substrate 102 may be provided as a single layer or a multi layer. The substrate 102 may be a conductive substrate or an insulation substrate. For example, the substrate 102 may be made of at least one of GaAs, sapphire (Al2O3), SiC, Si, GaN, ZnO, GaP, InP, Ge, and Ga2O3. A cleaning process may be performed on the substrate 102 before a light emitting structure 110 is formed to remove impurities on a surface of the substrate 102.

The light emitting structure 110 may be formed on the substrate 102. The light emitting structure 110 may emit light having a red wavelength, but is not limited thereto. The light emitting structure 110 may include a first conductive type semiconductor layer 112, an active layer 114 formed on the first conductive type semiconductor layer 112, and a second conductive type semiconductor layer 116 formed on the active layer 114. The light emitting structure 110 may have a cross-section with the same width or a width that gradually decreases toward the second conductive type semiconductor layer 116, the active layer 114, and the first conductive type semiconductor layer 112, but is not limited thereto.

The first conductive type semiconductor layer 112 may be realized by using a semiconductor compound, for example, a group-group and a compound semiconductor such as a group-group. The first conductive type semiconductor layer 112 may be provided as a single layer or a multi layer. A first conductive type dopant may be doped into the first conductive type semiconductor layer 112. For example, when the first conductive type semiconductor layer 112 is an n-type semiconductor layer, an n-type dopant may be doped. For example, the n-type dopant may include Si, Ge, Sn, Se, and Te, but is not limited thereto. The first conductive type semiconductor layer 112 may include a semiconductor material having a compositional formula of $In_xAl_yGa_{1-x-y}P$ ($0 \leq x \leq 1$, $0 \leq y \leq 1$, $0 \leq x+y \leq 1$), but is not limited thereto. For example, the first conductive type semiconductor layer 112 may be made of at least one of AlGaP, InGaP, AlInGaP, InP, GaN, InN, AlN, InGaN, AlGaN, InAlGaN, AlInN, AlGaAs, InGaAs, AlInGaAs, and GaP.

The first conductive type semiconductor layer 112 may be formed by using a method such as chemical vapor deposition (CVD), molecular beam epitaxy (MBE), sputtering, or hydride vapor phase epitaxy (HVPE), but is not limited thereto.

The active layer 114 may be formed on the first conductive type semiconductor layer 112.

The active layer 114 may selectively include a single quantum well structure, a multi quantum well (MQW) structure, a quantum wire structure, or a quantum dot structure. The active layer 114 may be made of a compound semiconductor. The active layer 114 may be realized by using, for example, at least one of a group-group and a group-group compound semiconductor.

The active layer 114 may include a quantum well and a quantum barrier. When the active layer 114 has a multi quantum well structure, the quantum well and the quantum barrier may be alternately disposed. Each of the quantum well and the quantum barrier may be made of a semiconductor material having a compositional formula of $In_xAl_yGa_{1-x-y}P$ ($0 \leq x \leq 1$, $0 \leq y \leq 1$, $0 \leq x+y \leq 1$) or have a structure of one or more pairs of GaInP/AlGaInP, GaP/AlGaP, InGaP/AlGaP, InGaN/GaN, InGaN/InGaN, GaN/AlGaN, InAlGaN/GaN, GaAs/AlGaAs, and InGaAs/AlGaAs, but is not limited thereto.

The second conductive type semiconductor layer 116 may be formed on the active layer 114. The second conductive type semiconductor layer 116 may be realized by using a semiconductor compound, for example, a group-group and a group-group compound semiconductor. The second conductive type semiconductor layer 116 may be provided as a single layer or a multi layer. A second conductive type dopant may be doped into the second conductive type semiconductor layer 116. For example, the second conductive type AlGaN-based semiconductor layer 116 may include a semiconductor material having a compositional formula of $In_xAl_yGa_{1-x-y}P$ ($0 \leq x \leq 1$, $0 \leq y \leq 1$, $0 \leq x+y \leq 1$), but is not limited thereto. When the second conductive type AlGaN-based semiconductor layer 116 is a p-type semiconductor layer, the second conductive type dopant may include Mg, Zn, Ca, Sr, or Ba as a p-type dopant.

Although the first conductive type AlGaN-based semiconductor layer 112 is provided as the n-type semiconductor layer, and the second conductive type AlGaN-based semiconductor layer 116 is provided as the p-type semiconductor layer, the first conductive type AlGaN-based semiconductor layer 112 may be provided as the p-type semiconductor layer, and the second conductive type AlGaN-based semiconductor layer 116 is provided as the n-type semiconductor layer, but are not limited thereto. A semiconductor having a polarity opposite to the second conductive type semiconductor, for example, an n-type semiconductor layer (not shown) may be formed on the second conductive type AlGaN-based semiconductor layer 116. Thus, the light emitting structure 110 may have one structure of an n-p junction structure, a p-n junction structure, an n-p-n junction structure, and a p-n-p junction structure.

Figure 6:
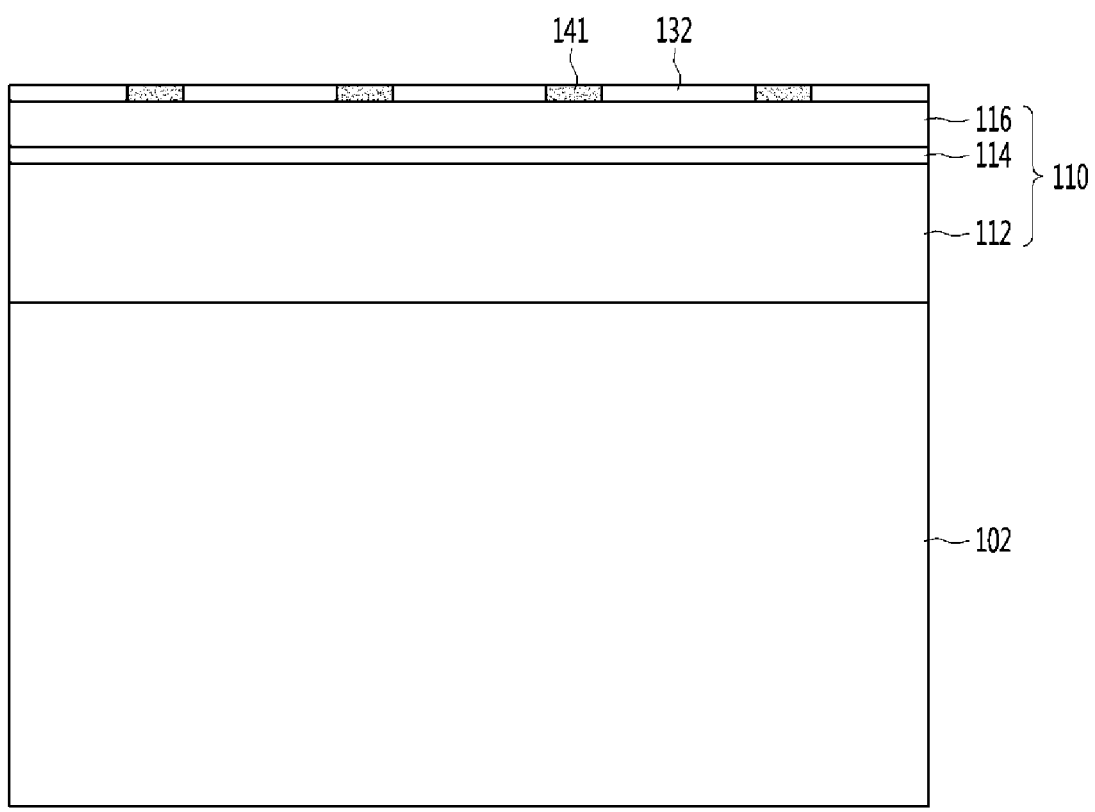

Referring to FIG. 6, the first reflection layer 132 and the lower ohmic pattern 141 may be formed on the light emitting structure 110.

For example, the first reflection layer 132 may be deposited on the light emitting structure 110 and include a plurality of holes (not shown), through which the light emitting structure 110 is exposed, formed through an etching process using photoresist. The lower ohmic pattern 141 may be deposited on the plurality of holes, but is not limited thereto.

The lower ohmic pattern 141 may be made of a material having superior electrical contact properties with respect to the semiconductor. Also, the lower ohmic pattern 141 may be provided as a single layer or a multi layer. The lower ohmic pattern 141 may include at least one of Ag, Ni, Cr, Ti, Al, Rh, Pd, Ir, Ru, Mg, Zn, Pt, Au, Hf, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZON (IZO Nitride), AGZO (Al—Ga ZnO), IGZO (In—Ga ZnO), ZnO, IrOx, RuOx, NiO, RuOx/ITO, Ni/IrOx/Au, and Ni/IrOx/Au/ITO, but is not limited to the above-described materials.

The lower ohmic pattern 141 may directly contact the second conductive type semiconductor layer 116. Although not shown, a separate reflection layer (not shown) may be formed between the lower ohmic pattern 141 and the second conductive type semiconductor layer 116.

The first reflection layer 132 may include at least one metal layer (not shown) and at least one insulation layer (not shown), but is not limited thereto. Also, the first reflection layer 132 may be a distributed bragg reflector (DBR), but is not limited thereto.

Figure 7:
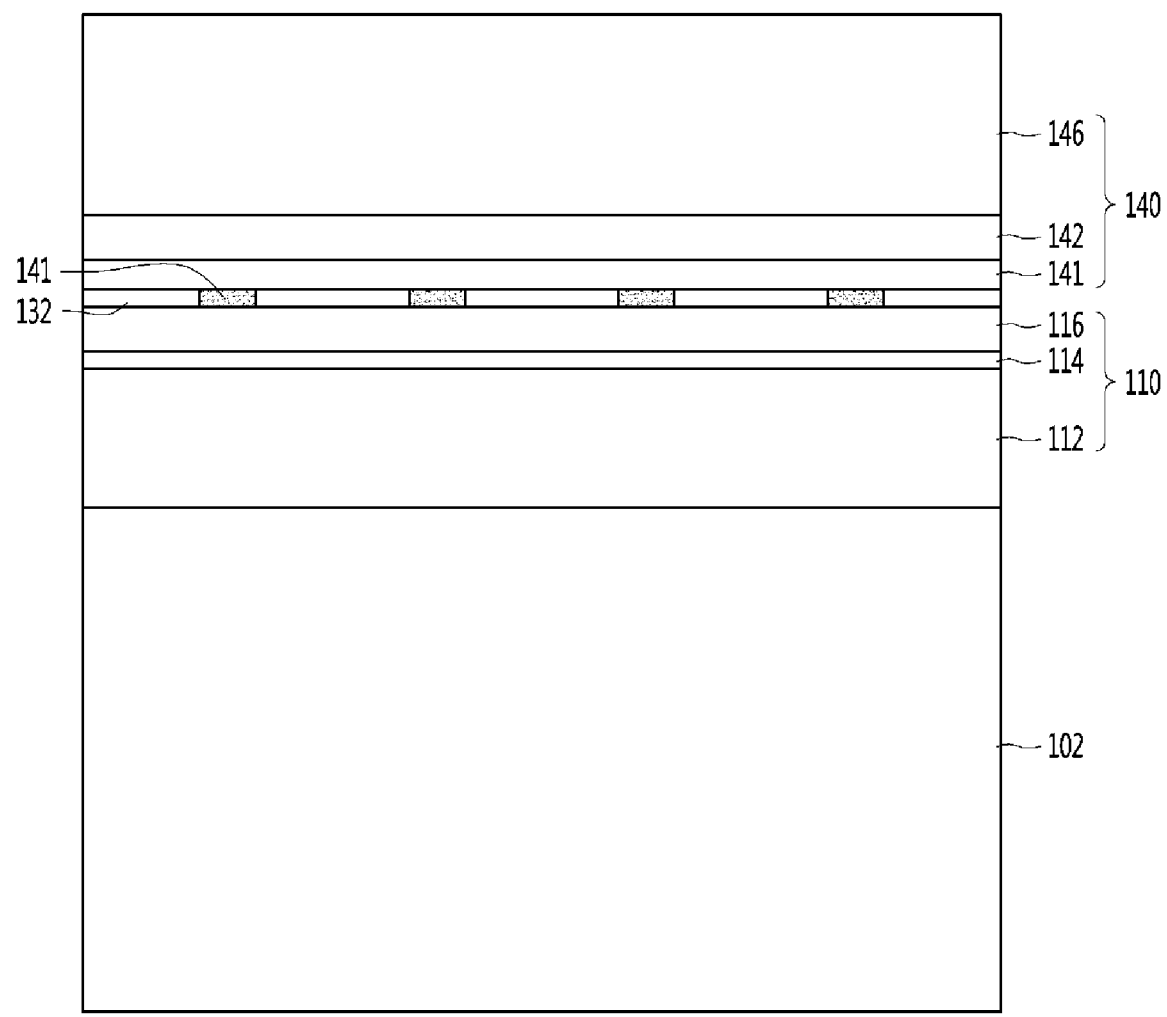

Referring to FIG. 7, a lower electrode 140 may be formed on the light emitting structure 110. Here, the lower electrode 140 may include the constituents of the lower ohmic pattern 141, but is not limited thereto.

The lower electrode 140 may include a second reflection layer 142, a bonding layer 144, and a support substrate 146.

The second reflection layer 142 may be provided as a single layer or a multi layer. The second reflection layer 142 may be made of a material having superior electrical contact properties and high reflectivity. For example, the second reflection layer 142 may be provided as a single layer or a multi layer, which is made of a metal or an alloy including at least one of Pd, Ir, Ru, Mg, Zn, Pt, Ag, Ni, Al, Rh, Au, and Hf.

Also, the bonding layer 144 may be provided as a single layer or a multi layer. Also, the bonding layer 144 may be made of a material having superior electrical contact properties. For example, the bonding layer 144 may be made of Ni, Ti, Au, or an alloy thereof, but is not limited thereto.

Also, the support substrate 146 may be provided as a single layer or a multi layer. Also, the support substrate 146 may be made of a material having superior electrical contact properties. For example, the support substrate 146 may selectively include a carrier wafer (e.g., GaN, Si, Ge, GaAs, ZnO, SiGe, SiC, etc), Cu, Au, Cu Alloy, Ni, Cu—W, and the like.

Figure 8:
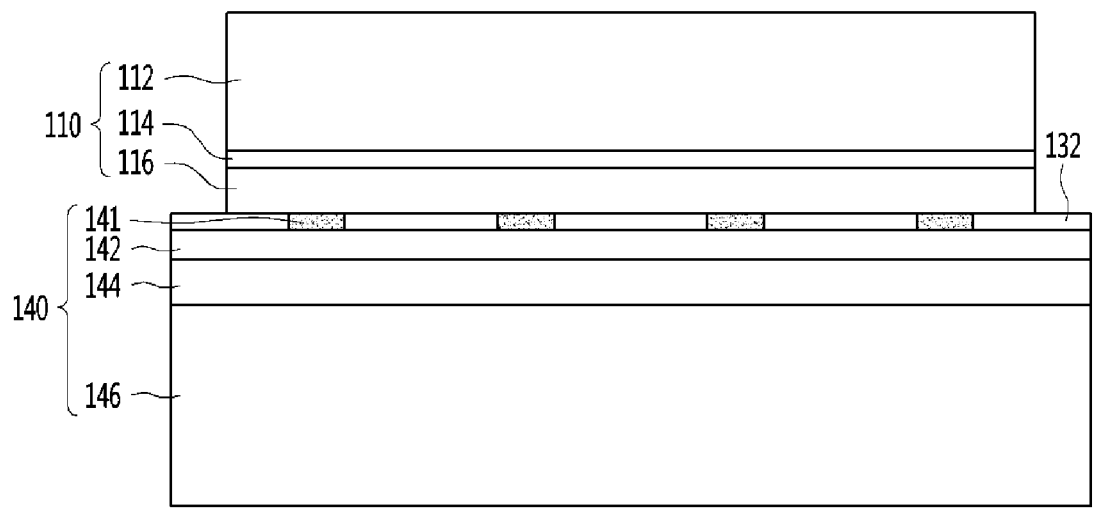

Referring to FIG. 8, the substrate (see reference numeral 102 of FIG. 7) may be removed. The substrate (see reference numeral 102 of FIG. 7) may be removed through laser, chemical etching, or physical etching. For example, the substrate (see reference numeral 102 of FIG. 7) may be removed through a laser lift-off method. According to the laser lift-off method, energy may be applied to an interface between the substrate (see reference numeral 102 of FIG. 7) and the light emitting structure 110 to allow a bonded surface of the light emitting structure 110 to be pyrolyzed, thereby separating the substrate 102 from the light emitting structure 110.

The first conductive type semiconductor layer 112 may be exposed from the substrate (see reference numeral 102 of FIG. 7).

Although not shown, a light extraction pattern (not shown) having a plurality of concave portions and a plurality of convex portions to form a roughness shape may be formed on the surface of the exposed first conductive type semiconductor layer 112.

Figure 9:
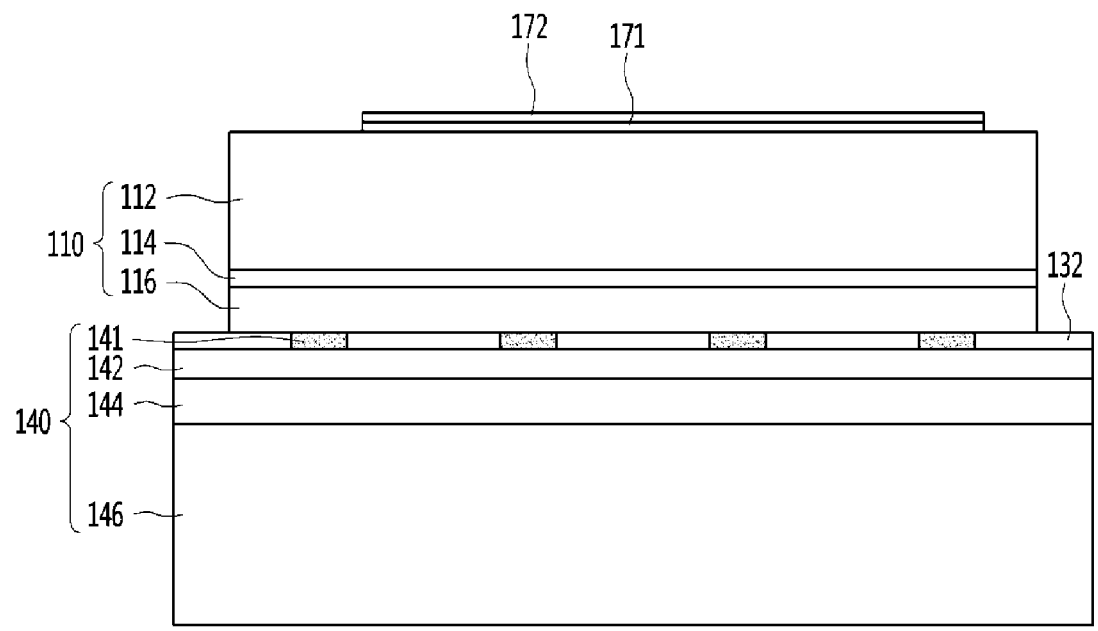

Referring to FIG. 9, the upper ohmic layer 171 and the branch electrode 172 may be formed on the first conductive type semiconductor layer 112. The upper ohmic layer 171 may be deposited on the first conductive type semiconductor layer 112, and the branch electrode 172 may be deposited on the upper ohmic layer 171. That is, the upper ohmic layer 171 may be disposed between the first conductive type semiconductor layer 112 and the branch electrode 172.

The upper ohmic layer 171 may be provided as a single layer or a multi layer. The upper ohmic layer 171 may be made of a material having superior electrical contact properties with respect to the semiconductor. For example, the upper ohmic pattern 171 may include at least one of Ag, Ni, Cr, Ti, Al, Rh, Pd, Ir, Ru, Mg, Zn, Pt, Au, Hf, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZON (IZO Nitride), AGZO (Al—Ga ZnO), IGZO (In—Ga ZnO), ZnO, IrOx, RuOx, NiO, RuOx/ITO, Ni/IrOx/Au, and Ni/IrOx/Au/ITO, but is not limited to the above-described materials.

The branch electrode 172 may be provided as a single layer or a multi layer and be made of at least one of Ti, Cr, Ni, Al, Pt, Au, W, Cu, Mo, and Cu—W, but is not limited thereto.

The branch electrode 172 may adopt the technical features of FIGS. 1 to 3.

Figure 10:
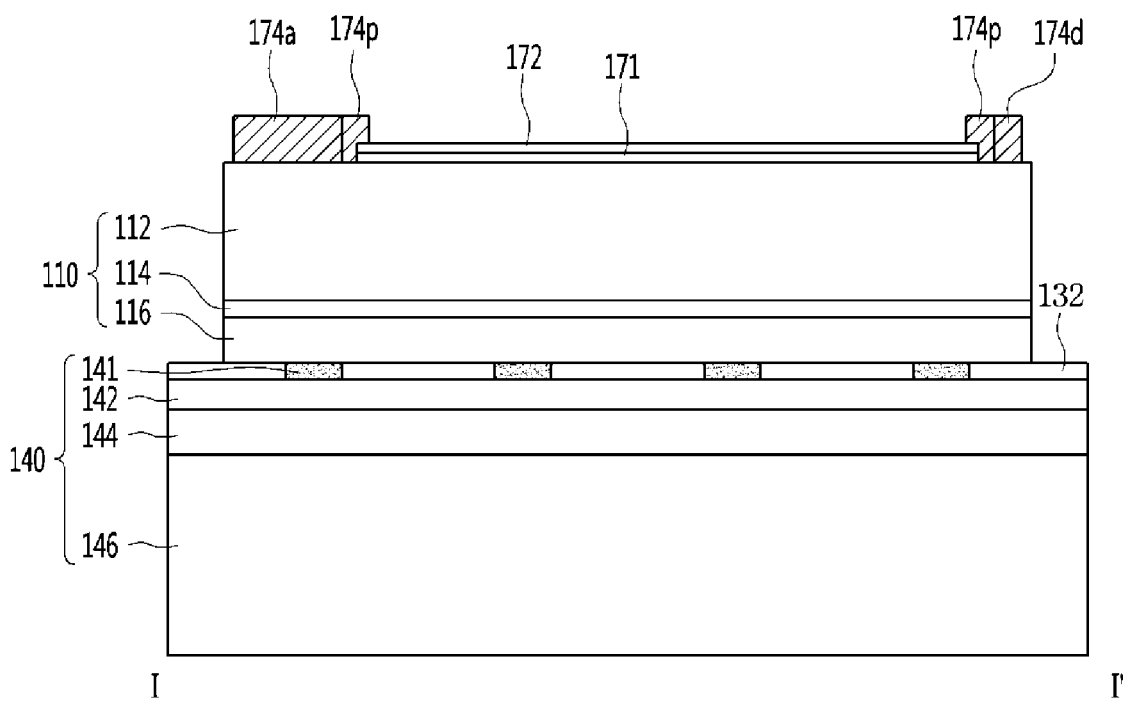

Referring to FIG. 10, the upper electrode pad 174 may cover the exposed first conductive type semiconductor layer 112 and a portion of the branch electrode 172.

The upper electrode pad 174 may include at least one connection electrode 174p which protrudes to a side surface thereof. The upper electrode pad 174 and the connection electrode 174p may adopt the technical features of FIGS. 1 to 3.

The upper electrode pad 174 may be provided as a single layer or a multi layer and be made of at least one of Ti, Cr, Ni, Al, Pt, Au, W, Cu, Mo, and Cu—W, but is not limited thereto.

Although the method for manufacturing the light emitting device of FIGS. 5 to 10 is described based on the first embodiment, the present invention is not limited thereto. For example, the order of the manufacturing processes may be changed.

Since the connection electrode 174a protruding from the side surface of the upper electrode pad 174 is directly connected to the branch electrode 172 in the light emitting device according to an embodiment, the current provided from the upper electrode pad 174 may be constantly divided by the connection electrode 174a and then be provided to the branch electrode 172.

Thus, in the light emitting device 100 according to an embodiment, current spreading may be improved by the connection electrode 174a to improve a luminous intensity. Also, in this embodiment, since the branch electrode 172 has a surface area that is reduced by a length of the connection electrode 174a, the upper ohmic layer 171 disposed below the branch electrode 172 may be reduced in area. That is, since the upper ohmic layer 171 having bandgap energy greater than that of the active layer 114 is reduced in surface area, light absorption by the upper ohmic layer 171 may be reduced to improve a light loss.

Figure 11:
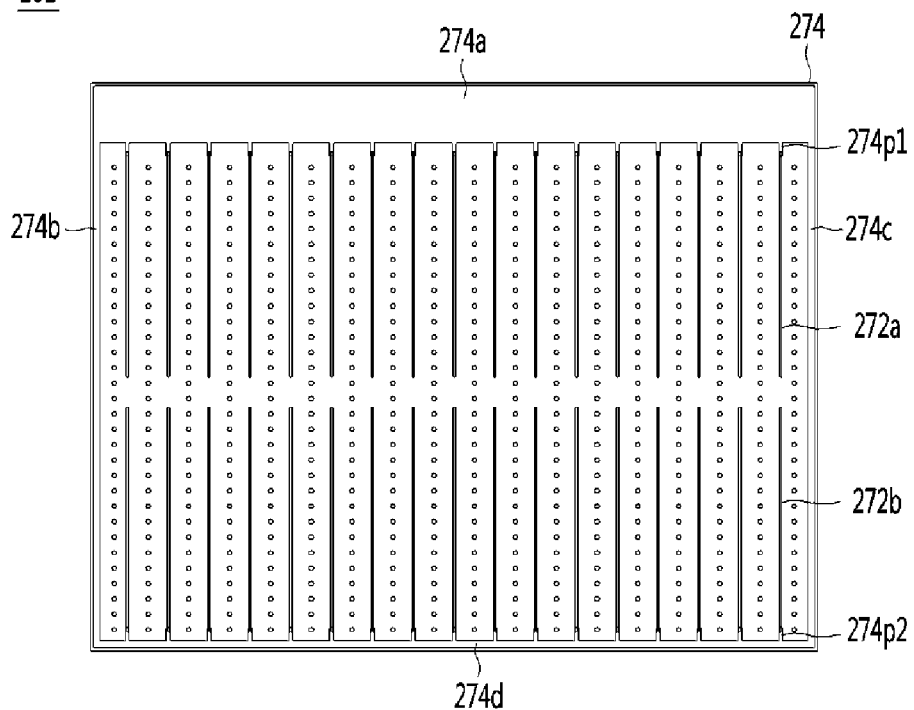
FIG. 11 is a plan view of a light emitting device according to a second embodiment.

FIG. 11 is a plan view of a light emitting device according to a second embodiment.

As illustrated in FIG. 11, a light emitting device 101 according to a second embodiment may include an upper electrode pad 274 disposed on a light emitting structure along an edge of the light emitting structure, and the upper electrode pad 274 may include four first to fourth side parts 274a, 274b, 274c, and 274d and first and second connection electrodes 274p1 and 274p2.

The first connection electrode 274p1 may extend from the first side part 274a, and the second connection electrode 274p2 may extend from the fourth side part 274d. The first connection electrode 274p1 may protrude from the first side part 274a toward the four side part 274d, and the second connection electrode 274p2 may protrude from the fourth side part 274d toward the first side part 274a.

That is, the upper electrode pad 274 may adopt the technical features of the upper electrode pad (see reference numeral 174 of FIGS. 1 to 10) according to the first embodiment.

The light emitting device 101 according to the second embodiment may include first and second branch electrode 272a and 272b.

The first and second branch electrodes 272a and 272b may be spaced apart from each other by a predetermined distance. That is, the first branch electrode 272a may be connected to the first connection electrode 274p1 protruding from the first side part 274a. The second branch electrode 272p2 may be connected to the second connection electrode 274p2 protruding from the fourth side part 274d. An end of the first branch electrode 272a may be spaced apart from an end of the second branch electrode 272b by a predetermined distance.

The light emitting device 101 according to the second embodiment may adopt the technical features of the light emitting device of FIGS. 1 to 10 according to the foregoing embodiment except for the structures of the first and second branch electrodes 272a and 272b.

In the light emitting device 101 according to the second embodiment, the current spreading may be improved by the first and second branch electrodes 272a and 272b, which are respectively connected to the first and second connection electrodes 274p1 and 274p2 protruding from the upper electrode pad 274, and since the upper ohmic layer having bandgap energy greater than that of the active layer decreases in surface area, the light absorption by the upper ohmic layer may be reduced to improve the light loss.

Thus, the light emitting device 101 according to the second embodiment may be improved in current spreading to reduce the light loss, thereby improving the luminous intensity.

Figure 12:
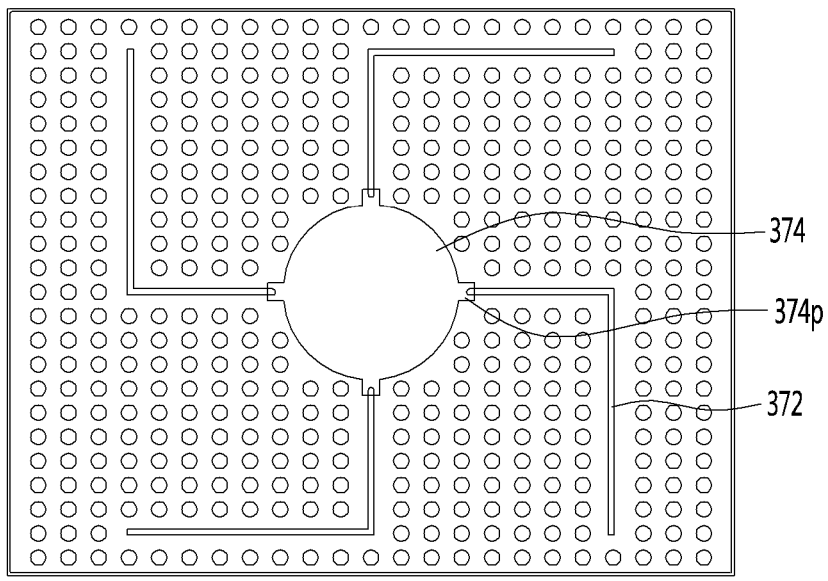
FIG. 12 is a plan view of a light emitting device according to a third embodiment.

FIG. 12 is a plan view of a light emitting device according to a third embodiment.

As illustrated in FIG. 12, a light emitting device 102 according to a third embodiment may adopt the technical features of the light emitting device of FIGS. 1 to 10 according to the foregoing embodiment except for an upper electrode pad 374 and a branch electrode 372.

The upper electrode pad 374 may be disposed at a central area of the light emitting device, but is not limited thereto. The upper electrode pad 374 may be variously changed in shape. The upper electrode pad 374 may include at least one connection electrode 374p on an outer surface thereof. The branch electrode 372 may be connected to the connection electrode 374p.

The light emitting device 102 according to the third embodiment may adopt the technical features of the light emitting device of FIGS. 1 to 10 according to the first embodiment except for the structures of the connection electrode 374p and the branch electrode 372.

In the light emitting device 102 according to the third embodiment, the current spreading may be improved by the branch electrode 372 connected to the connection electrode 374p protruding outward from the upper electrode pad 374, and since the upper ohmic layer having bandgap energy greater than that of the active layer decreases in surface area, the light absorption by the upper ohmic layer may be reduced to improve the light loss.

Thus, the light emitting device 102 according to the third embodiment may be improved in current spreading to reduce the light loss, thereby improving the luminous intensity.

Figure 13:
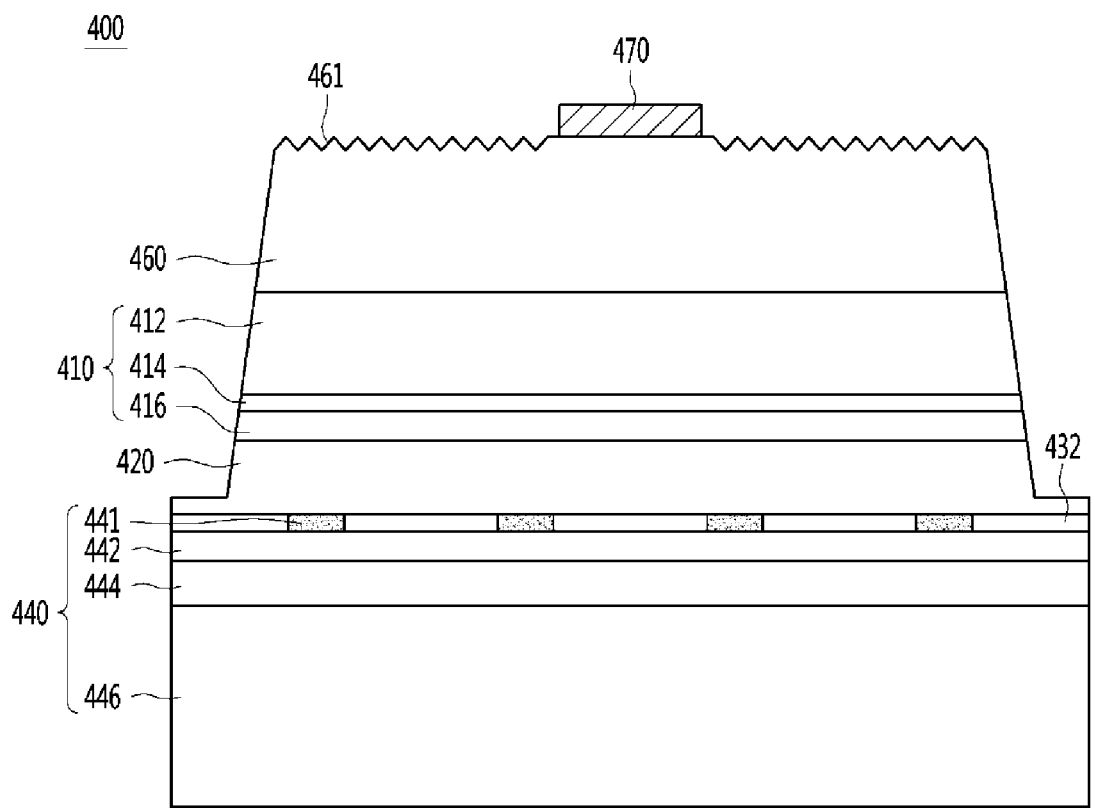
FIG. 13 is a cross-sectional view of a light emitting device according to a fourth embodiment.

FIG. 13 is a cross-sectional view of a light emitting device according to a fourth embodiment.

As illustrated in FIG. 13, a light emitting device 400 according to a fourth embodiment may include a light emitting structure 410, an upper electrode 470, a first reflection layer 432, and a lower electrode 440.

The light emitting structure 410 may be disposed on the lower electrode 440 and also disposed below the upper electrode 470.

The light emitting structure 410 may include a first conductive type semiconductor layer 412, an active layer 414 disposed below the first conductive type semiconductor layer 412, and a second conductive type semiconductor layer 416 on the active layer 414.

The light emitting structure 410 may emit light having a red wavelength.

The first conductive type semiconductor layer 412 may be realized by using a semiconductor compound, for example, a group-group and a compound semiconductor such as a group-group. The first conductive type semiconductor layer 412 may be provided as a single layer or a multi layer. A first conductive type dopant may be doped into the first conductive type semiconductor layer 412. For example, when the first conductive type semiconductor layer 412 is an n-type semiconductor layer, an n-type dopant may be doped. For example, the n-type dopant may include Si, Ge, Sn, Se, and Te, but is not limited thereto. The first conductive type semiconductor layer 412 may include a semiconductor material having a compositional formula of $In_xAl_yGa_{1-x-y}P$ ($0 \leq x \leq 1$, $0 \leq y \leq 1$, $0 \leq x+y \leq 1$), but is not limited thereto. For example, the first conductive type semiconductor layer 412 may be made of at least one of AlGaP, InGaP, AlInGaP, InP, GaN, InN, AlN, InGaN, AlGaN, InAlGaN, AlInN, AlGaAs, InGaAs, AlInGaAs, and GaP.

The active layer 414 may selectively include a single quantum well structure, a multi quantum well (MQW) structure, a quantum wire structure, or a quantum dot structure. The active layer 414 may be made of a compound semiconductor. The active layer 414 may be realized by using, for example, at least one of a group-group and a group-group compound semiconductor.

The active layer 414 may include a quantum well and a quantum barrier. When the active layer 414 has a multi quantum well structure, the quantum well and the quantum barrier may be alternately disposed. Each of the quantum well and the quantum barrier may be made of a semiconductor material having a compositional formula of $In_xAl_yGa_{1-x-y}P$ ($0 \leq x \leq 1$, $0 \leq y \leq 1$, $0 \leq x+y \leq 1$) or have a structure of one or more pairs of GaInP/AlGaInP, GaP/AlGaP, InGaP/AlGaP, InGaN/GaN, InGaN/InGaN, GaN/AlGaN, InAlGaN/GaN, GaAs/AlGaAs, and InGaAs/AlGaAs, but is not limited thereto.

The second conductive type semiconductor layer 416 may be disposed on the active layer 414. The second conductive type semiconductor layer 416 may be realized by using a semiconductor compound, for example, a group-group and a group-group compound semiconductor. The second conductive type semiconductor layer 416 may be provided as a single layer or a multi layer. A second conductive type dopant may be doped into the second conductive type semiconductor layer 416. For example, the second conductive type AlGaN-based semiconductor layer 416 may include a semiconductor material having a compositional formula of InxAlyGa1-x-yP (0=x=1, 0=y=1, 0=x+y=1), but is not limited thereto. When the second conductive type AlGaN-based semiconductor layer 416 is a p-type semiconductor layer, the second conductive type dopant may include Mg, Zn, Ca, Sr, or Ba as a p-type dopant.

The lower electrode 440 may include an ohmic pattern 441, a second reflection layer 442, a bonding layer 444, and a support substrate 446.

The ohmic pattern 441 may be disposed below the light emitting structure 410. The ohmic pattern 441 may be disposed on a lower portion of a first window semiconductor layer 420 disposed below the light emitting structure 400. The ohmic pattern 441 may directly contact the first window semiconductor layer 420. The ohmic pattern 441 may have a top surface directly contacting a bottom surface of the first window semiconductor layer 420. The ohmic pattern 441 may have a circular shape, an oval shape, or a polygonal shape, but is not limited thereto.

The second reflection layer 442 may be provided as a ling layer or a plurality of layers having superior electrical contact properties and high reflectivity. The second reflection layer 442 may be made of a material having superior electrical contact properties and high reflectivity. For example, the second reflection layer 442 may be provided as a single layer or a multi layer, which is made of a metal or an alloy including at least one of Pd, Ir, Ru, Mg, Zn, Pt, Ag, Ni, Al, Rh, Au, and Hf.

Each of the bonding layer 444 and the support substrate 446 may be provided as a single layer or a plurality of layers. Also, the support substrate 446 may be made of a material having superior electrical contact properties. For example, the support substrate 446 may selectively include a carrier wafer (e.g., GaN, Si, Ge, GaAs, ZnO, SiGe, SiC, etc), Cu, Au, Cu Alloy, Ni, Cu—W, and the like.

The first reflection layer 432 may be disposed on the same plane as the ohmic pattern 441. The first reflection layer 132 may include at least one metal layer (not shown) and at least one insulation layer (not shown), but is not limited thereto. Also, the first reflection layer 432 may be a distributed bragg reflector (DBR), but is not limited thereto.

The light emitting device 400 according to this embodiment may include first and second window semiconductor layers 420 and 160, each of which is made of a semiconductor material. The first and second window semiconductor layers 420 and 160 may be made of a semiconductor material having a compositional formula of InxAlyGa1-x-yP (0≤x≤1, 0≤y≤1, 0≤x+y≤1), but is not limited thereto. The first and second window semiconductor layers 420 and 160 may be made of at least one of Zn, Cd, S, Se, Al, Ga, As, Te, In, and P. For example, when the first and second window semiconductor layers 420 and 160 include Zn, the first and second window semiconductor layers 420 and 160 may be made of a material selected from ZnSe, ZnTe, and ZnS, but is not limited thereto. For example, each of the first and second window semiconductor layers 420 and 160 may be made of a material selected from InAlGaP, InAlP, GaP, and InGaP as phosphorous (P)-based semiconductors.

The first and second window semiconductor layers 420 and 160 may have the same composition.

The first and second window semiconductor layers 420 and 160 may have compositions different from each other. The first window semiconductor layer 420 may be made of a material selected from InAlGaP, InAlP, GaP, and InGaP as the phosphorous (P)-based semiconductors, and the second window semiconductor layer 460 may be made of at least one of Zn, Cd, S, Se, Al, Ga, As, Te, In, and P. For example, when the first and second window semiconductor layers 420 and 160 include Zn, the first and second window semiconductor layers 420 and 160 may be made of a material selected from ZnSe, ZnTe, and ZnS, but is not limited thereto.

The second window semiconductor layer 460 may be made of a material selected from InAlGaP, InAlP, GaP, and InGaP as the phosphorous (P)-based semiconductors, and the first window semiconductor layer 420 may be made of at least one of Zn, Cd, S, Se, Al, Ga, As, Te, In, and P. For example, when the first and second window semiconductor layers 420 and 460 include Zn, the first and second window semiconductor layers 420 and 460 may be made of a material selected from ZnSe, ZnTe, and ZnS, i.e., a material having a bandgap greater than that of light emitted from the light emitting structure 410.

The first window semiconductor layer 420 may be disposed below the light emitting structure 410. The first window semiconductor layer 420 may be disposed between the second conductive type semiconductor layer 416 and the lower electrode 440 to perform a current spreading function. The first window semiconductor layer 420 may directly contact the second conductive type semiconductor layer 416 and the lower electrode 440. The first window semiconductor layer 420 may directly contact the ohmic pattern 441 and the first reflection layer 432. The first window semiconductor layer 420 may be disposed between the second conductive type semiconductor layer 416 and the ohmic pattern 441. The first window semiconductor layer 420 may be disposed between the first reflection layer 432 and the second conductive type semiconductor layer 416.

A second conductive type dopant may be doped into the first conductive type semiconductor layer 420. For example, when the second conductive type semiconductor layer 416 includes a p-type dopant, the first window semiconductor layer 420 may include the p-type dopant. The first window semiconductor layer 420 may include a doping concentration greater than that of the second conductive type semiconductor layer 416, but is not limited thereto.

The first window semiconductor layer 420 may have a thickness greater than that of the second conductive type semiconductor layer 416, but is not limited thereto.

The second window semiconductor layer 460 may be disposed on the light emitting structure 410. The second window semiconductor layer 460 may be disposed between the first conductive type semiconductor layer 416 and the upper electrode 470 to perform a current spreading function. The second window semiconductor layer 460 may directly contact the first conductive type semiconductor layer 412 and the upper electrode 470.

A first conductive type dopant may be doped into the second conductive type semiconductor layer 460. The first conductive type dopant may be an n-type dopant. For example, when the first conductive type semiconductor layer 412 includes the n-type dopant, the second window semiconductor layer 460 may include the n-type dopant. The second window semiconductor layer 460 may include a doping concentration greater than that of the first conductive type semiconductor layer 412, but is not limited thereto.

The second window semiconductor layer 460 may have a thickness greater than that of the first conductive type semiconductor layer 412, but is not limited thereto. For example, the second window semiconductor layer 460 may has a thickness of 3 μm or more. The second window semiconductor layer 460 may has a thickness of 3 μm to 100 μm. When the thickness of the second window semiconductor layer 460 is less than 3 μm, the current spreading effect may be deteriorated. When the thickness of the second window semiconductor layer 460 exceeds 100 µm, light extraction efficiency may be deteriorated due to the thick thickness, and an operation voltage VF3 may increase.

The second window semiconductor layer 460 may have a light extraction structure 461 having a roughness on a top surface thereof. The light extraction structure 461 may be regular, but is not limited thereto. The light extraction structure 461 may be irregular and disposed on a portion of the top surface of the second window semiconductor layer 460. The light extraction structure 461 may have a circular shape, an oval shape, or a polygonal shape, but is not limited thereto. For example, the light extraction structure 461 may be disposed on an area except for an area overlapping the upper electrode 470, but is not limited thereto. For example, the light extraction structure 461 may be disposed on the area overlapping the upper electrode 470. The light extraction structure 461 may have a function of improving extraction efficiency of light incident into the second window semiconductor layer 460.

Although the light emitting device 400 according to the fourth embodiment is limited to the structure including the first and second window semiconductor layers 420 and 160, the present invention is not limited thereto. For example, the first window semiconductor layer 420 may be omitted.

In the light emitting device 400 according to the fourth embodiment, the first window semiconductor layer 420 may be disposed between the light emitting structure 410 and the lower electrode 440, and the second window semiconductor layer 460 may be disposed between the light emitting structure 410 and the upper electrode to improve the current spreading effect.

In the light emitting device 400 according to the fourth embodiment, the light extraction structure 461 may be disposed on the second window semiconductor layer 460 to improve the light extraction efficiency.

That is, in the light emitting device 400 according to the fourth embodiment, the current spreading effect and the light extraction efficiency may be improved to improve the luminous intensity.

FIGS. 14 to 18 are views illustrating a method for manufacturing the light emitting device according to the fourth embodiment.

Figure 14:
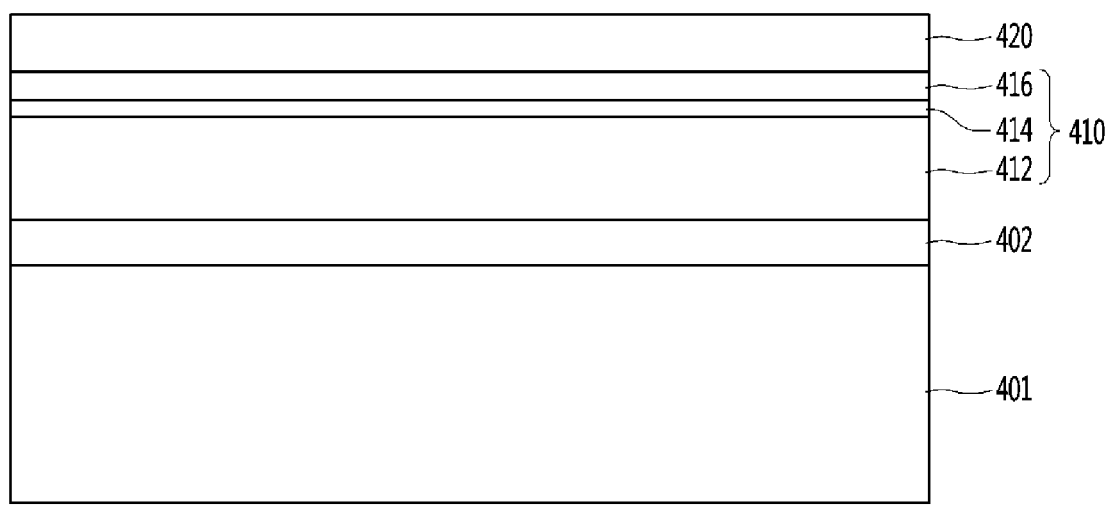
FIGS. 14 to 18 are views illustrating a method for manufacturing the light emitting device according to the fourth embodiment.

Referring to FIG. 14, a first window semiconductor layer 420 and a light emitting structure 410 may be formed on a substrate 401.

The substrate 401 may be made of a material having high thermal conductivity. Also, the substrate 401 may be provided as a single layer or a multi layer. The substrate 401 may be a conductive substrate or an insulation substrate. For example, the substrate 401 may be made of at least one of GaAs, sapphire (Al2O3), SiC, Si, GaN, ZnO, GaP, InP, Ge, and Ga2O3. A cleaning process may be performed on the substrate 401 before the light emitting structure 410 is formed to remove impurities on a surface of the substrate 401.

A buffer layer 402 may be disposed between the substrate 401 and the light emitting structure 410.

The buffer layer 402 may reduce a difference in lattice constant between the substrate 401 and a semiconductor layer. The buffer layer 402 may be made of a material selected from GaN, AlN, AlGaN, InGaN, InN, InAlGaN, AlInN, AlGaAs, GaP, GaAs, GaAsP, and AlGaInP. For example, the buffer layer 402 may be an undoped GaN, but is not limited thereto.

The light emitting structure 410 may include a first conductive type semiconductor layer 412, an active layer 414 formed on the first conductive type semiconductor layer 412, and a second conductive type semiconductor layer 416 formed on the active layer 414.

The first conductive type semiconductor layer 412 may be realized by using a semiconductor compound, for example, a group-group and a compound semiconductor such as a group-group. The first conductive type semiconductor layer 412 may be provided as a single layer or a multi layer. A first conductive type dopant may be doped into the first conductive type semiconductor layer 412. For example, when the first conductive type semiconductor layer 412 is an n-type semiconductor layer, an n-type dopant may be doped. For example, the n-type dopant may include Si, Ge, Sn, Se, and Te, but is not limited thereto. The first conductive type semiconductor layer 412 may include a semiconductor material having a compositional formula of $In_xAl_yGa_{1-x-y}P$ ($0 \leq x \leq 1$, $0 \leq y \leq 1$, $0 \leq x+y \leq 1$), but is not limited thereto. For example, the first conductive type semiconductor layer 412 may be made of at least one of AlGaP, InGaP, AlInGaP, InP, GaN, InN, AlN, InGaN, AlGaN, InAlGaN, AlInN, AlGaAs, InGaAs, AlInGaAs, and GaP.

The first conductive type semiconductor layer 412 may be formed by using a method such as chemical vapor deposition (CVD), molecular beam epitaxy (MBE), sputtering, or hydride vapor phase epitaxy (HVPE), but is not limited thereto.

The active layer 414 may be formed on the first conductive type semiconductor layer 412.

The active layer 414 may selectively include a single quantum well structure, a multi quantum well (MQW) structure, a quantum wire structure, or a quantum dot structure. The active layer 414 may be made of a compound semiconductor. The active layer 414 may be realized by using, for example, at least one of a group-group and a group-group compound semiconductor.

The active layer 414 may include a quantum well and a quantum barrier. For example, the active layer 414 may have a structure of one or more pairs of GaInP/AlGaInP, GaP/AlGaP, InGaP/AlGaP, InGaN/GaN, InGaN/InGaN, GaN/AlGaN, InAlGaN/GaN, GaAs/AlGaAs, and InGaAs/AlGaAs, but is not limited thereto.

The second conductive type semiconductor layer 416 may be formed on the active layer 414. The second conductive type semiconductor layer 416 may be realized by using a semiconductor compound, for example, a group-group and a group-group compound semiconductor. The second conductive type semiconductor layer 416 may be provided as a single layer or a multi layer. A second conductive type dopant may be doped into the second conductive type semiconductor layer 416. When the second conductive type semiconductor layer 416 is a p-type semiconductor layer, the second conductive type dopant may include Mg, Zn, Ca, Sr, or Ba as a p-type dopant. The second conductive type semiconductor layer 416 may include a semiconductor material having a compositional formula of $In_xAl_yGa_{1-x-y}P$ ($0 \leq x \leq 1$, $0 \leq y \leq 1$, $0 \leq x+y \leq 1$). For example, the first conductive type semiconductor layer 412 may be made of at least one of AlGaP, InGaP, AlInGaP, InP, GaN, InN, AlN, InGaN, AlGaN, InAlGaN, AlInN, AlGaAs, InGaAs, AlInGaAs, and GaP.

The second conductive type semiconductor layer 416 may be formed by using a method such as chemical vapor deposition (CVD), molecular beam epitaxy (MBE), sputtering, or hydride vapor phase epitaxy (HVPE), but is not limited thereto.

Although the first conductive type semiconductor layer 412 is provided as the n-type semiconductor layer, and the second conductive type semiconductor layer 416 is provided as the p-type semiconductor layer, the first conductive type semiconductor layer 412 may be provided as the p-type semiconductor layer, and the second conductive type semiconductor layer 416 is provided as the n-type semiconductor layer, but are not limited thereto. A semiconductor having a polarity opposite to the second conductive type semiconductor, for example, an n-type semiconductor layer (not shown) may be formed on the second conductive type semiconductor layer 416. Thus, the light emitting structure 410 may have one structure of an n-p junction structure, a p-n junction structure, an n-p-n junction structure, and a p-n-p junction structure.

The second conductive type semiconductor layer 416 may be formed on a first window semiconductor layer 420. The first window semiconductor layer 420 may directly contact the second conductive type semiconductor layer 416. The first window semiconductor layer 420 may be made of a semiconductor material having a compositional formula of $In_xAl_yGa_{1-x-y}P$ ($0 \leq x \leq 1$, $0 \leq y \leq 1$, $0 \leq x+y \leq 1$), but is not limited thereto. The first window semiconductor layer 420 may improve the current spreading effect. The first window semiconductor layer 420 may be made of at least one of Zn, Cd, S, Se, Al, Ga, As, Te, In, and P. For example, when the first window semiconductor layer 420 includes Zn, the first window semiconductor layer 420 may be made of a material selected from ZnSe, ZnTe, and ZnS, but is not limited thereto. For example, the first window semiconductor layer 420 may be made of a material selected from InAlGaP, InAlP, GaP, and InGaP as phosphorous (P)-based semiconductors.

The first window semiconductor layer 420 may be formed by using a method such as chemical vapor deposition (CVD), molecular beam epitaxy (MBE), sputtering, or hydride vapor phase epitaxy (HVPE), but is not limited thereto.

A second conductive type dopant may be doped into the first conductive type semiconductor layer 420. For example, when the second conductive type semiconductor layer 416 includes a p-type dopant, the first window semiconductor layer may include the p-type dopant. The first window semiconductor layer 420 may include a doping concentration greater than that of the second conductive type semiconductor layer 416, but is not limited thereto.

The first window semiconductor layer 420 may have a thickness greater than that of the second conductive type semiconductor layer 416, but is not limited thereto.

Figure 15:
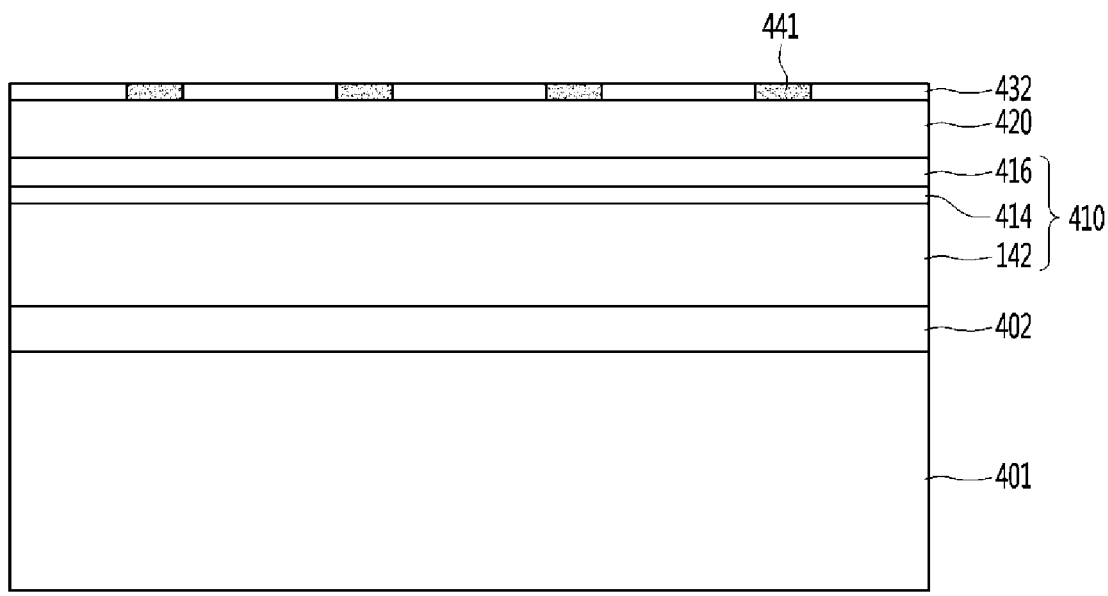

Referring to FIG. 15, a first reflection layer 432 and an ohmic pattern 441 may be formed on the first window semiconductor layer 420.

Also, the ohmic pattern 441 may be made of a material having superior electrical contact properties with respect to the semiconductor. Also, the ohmic pattern 441 may be provided as a single layer or a multi layer. For example, the ohmic pattern 441 may include at least one of Ag, Ni, Cr, Ti, Al, Rh, Pd, Ir, Ru, Mg, Zn, Pt, Au, Hf, Be, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZON (IZO Nitride), AGZO (Al—Ga ZnO), IGZO (In—Ga ZnO), ZnO, IrOx, RuOx, NiO, RuOx/ITO, Ni/IrOx/Au, and Ni/IrOx/Au/ITO, but is not limited to the above-described materials.

The ohmic pattern 441 may directly contact the first window semiconductor layer 420. Although not shown, a separate reflection layer (not shown) may be formed between the ohmic pattern 441 and the first window semiconductor layer 420.

The first reflection layer 432 may include at least one metal layer (not shown) and at least one insulation layer (not shown), but is not limited thereto. Also, the first reflection layer 432 may be a DBR( ) but is not limited thereto.

The ohmic pattern 441 may be disposed on the same plane as the first reflection layer 432. The is, top surfaces and bottom surfaces of the ohmic pattern 441 and the first reflection layer 432 may be disposed on the same plane, but are not limited thereto.

Figure 16:
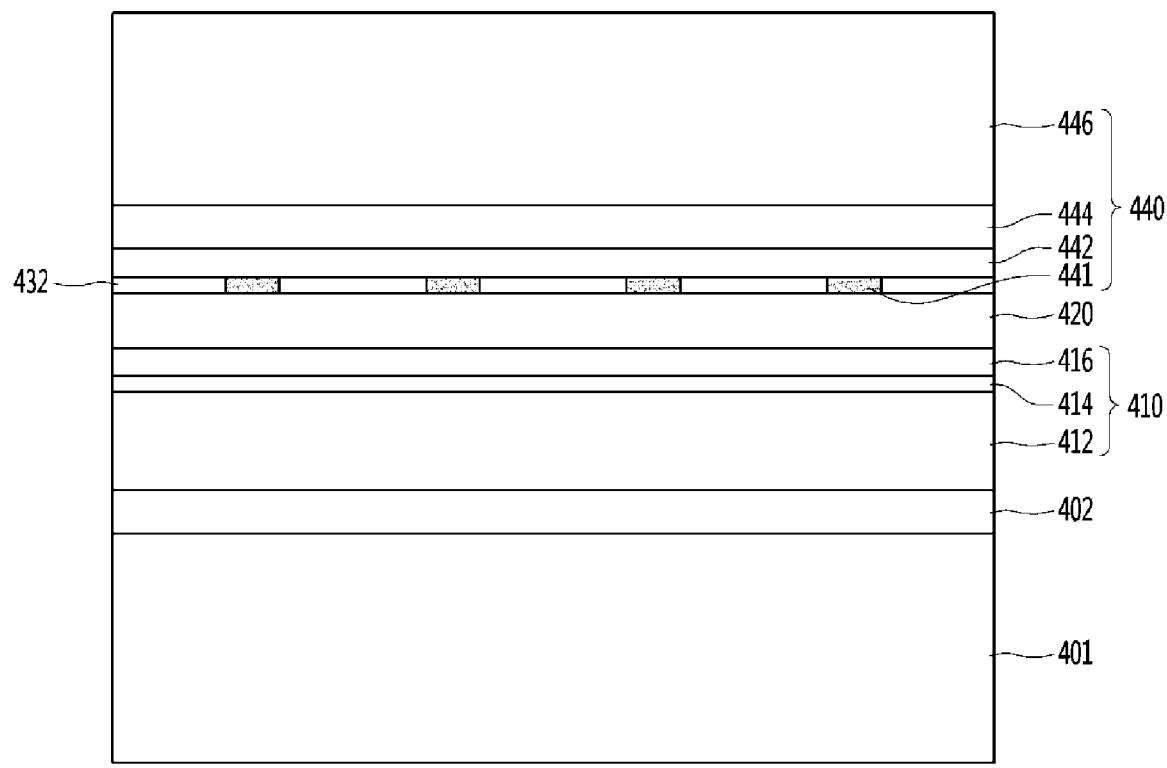

Referring to FIG. 16, a second reflection layer 442, a bonding layer 444, and a support substrate 446 may be formed on the ohmic pattern 441 and the first reflection layer 432.

The second reflection layer 442 may be provided as a single layer or a multi layer. The second reflection layer 442 may be made of a material having superior electrical contact properties and high reflectivity. For example, the second reflection layer 442 may be provided as a single layer or a multi layer, which is made of a metal or an alloy including at least one of Pd, Ir, Ru, Mg, Zn, Pt, Ag, Ni, Al, Rh, Au, and Hf.

Also, the bonding layer 444 may be provided as a single layer or a multi layer. Also, the bonding layer 444 may be made of a material having superior electrical contact properties. For example, the bonding layer 444 may be made of Ni, Ti, Au, or an alloy thereof, but is not limited thereto.

Also, the support substrate 446 may be provided as a single layer or a multi layer. Also, the support substrate 446 may be made of a material having superior electrical contact properties. For example, the support substrate 446 may selectively include a carrier wafer (e.g., GaN, Si, Ge, GaAs, ZnO, SiGe, SiC, etc), Cu, Au, Cu Alloy, Ni, Cu—W, and the like.

Figure 17:
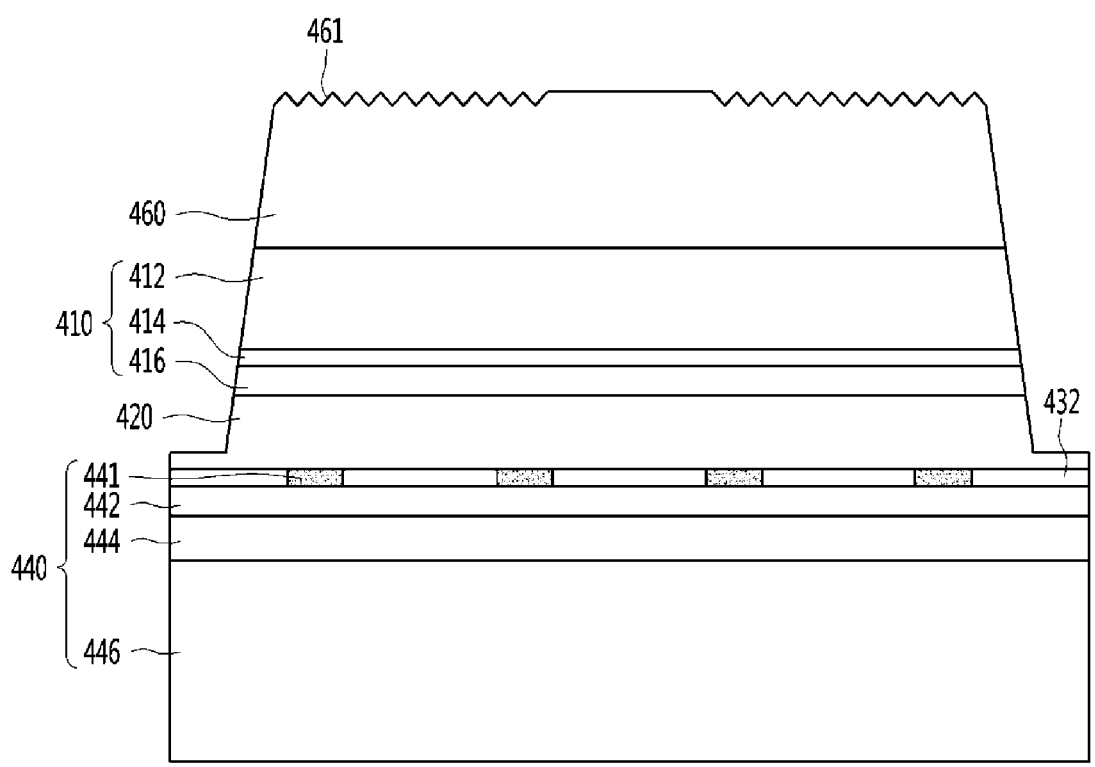

Referring to FIG. 17, the substrate (see reference numeral 101 of FIG. 14) may be removed. The substrate (see reference numeral 101 of FIG. 14) may be removed through laser, chemical etching, or physical etching. For example, the substrate (see reference numeral 101 of FIG. 14) may be removed through a laser lift-off method. According to the laser lift-off method, energy may be applied to an interface between the substrate (see reference numeral 101 of FIG. 14) and the light emitting structure 410 to allow a bonded surface of the light emitting structure 410 to be pyrolyzed, thereby separating the substrate 401 from the light emitting structure 410.

Here, the first conductive type semiconductor layer 412 may be exposed from the outside.

The second window semiconductor layer 460 may be disposed on the first conductive type semiconductor layer 412 to perform a current spreading function. The second window semiconductor layer 460 may directly contact the first conductive type semiconductor layer 412.

The second window semiconductor layer 460 may be formed by using a method such as chemical vapor deposition (CVD), molecular beam epitaxy (MBE), sputtering, or hydride vapor phase epitaxy (HVPE), but is not limited thereto.

A first conductive type dopant may be doped into the second conductive type semiconductor layer 460. For example, when the first conductive type semiconductor layer 412 includes the n-type dopant, the second window semiconductor layer 460 may include the n-type dopant. The second window semiconductor layer 460 may include a doping concentration greater than that of the first conductive type semiconductor layer 412, but is not limited thereto.

The second window semiconductor layer 460 may have a thickness greater than that of the first conductive type semiconductor layer 412, but is not limited thereto. For example, the second window semiconductor layer 460 may has a thickness of 3 μm or more. The second window semiconductor layer 460 may has a thickness of 3 μm to 100 μm. When the thickness of the second window semiconductor layer 460 is less than 3 μm, the current spreading effect may be deteriorated. When the thickness of the second window semiconductor layer 460 exceeds 100 μm, light extraction efficiency may be deteriorated due to the thick thickness, and an operation voltage VF3 may increase.

The second window semiconductor layer 460 may have a light extraction structure 461 having a roughness shape on a top surface thereof. The light extraction structure 461 may be regular, but is not limited thereto. The light extraction structure 461 may be irregular and disposed on a portion of the top surface of the second window semiconductor layer 460. The light extraction structure 461 may have a circular shape, an oval shape, or a polygonal shape, but is not limited thereto. For example, the light extraction structure 461 may be disposed on an area except for an area overlapping the upper electrode 470, but is not limited thereto. For example, the light extraction structure 461 may be disposed on the area overlapping the upper electrode 470. The light extraction structure 461 may have a function of improving external extraction efficiency of light incident into the second window semiconductor layer 460.

Figure 18:
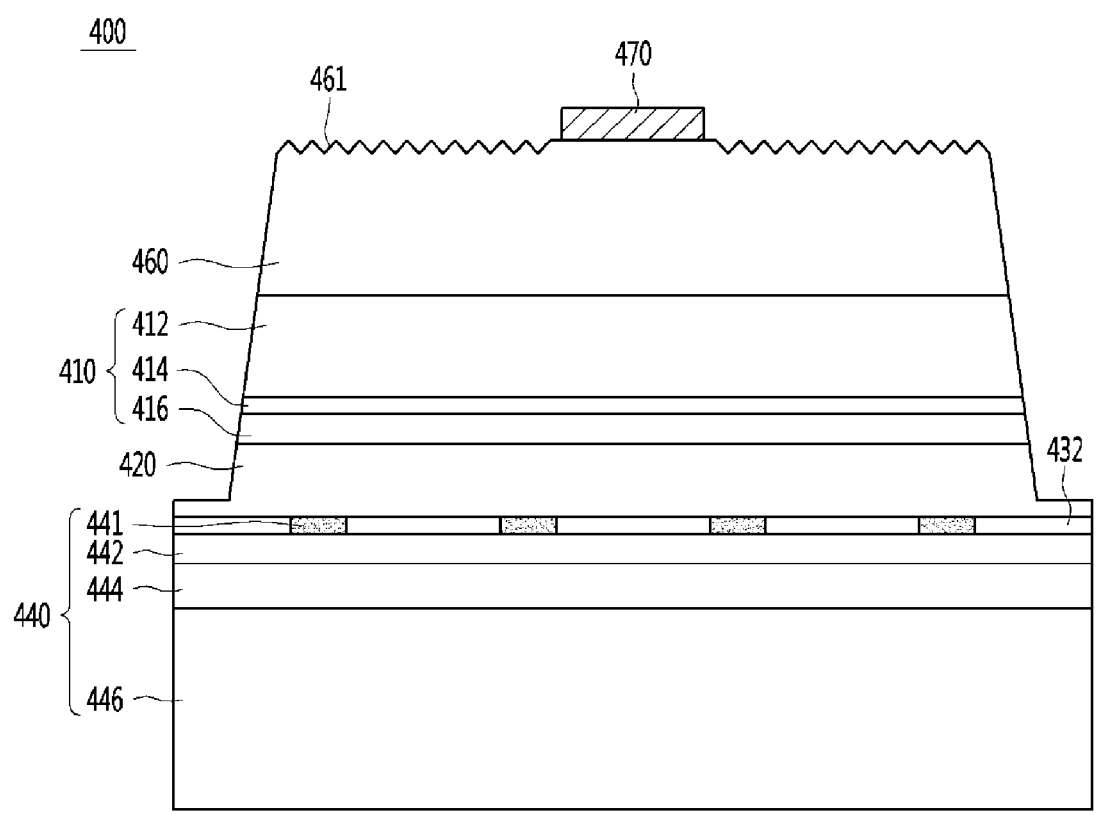

Referring to FIG. 18, the upper electrode 470 may be formed on the second window semiconductor layer 460.

Although not shown, the upper electrode 470 may include an ohmic layer (not shown), a branch electrode (not shown), and an upper electrode pad (not shown), but is not limited thereto.

The upper electrode 470 may be provided as a single layer or a multi layer and be made of at least one of Ti, Cr, Ni, Al, Pt, Au, W, Cu, Mo, and Cu—W, but is not limited thereto.

Although the method for manufacturing the light emitting device of FIGS. 14 to 18 is described based on the fourth embodiment, the present invention is not limited thereto. For example, the order of the manufacturing processes may be changed.

In the light emitting device 400 according to the fourth embodiment, the first window semiconductor layer 420 may be disposed between the light emitting structure 410 and the lower electrode 440, and the second window semiconductor layer 460 may be disposed between the light emitting structure 410 and the upper electrode to improve the current spreading effect.

In the light emitting device 400 according to the fourth embodiment, the light extraction structure 461 may be disposed on the second window semiconductor layer 460 to improve the light extraction efficiency.

That is, in the light emitting device 400 according to the fourth embodiment, the current spreading effect and the light extraction efficiency may be improved to improve the luminous intensity.

Figure 19:
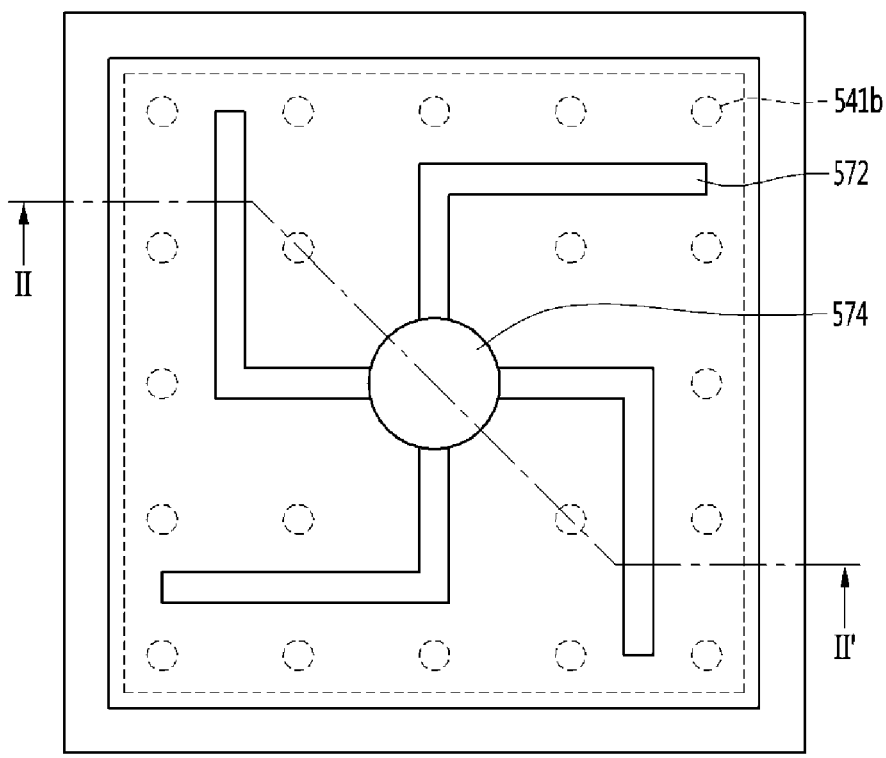
FIG. 19 is a plan view of a light emitting device according to a fifth embodiment.
Figure 20:
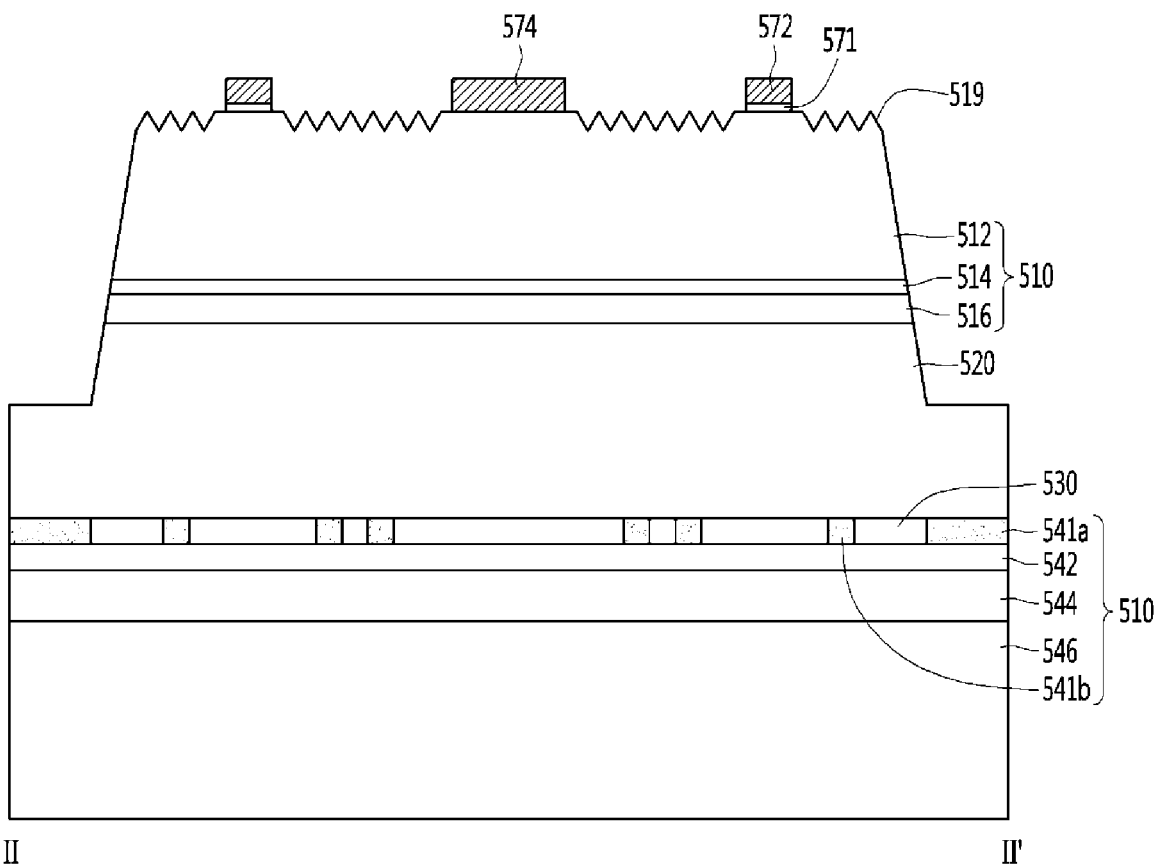
FIG. 20 is a cross-sectional view of the light emitting device, taken along line II-II' of FIG. 19.

FIG. 19 is a plan view of a light emitting device according to a fifth embodiment, and FIG. 20 is a cross-sectional view of the light emitting device, taken along line II-II' of FIG. 19.

As illustrated in FIGS. 19 and 20, a light emitting device 500 according to a fifth embodiment may include a light emitting structure 510, an upper electrode pad 574, a branch electrode 572, a first reflection layer 530, a window layer 520, and a lower electrode 540.

The light emitting structure 510 may be disposed on the lower electrode 540, and the upper electrode pad 574 and the branch electrode 572 may be disposed on the light emitting structure 510.

The light emitting structure 510 may include a first conductive type semiconductor layer 512, an active layer 514 disposed below the first conductive type semiconductor layer 512, and a second conductive type semiconductor layer 516 on the active layer 514.

The first conductive type semiconductor layer 512 may be realized by using a semiconductor compound, for example, a group-group and a compound semiconductor such as a group-group. The first conductive type semiconductor layer 512 may be provided as a single layer or a multi layer. A first conductive type dopant may be doped into the first conductive type semiconductor layer 512. For example, when the first conductive type semiconductor layer 512 is an n-type semiconductor layer, an n-type dopant may be doped. For example, the n-type dopant may include Si, Ge, Sn, Se, and Te, but is not limited thereto. The first conductive type semiconductor layer 512 may include a semiconductor material having a compositional formula of $In_xAl_yGa_{1-x-y}P$ ($0 \leq x \leq 1$, $0 \leq y \leq 1$, $0 \leq x+y \leq 1$), but is not limited thereto. For example, the first conductive type semiconductor layer 512 may be made of at least one of AlGaP, InGaP, AlInGaP, InP, GaN, InN, AlN, InGaN, AlGaN, InAlGaN, AlInN, AlGaAs, InGaAs, AlInGaAs, and GaP.

The active layer 514 may selectively include a single quantum well structure, a multi quantum well (MQW) structure, a quantum wire structure, or a quantum dot structure. The active layer 514 may be made of a compound semiconductor. The active layer 514 may be realized by using, for example, at least one of a group-group and a group-group compound semiconductor.

The active layer 514 may include a quantum well and a quantum barrier. When the active layer 514 has a multi quantum well structure, the quantum well and the quantum barrier may be alternately disposed. Each of the quantum well and the quantum barrier may be made of a semiconductor material having a compositional formula of $In_xAl_yGa_{1-x-y}P$ ($0 \leq x \leq 1$, $0 \leq y \leq 1$, $0 \leq x+y \leq 1$) or have a structure of one or more pairs of GaInP/AlGaInP, GaP/AlGaP, InGaP/AlGaP, InGaN/GaN, InGaN/InGaN, GaN/AlGaN, InAlGaN/GaN, GaAs/AlGaAs, and InGaAs/AlGaAs, but is not limited thereto.

The second conductive type semiconductor layer 516 may be formed on the active layer 514. The second conductive type semiconductor layer 516 may be realized by using a semiconductor compound, for example, a group-group and a group-group compound semiconductor. The second conductive type semiconductor layer 516 may be provided as a single layer or a multi layer. A second conductive type dopant may be doped into the second conductive type semiconductor layer 516. For example, the second conductive type semiconductor layer 516 may include a semiconductor material having a compositional formula of $In_xAl_yGa_{1-x-y}P$ ($0 \leq x \leq 1$, $0 \leq y \leq 1$, $0 \leq x+y \leq 1$), but is not limited thereto. For example, the second conductive type semiconductor layer 516 may be made of at least one of AlGaP, InGaP, AlInGaP, InP, GaN, InN, AlN, InGaN, AlGaN, InAlGaN, AlInN, AlGaAs, InGaAs, AlInGaAs, and GaP. When the second conductive type semiconductor layer 516 is a p-type semiconductor layer, the second conductive type dopant may include Mg, Zn, Ca, Sr, or Ba as a p-type dopant.

The window layer 520 may be disposed below the light emitting structure 510. The window layer 520 may be disposed between the second conductive type semiconductor layer 516 and the lower electrode 540 to perform a current spreading function. The window layer 520 may be disposed between the second conductive type semiconductor layer 516 and first and second lower ohmic patterns 541a and 141b. The window layer 520 may be disposed between the first reflection layer 530 and the second conductive type semiconductor layer 516. The window layer 520 may directly contact the second conductive type semiconductor layer 516 and the lower electrode 540. The window layer 520 may have a bottom surface directly contacting a top surface of the first reflection layer 530 and top surfaces of the first and second lower ohmic patterns 541a and 141b.

The window layer 520 may include a second conductive type dopant. For example, when the second conductive type semiconductor layer 516 includes a p-type dopant, the window layer 520 may include the p-type dopant. The window layer 520 may include a doping concentration greater than that of the second conductive type semiconductor layer 516, but is not limited thereto.

The window layer 520 may have a thickness greater than that of the second conductive type semiconductor layer 516, but is not limited thereto.

An edge of the window layer 520 may be exposed to the outside. The edge of the window layer 520 may include top and outer surfaces of the light emitting structure 510, which are exposed outward, but is not limited thereto.

The lower electrode 540 may include a second reflection layer 542, a bonding layer 544, a support substrate 546, and first and second lower ohmic patterns 541a and 141b.

The first and second lower ohmic patterns 541a and 141b may be disposed below the light emitting structure 510. The first and second lower ohmic patterns 541a and 141b may be disposed on a lower portion of the window layer 520 disposed below the light emitting structure 500. The first and second lower ohmic patterns 541a and 141b may directly contact the window layer 520.

The first lower ohmic pattern 541a may be disposed along the edge of the window layer 520. The first lower ohmic pattern 541a may not vertically overlap the active layer 514. For example, the first lower ohmic pattern 541a may be disposed on an area that vertically overlaps a top surface of the edge of the window layer 520, which is exposed from the light emitting structure 510.

The second lower ohmic pattern 541b may vertically overlap the light emitting structure 510. The second lower ohmic pattern 541b may vertically overlap the active layer 513. The second lower ohmic pattern 541b may have a circular shape, an oval shape, or a polygonal shape when viewed from an upper side, but is not limited thereto.

The second lower ohmic pattern 541b may have a surface area less than 4.0% of an area of the first reflection layer 530 within the area vertically overlapping the active layer 514. The second lower ohmic pattern 541b having the surface area less than 4.0% of the area of the first reflection layer 530 within the area vertically overlapping the active layer 514 may improve a luminous flux of the light emitting device 500 and also improve rising of an operation voltage VF. For example, the second lower ohmic pattern 541b may have a surface area corresponding to 0.6% to 4.0% of the area of the first reflection layer 530 within the area vertically overlapping the active layer 514, but is not limited thereto. Particularly, the second lower ohmic pattern 541b may have a surface area corresponding to 1.4% of the area of the first reflection layer 530 within the area vertically overlapping the active layer 514, but is not limited thereto.

When the second lower ohmic pattern 541b has a surface area less than 0.6% of the area of the first reflection layer 530 within the area vertically overlapping the active layer 514, the ohmic contact area between the second lower ohmic pattern 541b and the window layer 520 may be reduced to increase in operation voltage VF. When the second lower ohmic pattern 541b may have a surface area exceeding 4.0% the surface area of the first reflection layer 530 within the area vertically overlapping the active layer 514, the luminous flux may be deteriorated.

The second lower ohmic pattern 541b may not vertically overlap the upper electrode pad 574 and the branch electrode 572. For example, when the second lower ohmic pattern 541b vertically overlaps the upper electrode pad 574 and the branch electrode 572, since each of distances between the second lower ohmic pattern 541, the upper electrode pad 574, and the branch electrode 572 are minimized on the vertically overlapping area, current crowding may occur on the vertically overlapping area. The current crowding may cause droop of light according to a driving time of the light emitting device due to coupling of electrons and holes in a local area. In the light emitting device 500 according to this embodiment, the upper electrode pad 574, the branch electrode 572, and the second lower ohmic pattern 541b may not overlap each other to improve the current crowding and the droop of the light.

The first lower ohmic pattern 541a may be disposed to vertically overlap the edge of the window layer 520. The first lower ohmic pattern 541a may be disposed to vertically overlap the edge of the window layer 520 to increase an ohmic contact area with the window layer 520. In the light emitting device 500 according to this embodiment, the first lower ohmic pattern 541a may be disposed to vertically overlap the edge of the window layer 520 to increase the contact area with the window layer 520, thereby improving the operation voltage VF and electrical properties such as the current spreading. The first lower ohmic pattern 541a may vertically overlap the edge of the window layer 520 along the outside of the light emitting structure 510 and may not vertically overlap the edge of the light emitting structure 510, but are not limited thereto.

The first and second lower ohmic patterns 541a and 141b may be made of a material having superior electrical contact with the semiconductor. Also, each of the first and second lower ohmic patterns 541a and 141b may be provided as a single layer or a multi layer. Each of the first and second lower ohmic patterns 541a and 141b may include at least one of Ag, Ni, Cr, Ti, Al, Rh, Pd, Ir, Ru, Mg, Zn, Pt, Au, Hf, Be, Ge, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZON (IZO Nitride), AGZO (Al—Ga ZnO), IGZO (In—Ga ZnO), ZnO, IrOx, RuOx, NiO, RuOx/ITO, Ni/IrOx/Au, and Ni/IrOx/Au/ITO, but is not limited to the above-described materials.

The second reflection layer 542 may be provided as a single layer or a plurality of layers. The second reflection layer 542 may be made of a material having superior electrical contact properties and high reflectivity. For example, the second reflection layer 542 may be provided as a single layer or a multi layer, which is made of a metal or an alloy including at least one of Pd, Ir, Ru, Mg, Zn, Pt, Ag, Ni, Al, Rh, Au, Ti, Hf, and ITO.

Each of the bonding layer 544 and the support substrate 546 may be provided as a single layer or a plurality of layers. The bonding layer 544 may be provided as a single layer or a multi layer and be made of at least one of Ni, Ti, Cr, Pt. Au, Sn, In, Pd, Cu, and TiW, but is not limited to the above-described materials. Also, the support substrate 546 may be made of a material having superior electrical contact properties. For example, the support substrate 546 may selectively include a carrier wafer (e.g., GaN, Si, Ge, GaAs, ZnO, SiGe, SiC, etc), Cu, Au, Cu Alloy, Ni, Cu—W, and the like.

The first reflection layer 530 may be disposed on the same plane as the first and second lower ohmic patterns 541a and 141b and include at least one metal layer (not shown) and at least one insulation layer (not shown), but is not limited thereto. The reflection layer 530 may be made of an insulation material having transmittance of 90% or more. Also, the first reflection layer 530 may be an omni directional reflector (ODR), but is not limited thereto. For example, the first reflection layer 530 may be provided as a single layer or a multi layer and made of at least one of SiO2, SiN, Al2O3, ZnO, and ITO, but is not limited thereto.

The first reflection layer 530 may be disposed on the same plane as the first and second lower ohmic patterns 541a and 141b. The first reflection layer 530 may be disposed in parallel to the first and second lower ohmic patterns 541a and 141b. For example, the second lower ohmic patterns 541b may be spaced apart from each other in a dot shape. The first reflection layer 530 may have a diameter or a horizontal width, which is greater than a width of the second lower ohmic pattern 541b disposed between the first reflection layers 530, but is not limited thereto. The first reflection layer 530 may have the same thickness as each of the first and second lower ohmic patterns 541a and 141b, but is not limited thereto. The first reflection layer 530 may directly contact a bottom surface of the window layer 520, but is not limited thereto.

The light emitting device 500 according to an embodiment may include an upper electrode pad 574 and a branch electrode 572. At least one or more of the upper electrode pad 574 and the branch electrode 572 may be disposed, but is not limited thereto. Here, in this embodiment, a conductive layer 571 may be disposed between the first conductive type semiconductor layer 512 and the branch electrode 572. The conductive layer 571 may be disposed below the branch electrode 572. The conductive layer 571 may be provided as a single layer or a plurality of layers, which is made of a material having superior electrical contact with the semiconductor. For example, the conductive layer 571 may include at least one of Ag, Ni, Cr, Ti, Al, Rh, Pd, Ir, Ru, Mg, Zn, Pt, Au, Hf, Be, Ge, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZON (IZO Nitride), AGZO (Al—Ga ZnO), IGZO (In—Ga ZnO), ZnO, IrOx, RuOx, NiO, RuOx/ITO, Ni/IrOx/Au, and Ni/IrOx/Au/ITO, but is not limited to the above-described materials.

The upper electrode pad 574 may be disposed at a central area of the light emitting device 510, but is not limited thereto. The upper electrode pad 574 may be disposed on at least one edge of the light emitting structure 510. The upper electrode pad 574 may be disposed on a top surface of the first conductive type semiconductor layer 512. The upper electrode pad 574 may directly contact the first conductive type semiconductor layer 512. The upper electrode pad 574 may come into schottky contact with the first conductive type semiconductor layer 512, and the branch electrode 572 and the conductive layer 571 may come into ohmic contact with the first conductive type semiconductor layer 512. For example, the schottky contact may occur between the upper electrode pad 574 and the first conductive type semiconductor layer 512 to control current through a potential barrier of a junction part due to reverse bias.

Thus, in this embodiment, since current is induced to relatively well flow to the branch electrode 572 coming into ohmic contact with the first conductive type semiconductor layer 512, a current spreading effect may be generally improved to improve a light output.

The upper electrode pad 574 and the branch electrode 572 may be made of the same material. Each of the upper electrode pad 574 and the branch electrode 572 may be provided as a single layer or a plurality of layers and also be made of at least one of Ti, Cr, Ni, Al, Pt, Au, W, Cu, Mo, Cu—W, Be, Zn, and Ge, but is not limited thereto.

Figure 21:
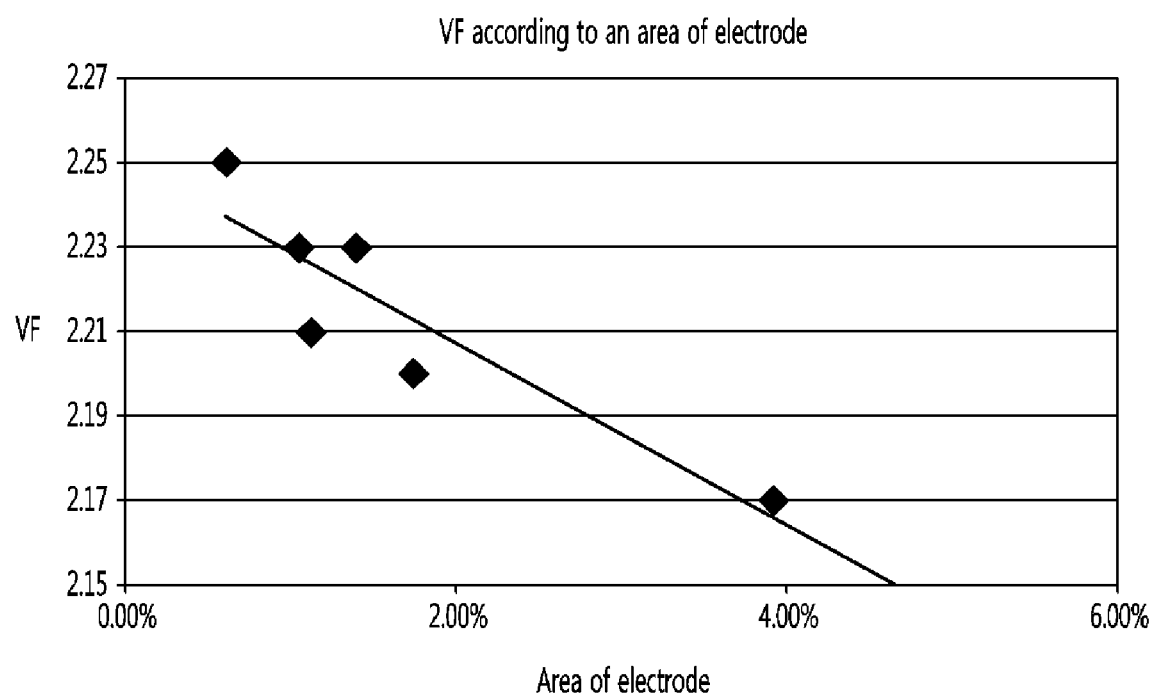
FIG. 21 is a graph illustrating an operation voltage according to a surface area of a second lower ohmic pattern.
Figure 22:
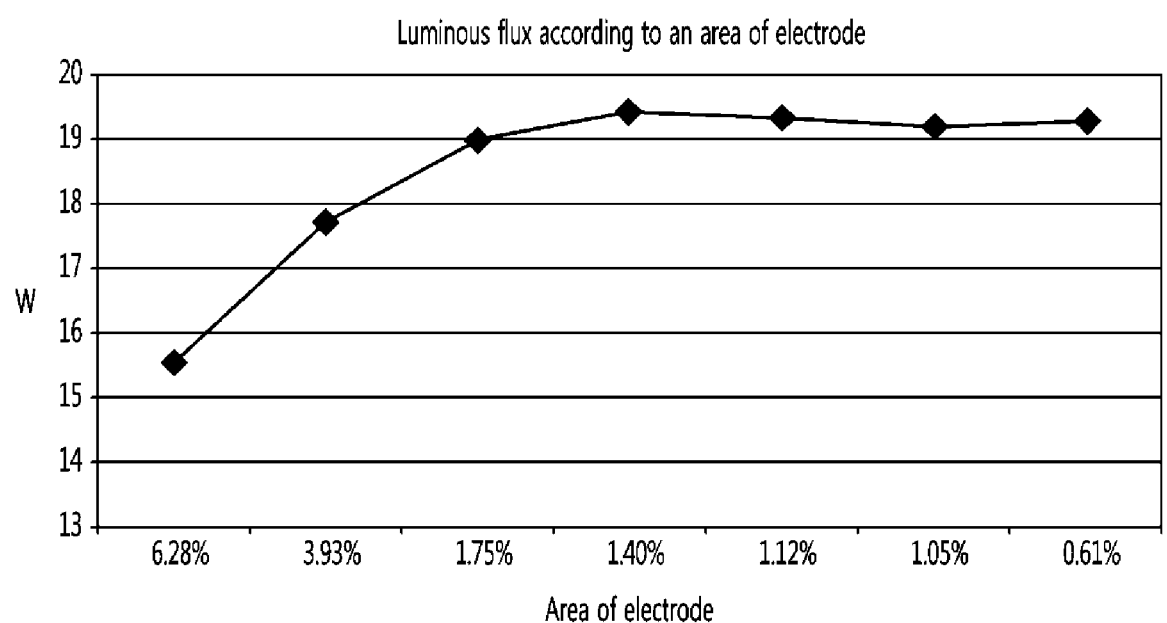
FIG. 22 is a graph illustrating a luminous flux according to the surface area of the second lower ohmic pattern.

FIG. 21 is a graph illustrating an operation voltage according to a surface area of the second lower ohmic pattern, and FIG. 22 is a graph illustrating a luminous flux according to the area of the second lower ohmic pattern.

As illustrated in FIGS. 21 and 22, in the light emitting device according to the fifth embodiment, the second lower ohmic pattern may have a luminous flux of 18W or more on a surface area corresponding to 4% of an area of the first reflection layer within the area vertically overlapping the active layer. The second lower ohmic pattern vertically overlapping the active layer may maintain an operation voltage VF of 2.25 or less while having a luminous flux of 18W or more on a surface area corresponding to 0.6% to 4% of the area of the first reflection layer. Thus, in the embodiments, the luminous flux of the light emitting device may be improved by the second lower ohmic pattern having the surface area corresponding to 4.0% or less of that of the first reflection layer within the area vertically overlapping the active layer, and simultaneously, the rising of the operation voltage VF may be improved. The second lower ohmic pattern according to an embodiment may have a surface area corresponding to 0.6% to 4.0% of the surface area of the first reflection layer within the area vertically overlapping the active layer, but is not limited thereto.

Hereinafter, a method of manufacturing the light emitting device according to an embodiment will be described with reference to FIGS. 23 to 28.

Figure 23:
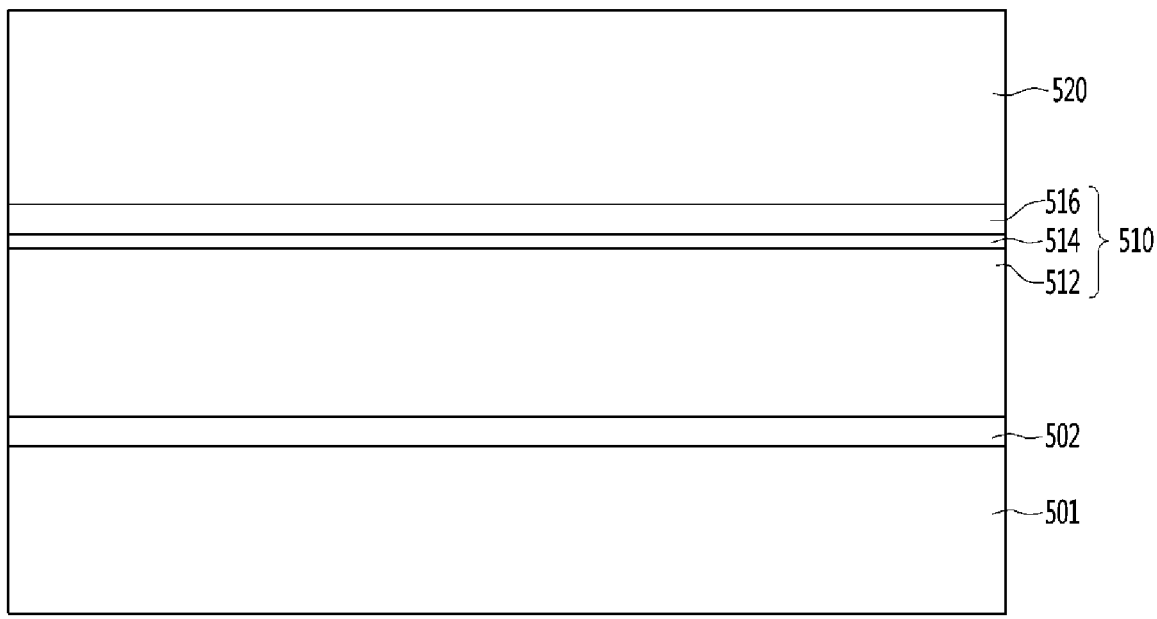
FIGS. 23 to 28 are views illustrating a method for manufacturing the light emitting device according to the fifth embodiment.

Referring to FIG. 23, a substrate 501 is prepared first. The substrate 501 may be made of a material having high thermal conductivity. Also, the substrate 501 may be provided as a single layer or a multi layer. The substrate 501 may be a conductive substrate or an insulation substrate. For example, the substrate 501 may be made of at least one of GaAs, sapphire (Al2O3), SiC, Si, GaN, ZnO, GaP, InP, Ge, and Ga2O3. A cleaning process may be performed on the substrate 501 before the light emitting structure 510 is formed to remove impurities on a surface of the substrate 401.

A buffer layer 501 may be disposed between the substrate 502 and the light emitting structure 510.

The buffer layer 502 may reduce a difference in lattice constant between the substrate 501 and a semiconductor layer. The buffer layer 402 may be made of a material selected from GaN, AlN, AlGaN, InGaN, InN, InAlGaN, AlInN, AlGaAs, GaP, GaAs, GaAsP, and AlGaInP. For example, the buffer layer 502 may be an undoped GaN, but is not limited thereto.

The light emitting structure 510 may include a first conductive type semiconductor layer 512, an active layer 514 formed on the first conductive type semiconductor layer 512, and a second conductive type semiconductor layer 516 formed on the active layer 514.

The first conductive type semiconductor layer 512 may be realized by using a semiconductor compound, for example, a group-group and a compound semiconductor such as a group-group. The first conductive type semiconductor layer 512 may be provided as a single layer or a multi layer. A first conductive type dopant may be doped into the first conductive type semiconductor layer 512. For example, when the first conductive type semiconductor layer 512 is an n-type semiconductor layer, an n-type dopant may be doped. For example, the n-type dopant may include Si, Ge, Sn, Se, and Te, but is not limited thereto. The first conductive type semiconductor layer 512 may include a semiconductor material having a compositional formula of $In_xAl_yGa1-x-yP$ ($0 \leq x \leq 1$, $0 \leq y \leq 1$, $0 \leq x+y \leq 1$), but is not limited thereto. For example, the first conductive type semiconductor layer 512 may be made of at least one of AlGaP, InGaP, AlInGaP, InP, GaN, InN, AlN, InGaN, AlGaN, InAlGaN, AlInN, AlGaAs, InGaAs, AlInGaAs, and GaP. A light extraction pattern 519 having a plurality of concave portions and a plurality of convex portions to form a roughness shape may be formed on the surface of the first conductive type semiconductor layer 512.

The first conductive type semiconductor layer 512 may be formed by using a method such as chemical vapor deposition (CVD), molecular beam epitaxy (MBE), sputtering, or hydride vapor phase epitaxy (HVPE), but is not limited thereto.

The active layer 514 may be formed on the first conductive type semiconductor layer 512.

The active layer 514 may selectively include a single quantum well structure, a multi quantum well (MQW) structure, a quantum wire structure, or a quantum dot structure. The active layer 514 may be made of a compound semiconductor. The active layer 514 may be realized by using, for example, at least one of a group-group and a group-group compound semiconductor.

The active layer 514 may include a quantum well and a quantum barrier. For example, the active layer 514 may have a structure of one or more pairs of GaInP/AlGaInP, GaP/AlGaP, InGaP/AlGaP, InGaN/GaN, InGaN/InGaN, GaN/AlGaN, InAlGaN/GaN, GaAs/AlGaAs, and InGaAs/AlGaAs, but is not limited thereto.

The second conductive type semiconductor layer 516 may be formed on the active layer 514. The second conductive type semiconductor layer 516 may be realized by using a semiconductor compound, for example, a group-group and a group-group compound semiconductor. The second conductive type semiconductor layer 516 may be provided as a single layer or a multi layer. A second conductive type dopant may be doped into the second conductive type semiconductor layer 516. When the second conductive type semiconductor layer 516 is a p-type semiconductor layer, the second conductive type dopant may include Mg, Zn, Ca, Sr, or Ba as a p-type dopant. The second conductive type semiconductor layer 516 may include a semiconductor material having a compositional formula of $In_xAl_yGa1-x-yP$ ($0 \leq x \leq 1$, $0 \leq y \leq 1$, $0 \leq x+y \leq 1$). For example, the first conductive type semiconductor layer 512 may be made of at least one of AlGaP, InGaP, AlInGaP, InP, GaN, InN, AlN, InGaN, AlGaN, InAlGaN, AlInN, AlGaAs, InGaAs, AlInGaAs, and GaP.

The second conductive type semiconductor layer 516 may be formed by using a method such as chemical vapor deposition (CVD), molecular beam epitaxy (MBE), sputtering, or hydride vapor phase epitaxy (HVPE), but is not limited thereto.

Although the first conductive type semiconductor layer 512 is provided as the n-type semiconductor layer, and the second conductive type semiconductor layer 516 is provided as the p-type semiconductor layer, the first conductive type semiconductor layer 512 may be provided as the p-type semiconductor layer, and the second conductive type semiconductor layer 516 is provided as the n-type semiconductor layer, but are not limited thereto. A semiconductor having a polarity opposite to the second conductive type semiconductor, for example, an n-type semiconductor layer (not shown) may be formed on the second conductive type semiconductor layer 516. Thus, the light emitting structure 510 may have one structure of an n-p junction structure, a p-n junction structure, an n-p-n junction structure, and a p-n-p junction structure.

The window layer 520 may be formed on the second conductive type semiconductor layer 516. The window layer 520 may directly contact the second window semiconductor layer 516. The window layer 520 may be made of a semiconductor material having a compositional formula of $In_xAl_yGa1-x-yP$ ($0 \leq x \leq 1$, $0 \leq y \leq 1$, $0 \leq x+y \leq 1$), but is not limited thereto. The window layer 520 may improve the current spreading effect. The window layer 520 may be made of at least one of Zn, Cd, S, Se, Al, Ga, As, Te, In, and P. For example, when the first window semiconductor layer 420 includes Zn, the first window semiconductor layer 420 may be made of a material selected from ZnSe, ZnTe, and ZnS, but is not limited thereto. For example, the window layer 520 may be made of a material selected from InAlGaP, InAlP, GaP, and InGaP as phosphorous (P)-based semiconductors.

The window layer 520 may be formed by using a method such as chemical vapor deposition (CVD), molecular beam epitaxy (MBE), sputtering, or hydride vapor phase epitaxy (HVPE), but is not limited thereto.

The window layer 520 may include a second conductive type dopant. For example, when the second conductive type semiconductor layer 516 includes a p-type dopant, the window layer 520 may include the p-type dopant. The window layer 520 may include a doping concentration greater than that of the second conductive type semiconductor layer 516, but is not limited thereto.

The window layer 520 may have a thickness greater than that of the second conductive type semiconductor layer 516, but is not limited thereto.

Figure 24:
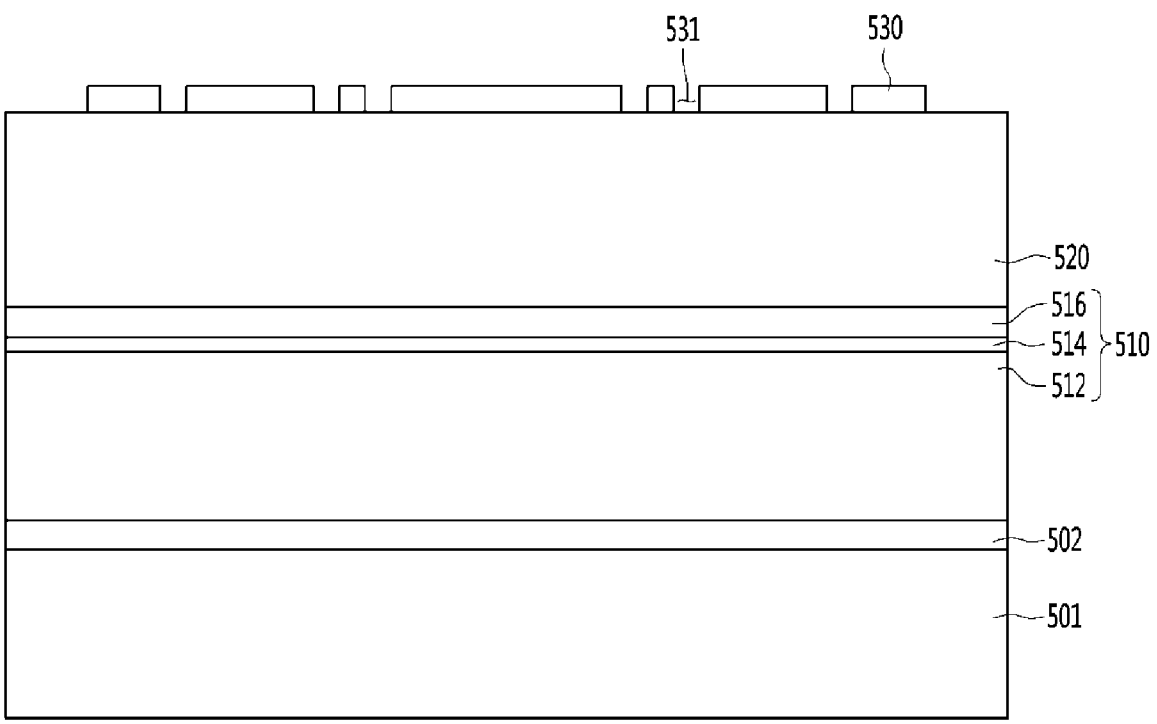
Figure 25:

Referring to FIGS. 24 and 25, a first reflection layer 530 and first and second lower ohmic patterns 541 may be formed on the window layer 520.

For example, the first reflection layer 530 may be deposited on the window layer 520 and include a plurality of holes 531, through which the window layer 520 is exposed, formed through an etching process using photoresist. The first and second lower ohmic patterns 541a and 141b may be deposited on the plurality of holes 531, but is not limited thereto.

The first reflection layer 530 may be disposed on the same plane as the first and second lower ohmic patterns 541a and 141b and include at least one metal layer (not shown) and at least one insulation layer (not shown), but is not limited thereto. The reflection layer 530 may be made of an insulation material having transmittance of 90% or more. Also, the first reflection layer 530 may be an omni directional reflector (ODR), but is not limited thereto. For example, the first reflection layer 530 may be made of at least one of $SiO_2$, SiN, $Al_2O_3$, ZnO, and ITO, but is not limited thereto.

The first reflection layer 530 may be disposed on the same plane as the first and second lower ohmic patterns 541a and 141b. The first reflection layer 530 may be disposed in parallel to the first and second lower ohmic patterns 541a and 141b. For example, the first and second lower ohmic patterns 541b and 141b may be spaced apart from each other in a dot shape. The first reflection layer 530 may have a diameter or a horizontal width, which is greater than a width of the second lower ohmic pattern 541b disposed between the first reflection layers 530, but is not limited thereto. The first reflection layer 530 may have the same thickness as each of the first and second lower ohmic patterns 541a and 141b, but is not limited thereto. The first reflection layer 530 may directly contact a bottom surface of the window layer 520, but is not limited thereto.

The first and second lower ohmic patterns 541a and 141b may be made of a material having superior electrical contact with the semiconductor. Also, each of the first and second lower ohmic patterns 541a and 141b may be provided as a single layer or a multi layer. Each of the first and second lower ohmic patterns 541a and 141b may include at least one of Ag, Ni, Cr, Ti, Al, Rh, Pd, Ir, Ru, Mg, Zn, Pt, Au, Hf, Be, Ge, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZON (IZO Nitride), AGZO (Al—Ga ZnO), IGZO (In—Ga ZnO), ZnO, IrOx, RuOx, NiO, RuOx/ITO, Ni/IrOx/Au, and Ni/IrOx/Au/ITO, but is not limited to the above-described materials.

The first and second lower ohmic patterns 541a and 141b may directly contact the window layer 520 and the second conductive type semiconductor layer 516. Although not shown, a separate reflection layer (not shown) may be formed between the first and second lower ohmic patterns 541a and 141b and the second conductive type semiconductor layer 516.

The first lower ohmic pattern 541a may be disposed along the edge of the window layer 520. The first lower ohmic pattern 541a may not vertically overlap the active layer 514. The first lower ohmic pattern 541a may vertically overlap a top surface of the edge of the window layer 520, which is exposed from the light emitting structure 510.

The second lower ohmic pattern 541b may vertically overlap the light emitting structure 510. The second lower ohmic pattern 541b may vertically overlap the active layer 513. Each of the first and second lower ohmic patterns 541a and 141b may have a circular shape, an oval shape, or a polygonal shape when viewed from an upper side, but is not limited thereto.

The second lower ohmic pattern 541b may have a surface area less than 4.0% of an area of the first reflection layer 530 within the area vertically overlapping the active layer 514. The second lower ohmic pattern 541b having the surface area less than 4.0% of the surface area of the first reflection layer 530 may improve a luminous intensity of the light emitting device 500 and also improve rising of an operation voltage VF. For example, the second lower ohmic pattern 541b may have a surface area corresponding to 0.6% to 4.0% of the surface area of the first reflection layer 530 within the area vertically overlapping the active layer 514, but is not limited thereto. Particularly, the lower ohmic pattern 541 may have a surface area corresponding to 1.4% of the surface area of the first reflection layer 530 within the area vertically overlapping the active layer 514, but is not limited thereto.

When the second lower ohmic pattern 541b has a surface area less than 0.6% of the surface area of the first reflection layer 530 within the area vertically overlapping the active layer 514, the ohmic contact area between the second lower ohmic pattern 541b and the window layer 520 may be reduced to increase in operation voltage VF. When the second lower ohmic pattern 541b may have a surface area exceeding 4.0% the surface area of the first reflection layer 530 within the area vertically overlapping the active layer 514, the luminous flux may be deteriorated.

Figure 26:
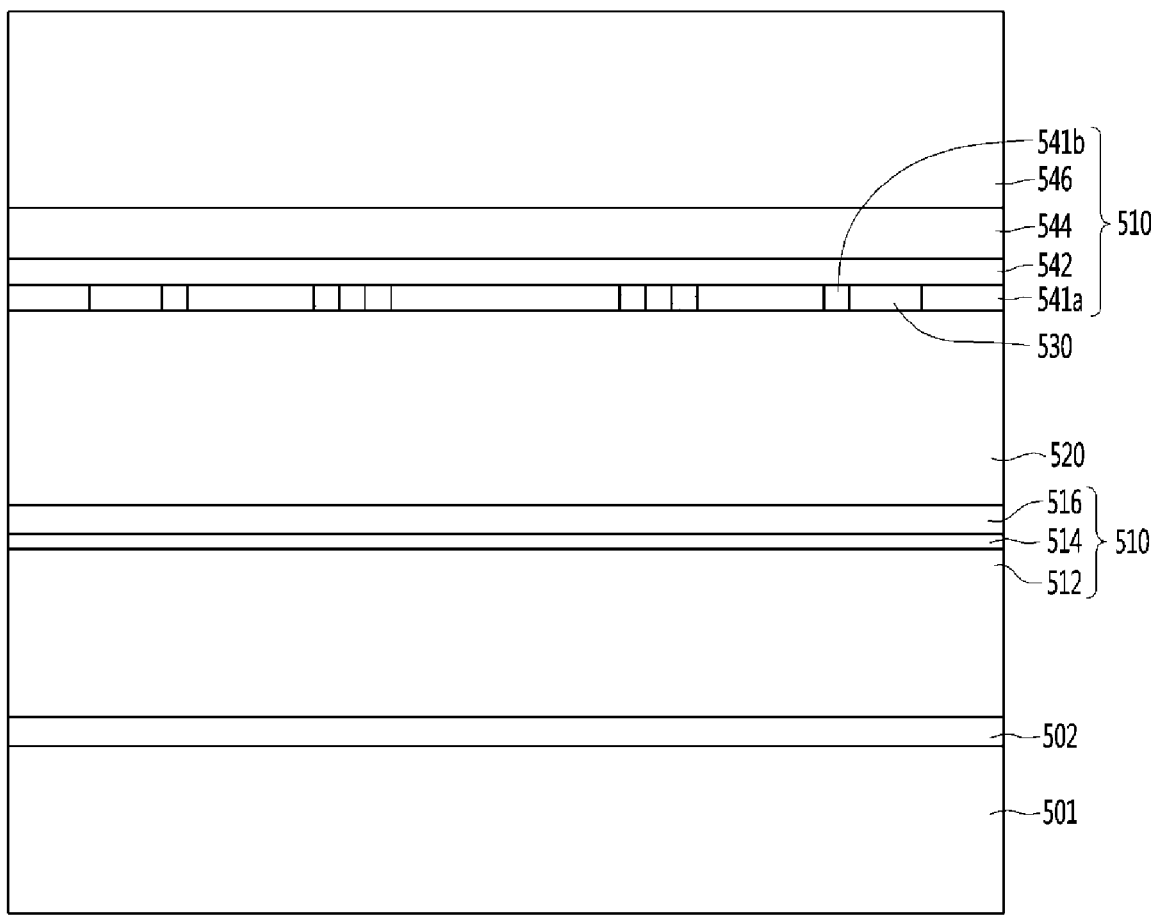

Referring to FIG. 26, a lower electrode 540 may be formed on the light emitting structure 510. Here, the lower electrode 540 may include the constituents of the first and second lower ohmic patterns 541a and 141b, but is not limited thereto.

The lower electrode 540 may include a second reflection layer 542, a bonding layer 544, and a support substrate 546.

The second reflection layer 542 may be provided as a single layer or a plurality of layers. The second reflection layer 542 may be made of a material having superior electrical contact properties and high reflectivity. For example, the second reflection layer 542 may be provided as a single layer or a multi layer, which is made of a metal or an alloy including at least one of Pd, Ir, Ru, Mg, Zn, Pt, Ag, Ni, Al, Rh, Au, Ti, Hf, and ITO.

Each of the bonding layer 544 and the support substrate 546 may be provided as a single layer or a plurality of layers. The bonding layer 544 may be made of at least one of Ni, Ti, Cr, Pt. Au, Sn, In, Pd, Cu, and TiW, but is not limited to the above-described materials. Also, the support substrate 546 may be made of a material having superior electrical contact properties. For example, the support substrate 546 may selectively include a carrier wafer (e.g., GaN, Si, Ge, GaAs, ZnO, SiGe, SiC, etc), Cu, Au, Cu Alloy, Ni, Cu—W, and the like.

Figure 27:
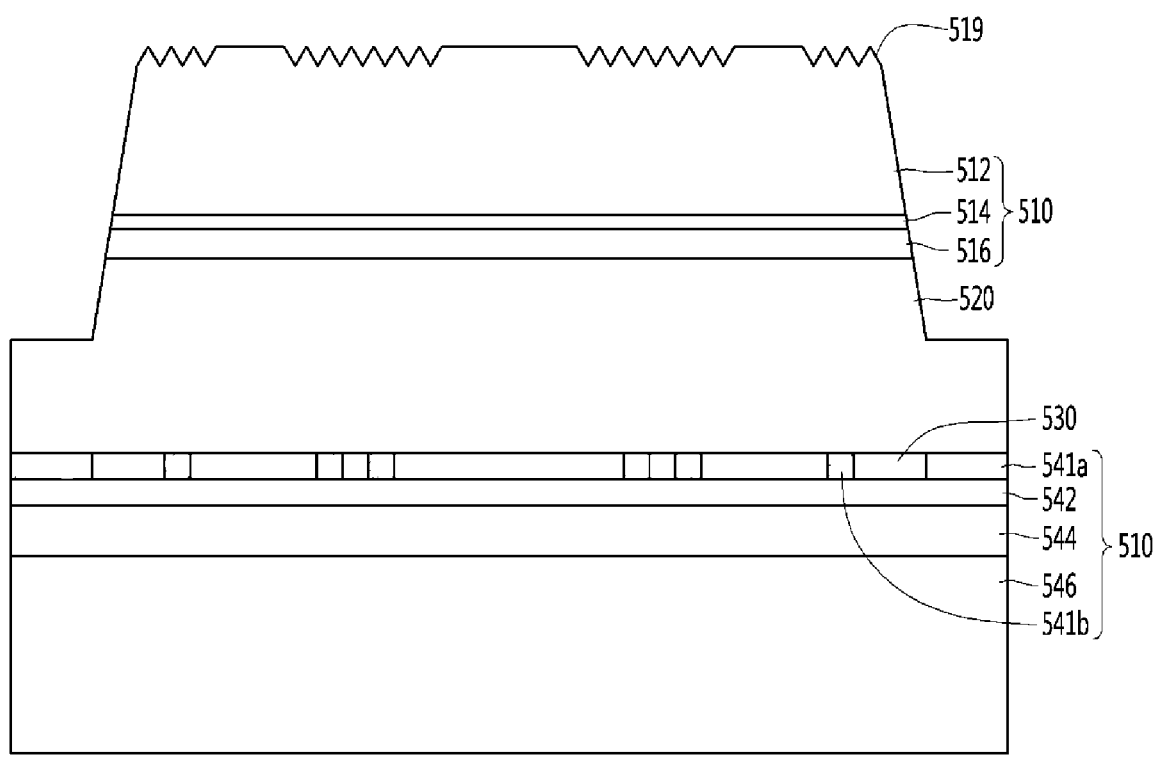

Referring to FIG. 27, the substrate (see reference numeral 101 of FIG. 26) may be removed. The substrate (see reference numeral 101 of FIG. 26) may be removed through laser, chemical etching, or physical etching. For example, the substrate (see reference numeral 101 of FIG. 26) may be removed through a laser lift-off method. According to the laser lift-off method, energy may be applied to an interface between the substrate (see reference numeral 101 of FIG. 26) and the light emitting structure 510 to allow a bonded surface of the light emitting structure 510 to be pyrolyzed, thereby separating the substrate 502 from the light emitting structure 510.

Figure 28:
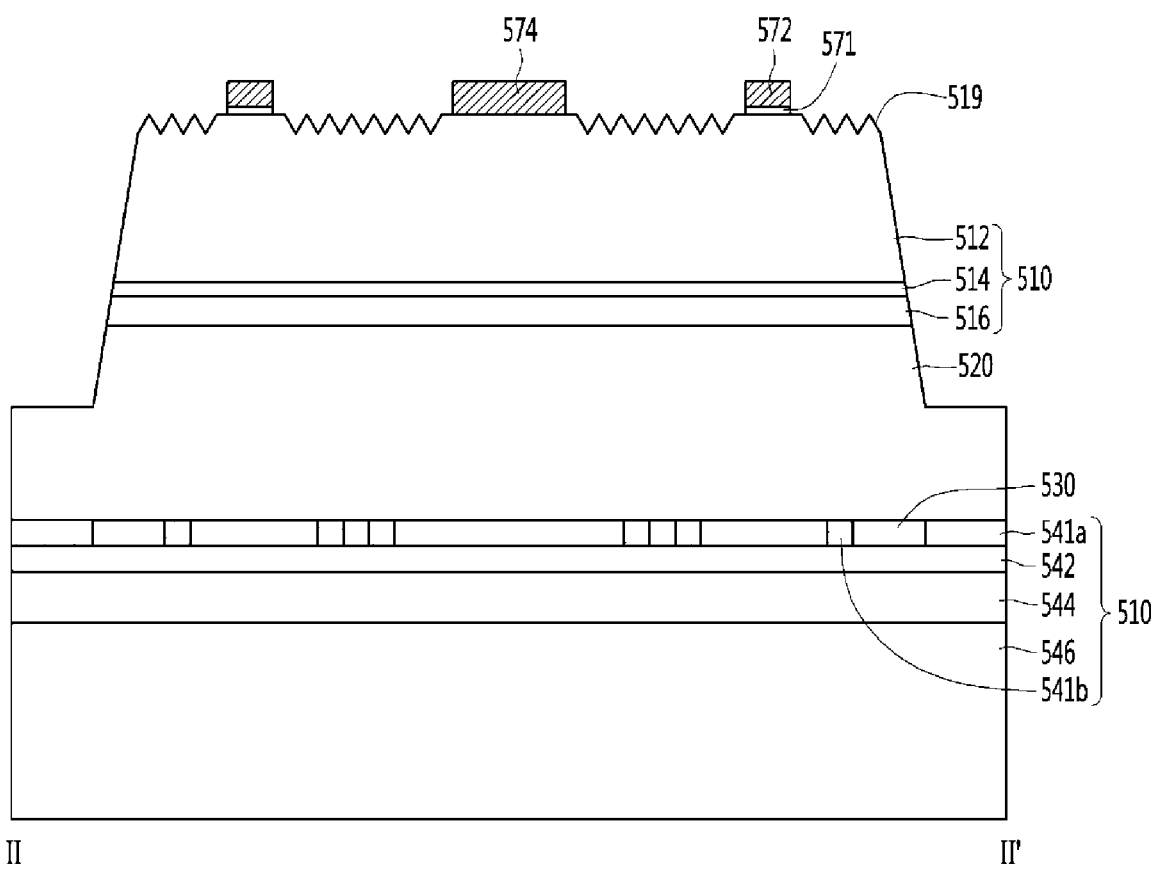

Referring to FIG. 28, the upper electrode pad 574 and the branch electrode 572 may be formed on the first conductive type semiconductor layer 512.

A conductive layer 571 may be disposed below the branch electrode 572. The conductive layer 571 may be deposited on the first conductive type semiconductor layer 512, and the branch electrode 572 may be deposited on the conductive layer 571. That is, the conductive layer 571 may be disposed between the first conductive type semiconductor layer 512 and the branch electrode 572.

Also, the conductive layer 571 may be provided as a single layer or a multi layer. Also, the conductive layer 571 may be made of a material having superior electrical contact properties with respect to the semiconductor. For example, the conductive layer 571 may include at least one of Ag, Ni, Cr, Ti, Al, Rh, Pd, Ir, Ru, Mg, Zn, Pt, Au, Hf, Be, Ge, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZON (IZO Nitride), AGZO (Al—Ga ZnO), IGZO (In—Ga ZnO), ZnO, IrOx, RuOx, NiO, RuOx/ITO, Ni/IrOx/Au, and Ni/IrOx/Au/ITO, but is not limited to the above-described materials.

The upper electrode pad 574 and the branch electrode 572 may be made of the same material. Each of the upper electrode pad 574 and the branch electrode 572 may be provided as a single layer or a plurality of layers and also be made of at least one of Ti, Cr, Ni, Al, Pt, Au, W, Cu, Mo, Cu—W, Be, Zn, and Ge, but is not limited thereto.

Although the method for manufacturing the light emitting device of FIGS. 23 to 28 is described based on the fifth embodiment, the present invention is not limited thereto. For example, the order of the manufacturing processes may be changed. Also, the first and second lower ohmic patterns 541a and 141b may adopt the technical features of FIGS. 19 to 22.

In the light emitting device of FIGS. 23 to 28 according to the fifth embodiment, the second lower ohmic pattern 541b may have a surface area less than 4.0% of a surface area of the first reflection layer 530 within the area vertically overlapping the active layer 514. The second lower ohmic pattern 541b having the surface area less than 4.0% of the surface area of the first reflection layer 530 may improve a luminous flux of the light emitting device 500 and also improve rising of an operation voltage VF. For example, the second lower ohmic pattern 541b may have a surface area corresponding to 0.6% to 4.0% of the surface area of the first reflection layer 530 within the area vertically overlapping the active layer 514, but is not limited thereto. Particularly, the second lower ohmic pattern 541b may have a surface area corresponding to 1.4% of the surface area of the first reflection layer 530 within the area vertically overlapping the active layer 514.

Also, the first and second lower ohmic patterns 541a and 141b may not vertically overlap the upper electrode pad 574 and the branch electrode 572. For example, when the second lower ohmic pattern 541b vertically overlaps the upper electrode pad 574 and the branch electrode 572, since each of distances between the second lower ohmic pattern 541, the upper electrode pad 574, and the branch electrode 572 are minimized on the vertically overlapping area, current crowding may occur on the vertically overlapping area. The current crowding may cause droop of light according to a driving time of the light emitting device due to coupling of electrons and holes in a local area. In the light emitting device 500 according to this embodiment, the upper electrode pad 574, the branch electrode 572, and the lower ohmic pattern 541 may not overlap each other to improve the current crowding and the droop of the light.

Figure 29:
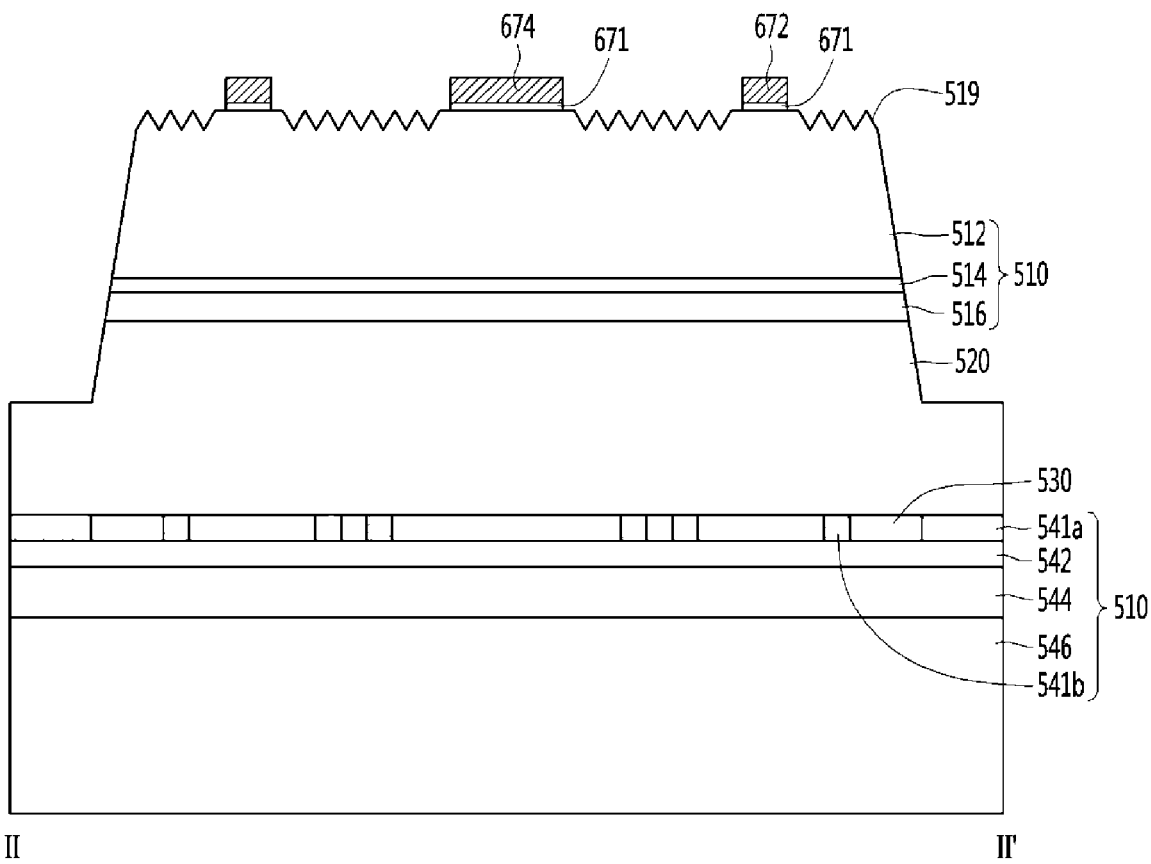
FIG. 29 is a plan view of a light emitting device according to a sixth embodiment.

FIG. 29 is a plan view of a light emitting device according to a sixth embodiment.

As illustrated in FIG. 29, a light emitting device 501 according to a sixth embodiment may include a conductive layer 671, an upper electrode pad 674, and a branch electrode 672 on a light emitting structure 510. A light emitting device 501 according to another embodiment may include a first reflection layer 530 and a lower electrode 540 below the light emitting structure 510. The light emitting structure 510, the first reflection layer 530, and the lower electrode 540 may adopt the technical features of the light emitting device 500 of FIGS. 19 to 22 according to the fifth embodiment.

The conductive layer 671 may be disposed below the upper electrode pad 674 and the branch electrode 672. The conductive layer 671 may directly contact a first conductive type semiconductor layer 512. The conductive layer 671 may be provided as a single layer or a plurality of layers, which is made of a material having superior electrical contact with the semiconductor. For example, the conductive layer 671 may include at least one of Ag, Ni, Cr, Ti, Al, Rh, Pd, Ir, Ru, Mg, Zn, Pt, Au, Hf, Be, Ge, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZON (IZO Nitride), AGZO (Al—Ga ZnO), IGZO (In—Ga ZnO), ZnO, IrOx, RuOx, NiO, RuOx/ITO, Ni/IrOx/Au, and Ni/IrOx/Au/ITO, but is not limited to the above-described materials.

The upper electrode pad 674 may be disposed at a central area of the light emitting device 510, but is not limited thereto. The upper electrode pad 674 may be disposed on at least one edge of the light emitting structure 510. The upper electrode pad 674 may be disposed on the conductive layer 671. The upper electrode pad 674 may directly contact the conductive layer 671.

Each of the upper electrode pad 674 and the branch electrode 672 may be provided as a single layer or a plurality of layers and also be made of at least one of Ti, Cr, Ni, Al, Pt, Au, W, Cu, Mo, Cu—W, Be, Zn, and Ge, but is not limited thereto. The upper electrode pad 674 and the branch electrode 672 may be made of materials different from each other. The upper electrode pad 674 may be made of a material having resistance greater than that of the branch electrode 672. For example, the upper electrode pad 674 may include Cr, and the branch electrode 672 may not include Cr. The upper electrode pad 674 may be made of a material having resistance greater than that of the branch electrode 672. Thus, resistance between the upper electrode pad 674 and the conductive layer 671 may be greater than that between the branch electrode 672 and the conductive layer 671. That is, since the branch electrode 672 has resistance less than that of the upper electrode pad 674, current may flow to the conductive layer 671 through the branch electrode 672 rather than the upper electrode pad 674. Thus, in the light emitting device according to the sixth embodiment, the current is induced to flow from the upper electrode pad 674 having the resistance greater than that of the branch electrode 672 to the branch electrode 672, the current spreading effect may be generally improved to improve the light output.

Figure 30:
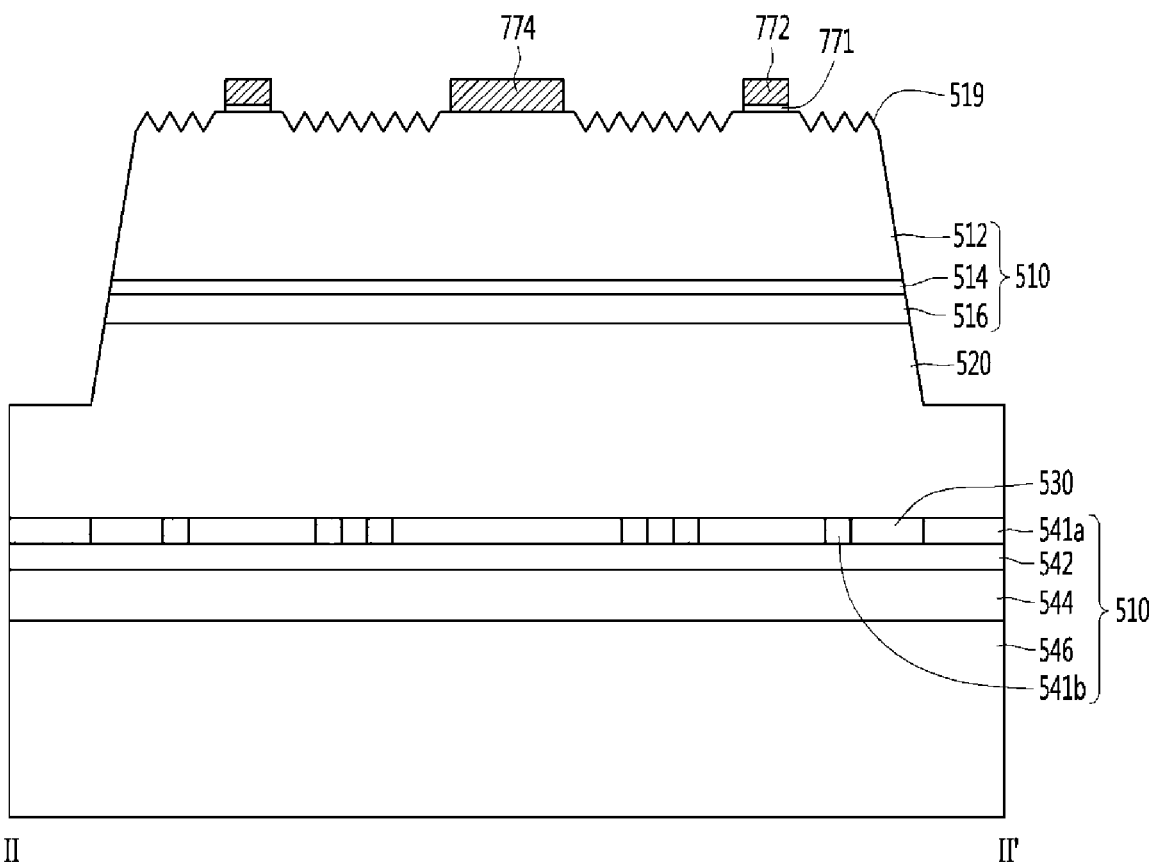
FIG. 30 is a plan view of a light emitting device according to a seventh embodiment.

FIG. 30 is a plan view of a light emitting device according to a seventh embodiment.

As illustrated in FIG. 30, a light emitting device 502 according to a seventh embodiment may include a conductive layer 771, an upper electrode pad 774, and a branch electrode 772 on a light emitting structure 510. A light emitting device 502 according to another embodiment may include a first reflection layer 530 and a lower electrode 540 below the light emitting structure 510. The light emitting structure 510, the first reflection layer 530, and the lower electrode 540 may adopt the technical features of the light emitting device 500 of FIGS. 19 to 22 according to the fifth embodiment.

The conductive layer 771 may be disposed below the branch electrode 772. The conductive layer 771 may directly contact a first conductive type semiconductor layer 512. The conductive layer 771 may be provided as a single layer or a plurality of layers, which is made of a material having superior electrical contact with the semiconductor. For example, the conductive layer 771 may include at least one of Ag, Ni, Cr, Ti, Al, Rh, Pd, Ir, Ru, Mg, Zn, Pt, Au, Hf, Be, Ge, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZON (IZO Nitride), AGZO (Al—Ga ZnO), IGZO (In—Ga ZnO), ZnO, IrOx, RuOx, NiO, RuOx/ITO, Ni/IrOx/Au, and Ni/IrOx/Au/ITO, but is not limited to the above-described materials.

The upper electrode pad 774 may be disposed at a central area of the light emitting device 510, but is not limited thereto. The upper electrode pad 774 may be disposed on at least one edge of the light emitting structure 510. The upper electrode pad 774 may be disposed on the light emitting structure 510. The upper electrode pad 774 may directly contact the first conductive type semiconductor layer 512. The upper electrode pad 774 may come into schottky contact with the first conductive type semiconductor layer 512. For example, current may be controlled between the upper electrode pad 774 and the first conductive type semiconductor layer 512 through a potential barrier of a junction part due to reverse bias.

The upper electrode pad 774 may be made of a material having resistance greater than that of the branch electrode 772. Thus, resistance between the upper electrode pad 774 and the conductive layer 771 may be greater than that between the branch electrode 772 and the conductive layer 771. That is, since the branch electrode 772 has resistance less than that of the upper electrode pad 774, current may flow to the conductive layer 774 through the branch electrode 772 rather than the upper electrode pad 571. Furthermore, the conductive layer 771 may be disposed between the branch electrode 772 and the first conductive type semiconductor layer 512 to induce the current so that the current flows through the branch electrode 772. Thus, in another embodiment, since the current is induced to flow to the branch electrode 772 coming into ohmic contact with the first conductive type semiconductor layer 512, the current spreading effect may be generally improved to improve the light output.

Each of the upper electrode pad 774 and the branch electrode 772 may be provided as a single layer or a plurality of layers and also be made of at least one of Ti, Cr, Ni, Al, Pt, Au, W, Cu, Mo, Cu—W, Be, Zn, and Ge, but is not limited thereto. The upper electrode pad 774 and the branch electrode 772 may be made of materials different from each other. The upper electrode pad 774 may be made of a material having resistance greater than that of the branch electrode 772. For example, the upper electrode pad 774 may include Cr, and the branch electrode 772 may not include Cr.

In the light emitting device 502 according to the seventh embodiment, the upper electrode pad 774 may come into schottky contact with the first conductive type semiconductor layer 512, and the conductive layer 771 may be disposed below the branch electrode 772 to maintain the state in which the current flows through the branch electrode 772. Furthermore, the current may be induced to flow through the branch electrode 772 by the upper electrode pad 774 having the resistance greater than that of the branch electrode 772 to more improve the current spreading effect when compared to the light emitting device according to the sixth embodiment.

Figure 31:
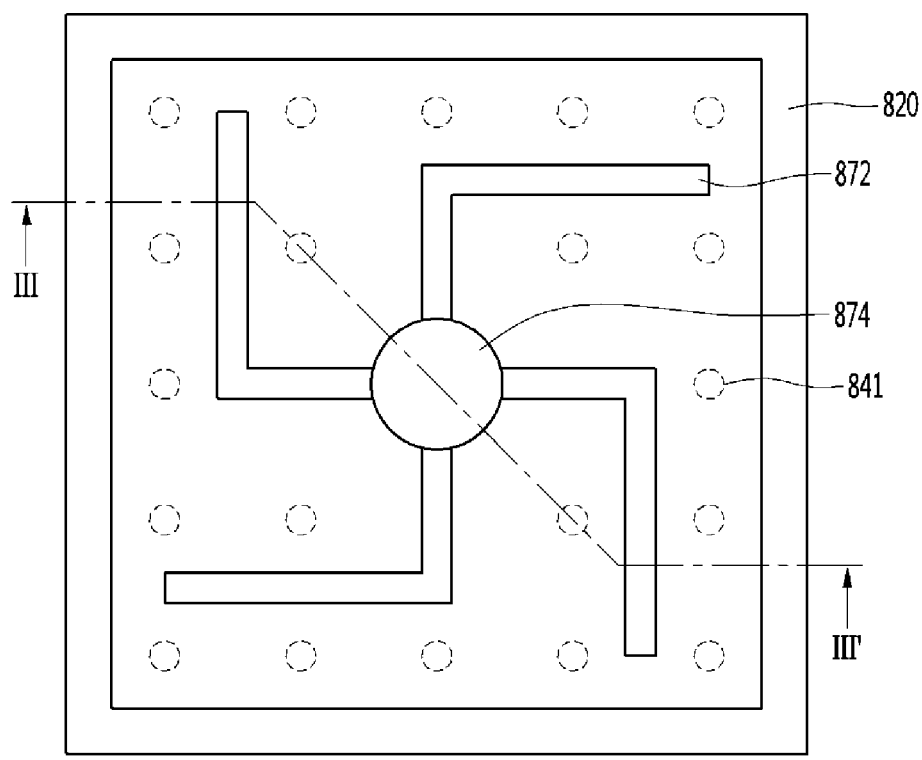
FIG. 31 is a plan view of a light emitting device according to an eighth embodiment.
Figure 32:
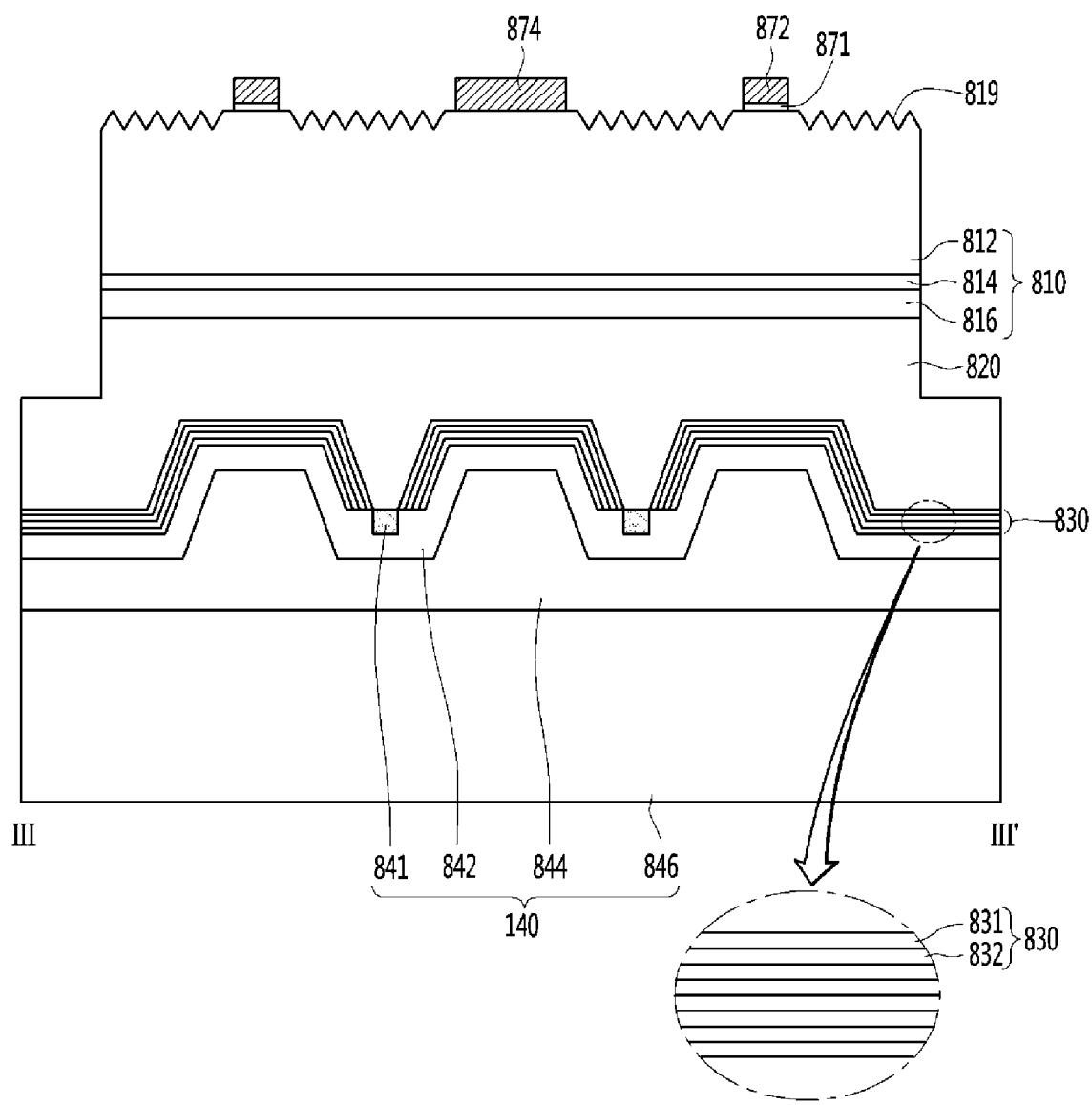
FIG. 32 is a cross-sectional view of the light emitting device, taken along line III-III' of FIG. 31.

FIG. 31 is a plan view of a light emitting device according to an eighth embodiment, and FIG. 32 is a cross-sectional view of the light emitting device, taken along line III-III' of FIG. 31.

As illustrated in FIGS. 31 and 32, a light emitting device according to this embodiment may include a light emitting structure 810, an upper electrode pad 874, a branch electrode 872, a window layer 820, a distributed bragg reflector 130, a first reflection layer 830, and a lower electrode 840.

The light emitting structure 810 may be disposed on the lower electrode 840, and the upper electrode pad 874 and the branch electrode 872 may be disposed on the light emitting structure 810.

The light emitting structure 810 may include a first conductive type semiconductor layer 812, an active layer 814 disposed below the first conductive type semiconductor layer 812, and a second conductive type semiconductor layer 816 on the active layer 814.

The first conductive type semiconductor layer 812 may be realized by using a semiconductor compound, for example, a group-group and a compound semiconductor such as a group-group. The first conductive type semiconductor layer 812 may be provided as a single layer or a multi layer. A first conductive type dopant may be doped into the first conductive type semiconductor layer 812. For example, when the first conductive type semiconductor layer 812 is an n-type semiconductor layer, an n-type dopant may be doped. For example, the n-type dopant may include Si, Ge, Sn, Se, and Te, but is not limited thereto. The first conductive type semiconductor layer 812 may include a semiconductor material having a compositional formula of $In_xAl_yGa_{1-x-y}P$ ($0 \leq x \leq 1$, $0 \leq y \leq 1$, $0 \leq x+y \leq 1$), but is not limited thereto. For example, the first conductive type semiconductor layer 812 may be made of at least one of AlGaP, InGaP, AlInGaP, InP, GaN, InN, AlN, InGaN, AlGaN, InAlGaN, AlInN, AlGaAs, InGaAs, AlInGaAs, and GaP.

The active layer 814 may selectively include a single quantum well structure, a multi quantum well (MQW) structure, a quantum wire structure, or a quantum dot structure. The active layer 814 may be made of a compound semiconductor. The active layer 814 may be realized by using, for example, at least one of a group-group and a group-group compound semiconductor.

The active layer 814 may include a quantum well and a quantum barrier. When the active layer 814 has a multi quantum well structure, the quantum well and the quantum barrier may be alternately disposed. Each of the quantum well and the quantum barrier may have a structure of one or more pairs of GaInP/AlGaInP, GaP/AlGaP, InGaP/AlGaP, InGaN/GaN, InGaN/InGaN, GaN/AlGaN, InAlGaN/GaN, GaAs/AlGaAs, and InGaAs/AlGaAs, but is not limited thereto.

The second conductive type semiconductor layer 816 may be formed on the active layer 814. The second conductive type semiconductor layer 816 may be realized by using a semiconductor compound, for example, a group-group and a group-group compound semiconductor. The second conductive type semiconductor layer 816 may be provided as a single layer or a multi layer. A second conductive type dopant may be doped into the second conductive type semiconductor layer 816. For example, the second conductive type semiconductor layer 816 may include a semiconductor material having a compositional formula of $In_xAl_yGa_{1-x-y}P$ ($0 \leq x \leq 1$, $0 \leq y \leq 1$, $0 \leq x+y \leq 1$), but is not limited thereto. For example, the second conductive type semiconductor layer 816 may be made of at least one of AlGaP, InGaP, AlInGaP, InP, GaN, InN, AlN, InGaN, AlGaN, InAlGaN, AlInN, AlGaAs, InGaAs, AlInGaAs, and GaP. When the second conductive type semiconductor layer 816 is a p-type semiconductor layer, the second conductive type dopant may include Mg, Zn, Ca, Sr, or Ba as a p-type dopant.

The window layer 820 may be disposed below the light emitting structure 810. The window layer 820 may be disposed between the second conductive type semiconductor layer 816 and the lower electrode 840 to perform a current spreading function. The window layer 820 may be made of a semiconductor material having a compositional formula of $In_xAl_yGa_{1-x-y}P$ ($0 \leq x \leq 1$, $0 \leq y \leq 1$, $0 \leq x+y \leq 1$), but is not limited thereto. The window layer 820 may be made of at least one of Zn, Cd, S, Se, Al, Ga, As, Te, In, and P. For example, when the first window semiconductor layer 420 includes Zn, the first window semiconductor layer 420 may be made of a material selected from ZnSe, ZnTe, and ZnS, but is not limited thereto. The window layer 820 may be made of a material selected from InAlGaP, InAlP, GaP, and InGaP as phosphorous (P)-based semiconductors.

The window layer 820 may include a second conductive type dopant. For example, when the second conductive type semiconductor layer 816 includes a p-type dopant, the window layer 820 may include the p-type dopant. The window layer 820 may include a doping concentration greater than that of the second conductive type semiconductor layer 816, but is not limited thereto.

The window layer 820 may have a thickness greater than that of the second conductive type semiconductor layer 816, but is not limited thereto.

A plurality of recesses may be provided in a lower portion of the window layer 820. The plurality of recesses may be formed in an area overlapping the active layer 814, but is not limited thereto.

Also, the first reflection layer 830 may be an omni directional reflector (ODR) or a distributed bragg reflector (DBR), but is not limited thereto. For example, the first reflection layer 830 may be provided as a single layer or a multi layer and made of at least one of SiO2, SiN, Al2O3, ZnO, and ITO.

The first reflection layer 830 may be disposed under the window layer 820. The first reflection layer 830 may be disposed between the window layer 820 and the lower electrode 840. The first reflection layer 830 may directly contact a lower portion of the window layer 820. The first reflection layer 830 may be disposed in the plurality of recesses of the window layer 820. The first reflection layer 830 may extend from the recess that is adjacent to an edge of the window layer 820 to the edge of the window layer 820. For example, the first reflection layer 830 may extend up to the outside of the window layer 820. The first reflection layer 830 may provide a function of reflecting light emitted from the light emitting structure 810 to the outside. The first reflection layer 830 may be disposed in the plurality of recesses of the window layer 820 to reflect light emitted from the light emitting device 810 in various directions along the plurality of recesses to improve light extraction efficiency of the light emitting device.

The first reflection layer 830 according to the eighth embodiment may be, for example, a DBR. The first reflection layer 830 may include first and second dielectric layers 831 and 132 having refractive indexes different from each other. The first and second dielectric layers 831 and 132 may have a structure of one or more pairs. For example, in the first reflection layer 830, at least four pairs or more of first and second dielectric layers 831 and 132 may be alternately deposited, but is not limited thereto. For example, the first reflection layer 830 may be provided with four pairs to eight pairs of dielectric layers. When the first reflection layer 830 is less than four pairs, reflexibility may be deteriorated to cause a light loss. When exceeding eight pairs, the reflexibility may do not largely increase when compared to the eight pairs, and also, the first reflection layer 830 may increase in thickness. Thus, since the light emitting device increases in size, it is difficult to perform the process of manufacturing the light emitting device, and damage such as cracks may occur. The first reflection layer 830 may have a thickness of $\lambda/4n$, but is not limited thereto. Here, A represents a wavelength of light emitted from the active layer 814, and n represents a refractive index of the first reflection layer 830.

Each of the first and second dielectric layers 831 and 132 may include at least one of Si, Zr, Ta, Ti, and Al, but is not limited thereto. For example, the first dielectric layer 831 may include one of SiO2 and Al2O3, and the second dielectric layer 832 may include one of SiN, Si—H, Si3N4, TiO2, and ZrO2, which have a refractive index greater than that of the first dielectric layer 831, but are not limited thereto.

The lower electrode 840 may include a conductive pattern 841, a second reflection layer 842, a bonding layer 844, and a support substrate 846.

The conductive pattern 841 may be disposed below the light emitting structure 810. The conductive pattern 841 may be disposed under the window layer 820 and directly contact the window layer 820. The conductive pattern 841 may include an ohmic pattern coming into ohmic contact with the window layer 820. The conductive pattern 841 may be disposed between the plurality of adjacent recesses of the window layer 820. Particularly, the conductive pattern 841 may be disposed below the window layer 820 that is exposed from the first reflection layer 830. The conductive pattern 830 may be disposed on an area vertically overlapping the light emitting structure 810, but is not limited thereto.

Also, the conductive pattern 841 may be provided as a single layer or a multi layer. The conductive pattern 841 may include at least one of Ag, Ni, Cr, Ti, Al, Rh, Pd, Ir, Ru, Mg, Zn, Pt, Au, Hf, Be, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZON (IZO Nitride), AGZO (Al—Ga ZnO), IGZO (In—Ga ZnO), ZnO, IrOx, RuOx, NiO, RuOx/ITO, Ni/IrOx/Au, and Ni/IrOx/Au/ITO, but is not limited to the above-described materials.

The second reflection layer 842 may be provided as a ling layer or a plurality of layers having superior electrical contact properties and high reflectivity. For example, the second reflection layer 842 may be provided as a single layer or a multi layer, which is made of a metal or an alloy including at least one of Pd, Ir, Ru, Mg, Zn, Pt, Ag, Ni, Al, Rh, Au, and Hf.

Each of the bonding layer 844 and the support substrate 846 may be provided as a single layer or a plurality of layers. The bonding layer 844 may be made of at least one of Ni, Ti, Cr, Pt. Au, Sn, In, Pd, Cu, and TiW, but is not limited to the above-described materials. Also, the support substrate 846 may be made of a material having superior electrical contact properties. For example, the support substrate 846 may selectively include a carrier wafer (e.g., GaN, Si, Ge, GaAs, ZnO, SiGe, SiC, etc), Cu, Au, Cu Alloy, Ni, Cu—W, and the like.

The light emitting device according to the eighth embodiment may include an upper electrode pad 874 and a branch electrode 872. Although one upper electrode pad 874 and the plurality of branch electrodes 872 are described in an embodiment, the present invention is not limited thereto. For example, at least two or more upper electrode pads 874 and branch electrodes 872 may be provided. Here, in this embodiment, a conductive layer 872 may be disposed between the first conductive type semiconductor layer 812 and the branch electrode 871. The conductive layer 871 may be disposed below the branch electrode 872. The conductive layer 871 may be provided as a single layer or a plurality of layers, which is made of a material having superior electrical contact with the semiconductor. The conductive layer 871 may include an ohmic layer for allow the branch electrode 872 to come into ohmic contact with the first conductive type semiconductor layer 812.

The upper electrode pad 874 may be electrically connected to the branch electrode 872. The upper electrode pad 874 may directly contact the first conductive type semiconductor layer 812. The upper electrode pad 874 may come into schottky contact with the first conductive type semiconductor layer 812, and the branch electrode 872 may come into ohmic contact with the first conductive type semiconductor layer 812. For example, the upper electrode pad 874 and the first conductive type semiconductor layer 812 may come into schottky contact with each other to control a flow of current through a potential barrier of a junction part by reverse bias. Thus, in this embodiment, since the current is induced to relatively well flow to the branch electrode 872 coming into ohmic contact with the first conductive type semiconductor layer 812, a current spreading effect may be improved to improve a light output.

The structure in which the upper electrode pad 874 directly contacts the first conductive type semiconductor layer 812 is described, but is not limited thereto. For example, the conductive layer 871 may be disposed between the upper electrode pad 874 and the first conductive type semiconductor layer 812, or the conductive layer 871 may be disposed between the upper electrode pad 874 and the first conductive type semiconductor layer 812, and the upper electrode pad 874 may pass through the conductive layer 871 to contact the first conductive type semiconductor layer 812. Here, the upper electrode pad 874 may be made of a material having resistance greater than that of the branch electrode 872. That is, in the light emitting device, the current may be induced to flow to the branch electrode 872 by the upper electrode pad 874 having the resistance greater than that of the branch electrode 872 to improve the current spreading effect, thereby improving the light output.

Each of the upper electrode pad 874 and the branch electrode 872 may be provided as a single layer or a plurality of layers and also be made of at least one of Ti, Cr, Ni, Al, Pt, Au, W, Cu, Mo, and Cu—W, but is not limited thereto.

In the light emitting device according to the eighth embodiment, the first reflection layer 830 may be disposed on the window layer 820 including the plurality of recesses, in the plurality of recesses of the window layer 820, and below the edge of the window layer 820 to reflect light emitted from the light emitting structure 810 in various directions, thereby improving the light extraction efficiency of the light emitting device.

FIG. 33 is a view illustrating a reflectivity and the number of pairs for each wavelength of a first reflection layer in a light emitting device having a red wavelength according to a ninth embodiment.

Figure 33A:
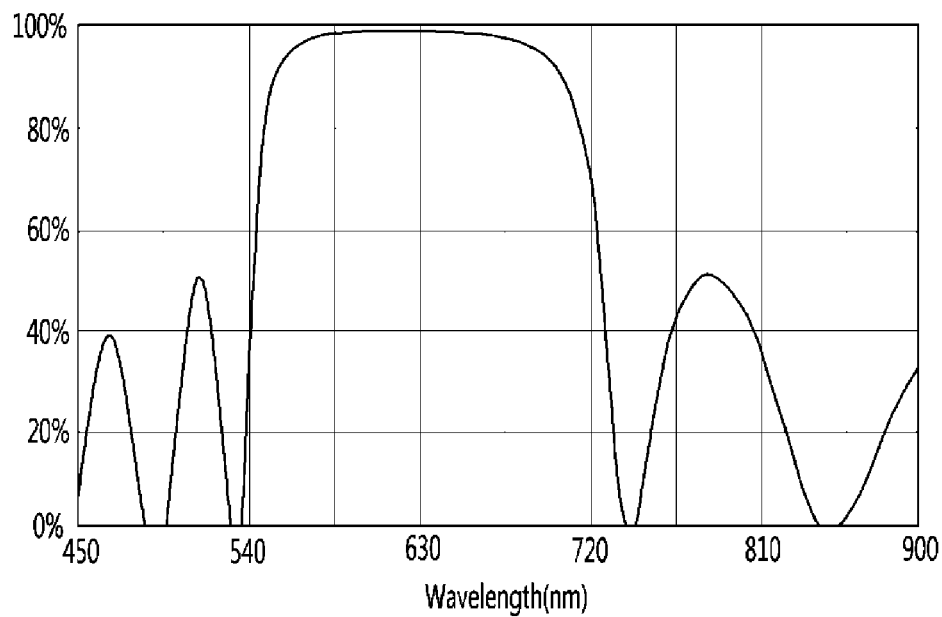
FIG. 33 is a view illustrating reflectivity and the number of pairs for each wavelength of a first reflection layer in a light emitting device having a red wavelength according to a ninth embodiment.

Referring to FIG. 33A, a first reflection layer according to a ninth embodiment may adopt the technical features of the first reflection layer FIGS. 31 and 32.

In the ninth embodiment, the light emitting device may be a light emitting device emitting light having a red wavelength of 600 nm to 700 nm. Particularly, in the first embodiment, the light emitting device may be a light emitting device emitting light having a red wavelength of 620 nm.

The first reflection layer according to the ninth embodiment may include a first dielectric layer and a second dielectric layer. The first dielectric layer may have a refractive index less than that of the second dielectric layer. For example, the first dielectric layer may be SiO2 (n=1.4), and the second dielectric layer may be SiN (n=2.0). Here, n is a refractive index. The first reflection layer may be designed to realize high reflexibility in a wavelength band of 520 nm to 740 nm. The first dielectric layer may have a thickness of 100 nm to 120 nm, and the second dielectric layer may have a thickness of 65 nm to 85 nm. The thickness of each of the first and second dielectric layers may be set to have high reflexibility at a red wavelength. Thus, when the thickness is out of the above-described range, the reflexibility may be deteriorated.

Figure 33B:
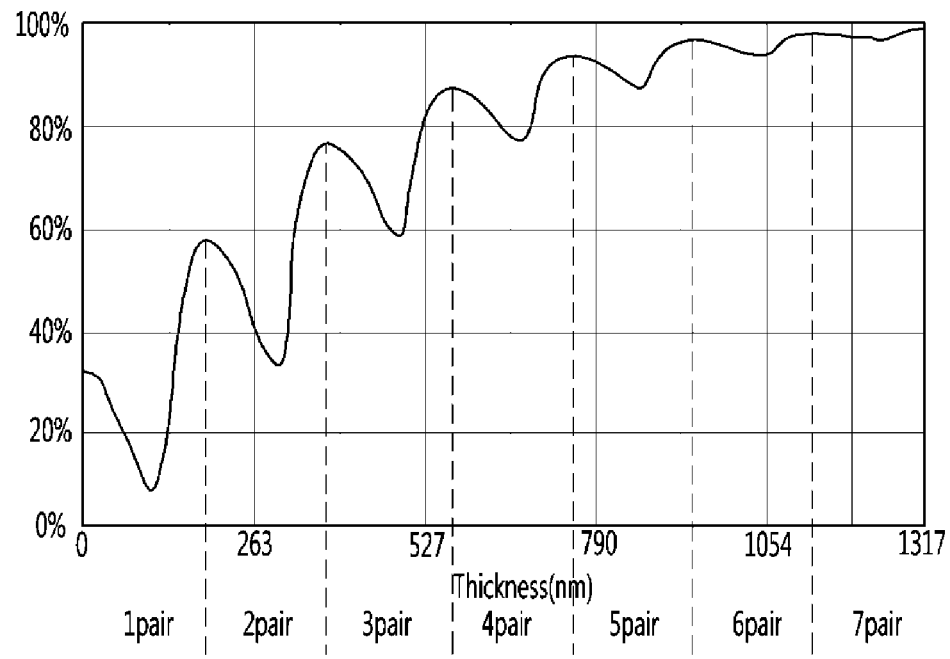

Referring to FIG. 33B, the first reflection layer according to the ninth embodiment may be disposed in the recesses of the window layer including the plurality of recesses and below the edge of the window layer to reflect the light emitted from the light emitting structure in various directions, as well as, each of the first and second dielectric layers may be controlled in thickness according to a wavelength of the light emitted from the light emitting structure to improve the light extraction efficiency. Here, in case of the light emitting structure having the red wavelength, the first dielectric layer of SiO2 (n=1.4), and the second dielectric layer of SiN (n=2.0) in the ninth embodiment, the first dielectric layer may have a thickness of 100 nm to 120 nm and the second dielectric layer may have a thickness of 65 nm to 85 nm, and thus, high reflexibility may realized at four pairs or more.

FIG. 34 is a view illustrating reflectivity and the number of pairs for each wavelength of a first reflection layer in a light emitting device having a red wavelength according to a tenth embodiment.

Figure 34A:
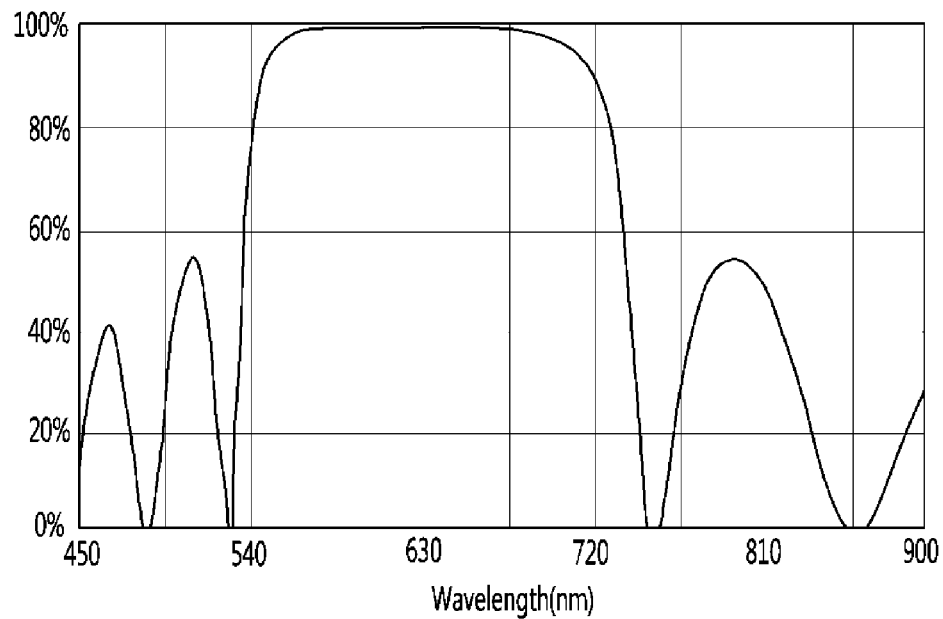
FIG. 34 is a view illustrating reflectivity and the number of pairs for each wavelength of a first reflection layer in a light emitting device having a red wavelength according to a tenth embodiment.

Referring to FIG. 34A, a first reflection layer according to a tenth embodiment may adopt the technical features of the first reflection layer FIGS. 31 and 32.

In the tenth embodiment, the light emitting device may be a light emitting device emitting light having a red wavelength of 600 nm to 700 nm. Particularly, in the tenth embodiment, the light emitting device may be a light emitting device emitting light having a red wavelength of 620 nm.

The first reflection layer according to the tenth embodiment may include a first dielectric layer and a second dielectric layer. The first dielectric layer may have a refractive index less than that of the second dielectric layer. The first dielectric layer may be SiO2 (n=1.4), and the second dielectric layer may be TiO2 (n=2.1). Here, n is a refractive index. The first reflection layer may be designed to realize high reflexibility in a wavelength band of 520 nm to 740 nm. The first dielectric layer may have a thickness of 100 nm to 120 nm, and the second dielectric layer may have a thickness of 65 nm to 85 nm. The thickness of each of the first and second dielectric layers may be set to have high reflexibility at a red wavelength. Thus, when the thickness is out of the above-described range, the reflexibility may be deteriorated.

Figure 34B:
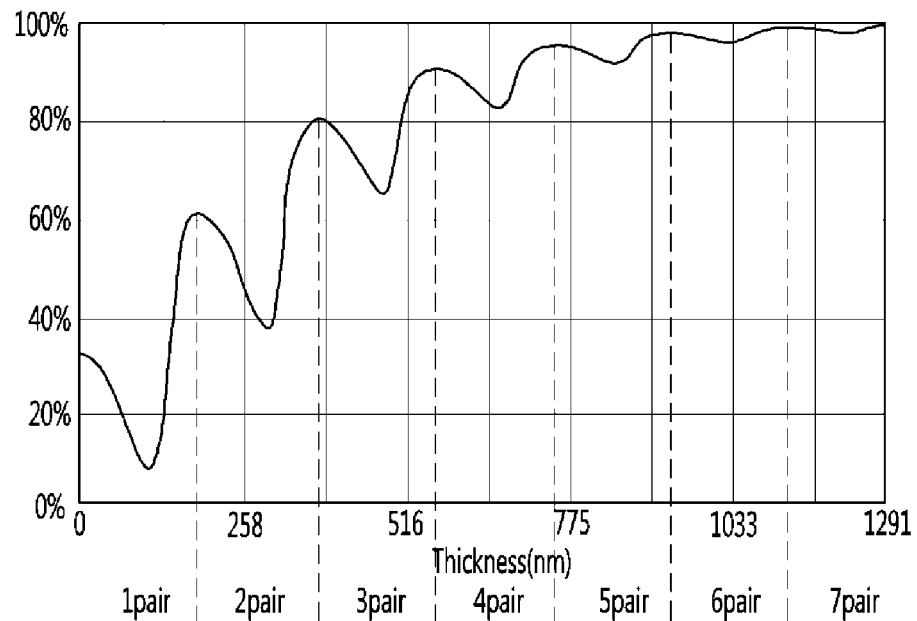

Referring to FIG. 34B, the first reflection layer according to the tenth embodiment may be disposed in the recesses of the window layer including the plurality of recesses and below the edge of the window layer to reflect the light emitted from the light emitting structure in various directions, as well as, each of the first and second dielectric layers may be controlled in thickness according to a wavelength of the light emitted from the light emitting structure to improve the light extraction efficiency. Here, in case of the light emitting structure having the red wavelength, the first dielectric layer of SiO2 (n=1.4), and the second dielectric layer of TiO2 (n=2.1) in the ninth embodiment, the first dielectric layer may have a thickness of 100 nm to 120 nm and the second dielectric layer may have a thickness of 65 nm to 85 nm, and thus, high reflexibility may realized at four pairs or more.

FIG. 35 is a view illustrating reflectivity and the number of pairs for each wavelength of a first reflection layer in a light emitting device having an infrared red wavelength according to an eleventh embodiment.

Figure 35A:
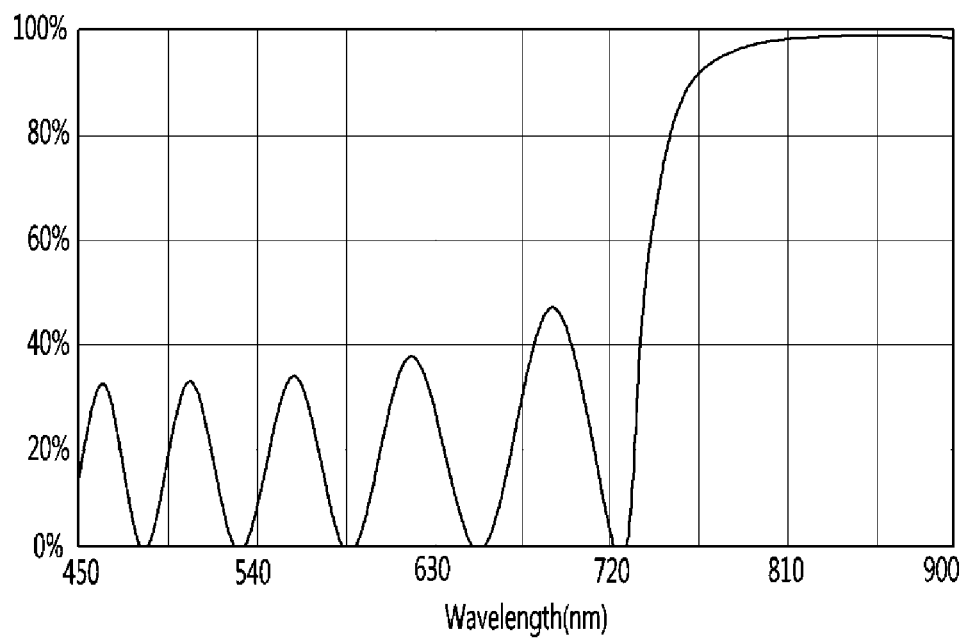
FIG. 35 is a view illustrating reflectivity and the number of pairs for each wavelength of a first reflection layer in a light emitting device having an infrared red wavelength according to an eleventh embodiment.

Referring to FIG. 35A, a first reflection layer according to an eleventh embodiment may adopt the technical features of the first reflection layer FIGS. 31 and 32.

In the eleventh embodiment, the light emitting device may be a light emitting device emitting light having a red wavelength of 720 nm or more. Particularly, in the eleventh embodiment, the light emitting device may be a light emitting device emitting light having a red wavelength of 850 nm.

The first reflection layer according to the eleventh embodiment may include a first dielectric layer and a second dielectric layer. The first dielectric layer may have a refractive index less than that of the second dielectric layer. The first dielectric layer may be SiO2 (n=1.4), and the second dielectric layer may be SiN (n=2.0). Here, n is a refractive index. The first reflection layer may be designed to realize high reflexibility in a wavelength band of 720 nm or more. The first dielectric layer may have a thickness of 140 nm to 160 nm, and the second dielectric layer may have a thickness of 90 nm to 110 nm. The thickness of each of the first and second dielectric layers may be set to have high reflexibility at an infrared red wavelength. Thus, when the thickness is out of the above-described range, the reflexibility may be deteriorated.

Figure 35B:
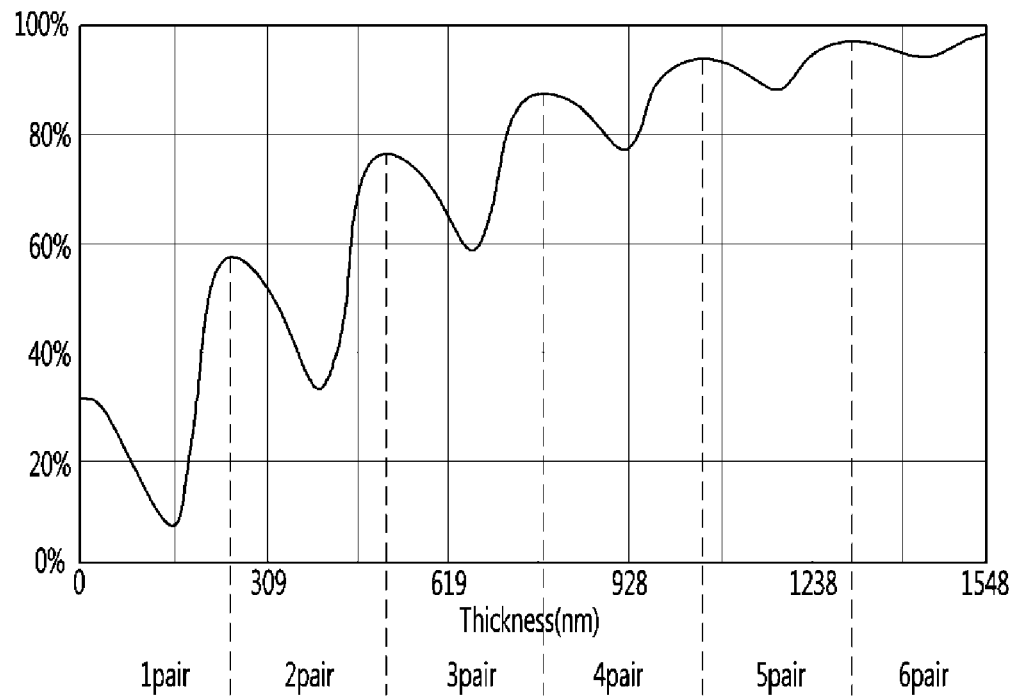

Referring to FIG. 35B, the first reflection layer according to the eleventh embodiment may be disposed in the recesses of the window layer including the plurality of recesses and below the edge of the window layer to reflect the light emitted from the light emitting structure in various directions, as well as, each of the first and second dielectric layers may be controlled in thickness according to a wavelength of the light emitted from the light emitting structure to improve the light extraction efficiency. Here, in case of the light emitting structure having the infrared red wavelength, the first dielectric layer of SiO2 (n=1.4), and the second dielectric layer of SiN (n=2.0) in the eleventh embodiment, the first dielectric layer may have a thickness of 140 nm to 160 nm and the second dielectric layer may have a thickness of 90 nm to 110 nm, and thus, high reflexibility may realized at four pairs or more.

FIG. 36 is a view illustrating a reflectivity and the number of pairs for each wavelength of a first reflection layer in a light emitting device having an infrared red wavelength according to a twelfth embodiment.

Figure 36A:
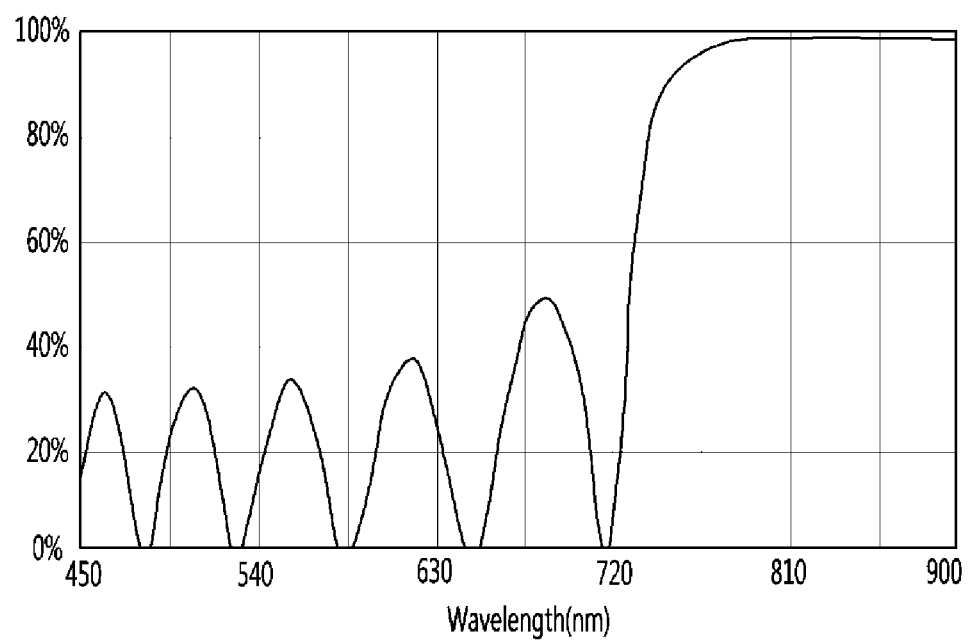
FIG. 36 is a view illustrating a reflectivity and the number of pairs for each wavelength of a first reflection layer in a light emitting device having an infrared red wavelength according to a twelfth embodiment.

Referring to FIG. 36A, a first reflection layer according to a twelfth embodiment may adopt the technical features of the first reflection layer FIGS. 31 and 32.

In the twelfth embodiment, the light emitting device may be a light emitting device emitting light having a red wavelength of 720 nm or more. Particularly, in the twelfth embodiment, the light emitting device may be a light emitting device emitting light having a red wavelength of 850 nm.

The first reflection layer according to the twelfth embodiment may include a first dielectric layer and a second dielectric layer. The first dielectric layer may have a refractive index less than that of the second dielectric layer. The first dielectric layer may be SiO2 (n=1.4), and the second dielectric layer may be TiO2 (n=2.1). Here, n is a refractive index. The first reflection layer may be designed to realize high reflexibility in a wavelength band of 720 nm or more. The first dielectric layer may have a thickness of 140 nm to 160 nm, and the second dielectric layer may have a thickness of 90 nm to 110 nm. The thickness of each of the first and second dielectric layers may be set to have high reflexibility at an infrared red wavelength. Thus, when the thickness is out of the above-described range, the reflexibility may be deteriorated.

Figure 36B:
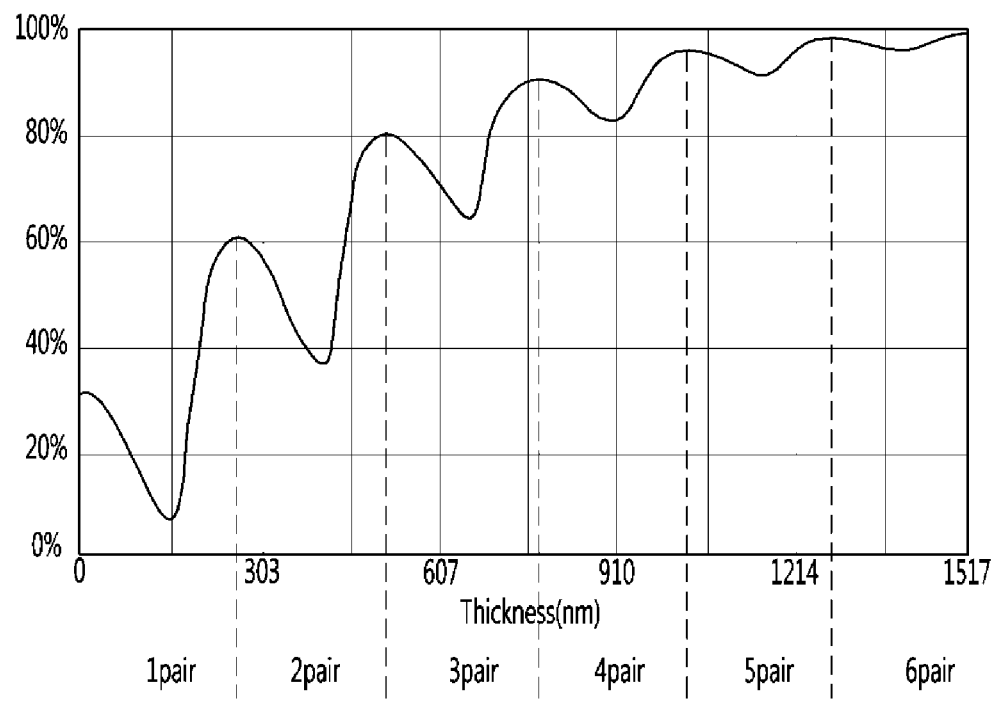

Referring to FIG. 36B, the first reflection layer according to the twelfth embodiment may be disposed in the recesses of the window layer including the plurality of recesses and below the edge of the window layer to reflect the light emitted from the light emitting structure in various directions, as well as, each of the first and second dielectric layers may be controlled in thickness according to a wavelength of the light emitted from the light emitting structure to improve the light extraction efficiency. Here, in case of the light emitting structure having the infrared red wavelength, the first dielectric layer of SiO2 (n=1.4), and the second dielectric layer of TiO2 (n=2.1) in the twelfth embodiment, the first dielectric layer may have a thickness of 140 nm to 160 nm and the second dielectric layer may have a thickness of 90 nm to 110 nm, and thus, high reflexibility may realized at four pairs or more.

Hereinafter, a method of manufacturing the light emitting device according to the eighth embodiment will be described with reference to FIGS. 37 to 43.

Figure 37:
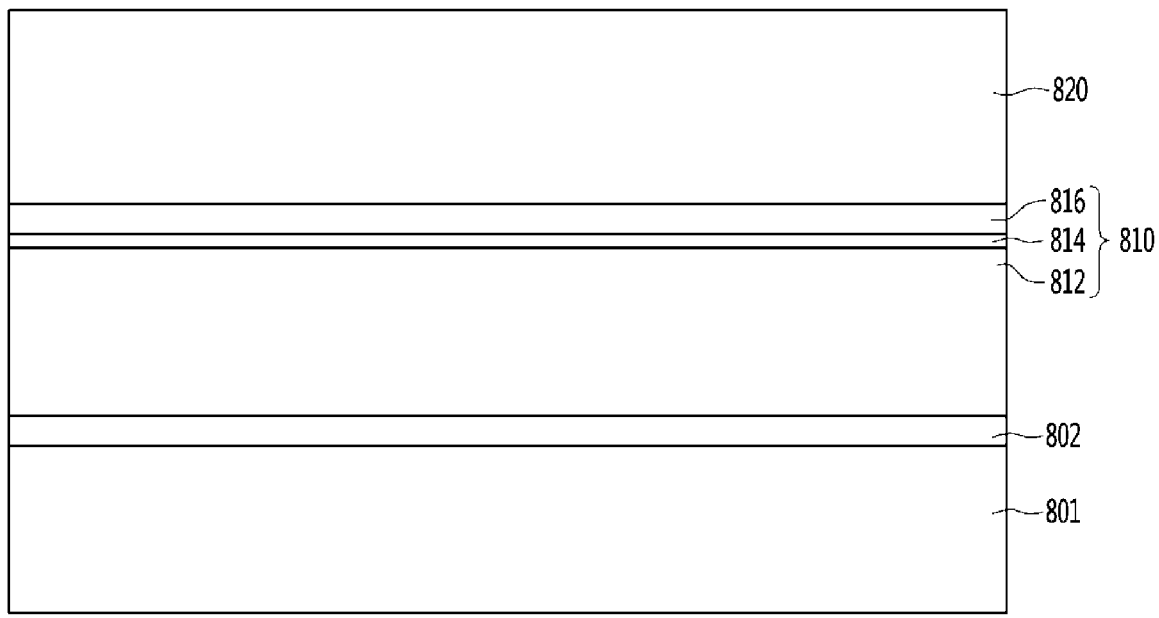
FIGS. 37 to 43 are views illustrating a method for manufacturing the light emitting device according to the ninth embodiment.

Referring to FIG. 37, a substrate 801 is prepared first. The substrate 801 may be made of a material having high thermal conductivity. Also, the substrate 801 may be provided as a single layer or a multi layer. The substrate 801 may be a conductive substrate or an insulation substrate. For example, the substrate 801 may be made of at least one of GaAs, sapphire (Al2O3), SiC, Si, GaN, ZnO, GaP, InP, Ge, and Ga2O3. A cleaning process may be performed on the substrate 801 before the light emitting structure 810 is formed to remove impurities on a surface of the substrate 401.

A buffer layer 801 may be disposed between the substrate 802 and the light emitting structure 810.

The buffer layer 802 may reduce a difference in lattice constant between the substrate 801 and a semiconductor layer. The buffer layer 402 may be made of a material selected from GaN, AlN, AlGaN, InGaN, InN, InAlGaN, AlInN, AlGaAs, GaP, GaAs, GaAsP, and AlGaInP. For example, the buffer layer 802 may be an undoped GaN, but is not limited thereto.

The light emitting structure 810 may emit light having a red wavelength, but is not limited thereto. The light emitting structure 810 may include a first conductive type semiconductor layer 812, an active layer 814 formed on the first conductive type semiconductor layer 812, and a second conductive type semiconductor layer 816 formed on the active layer 814. The light emitting structure 810 may have a cross-section with the same width or a width that gradually decreases toward the second conductive type semiconductor layer 816, the active layer 814, and the first conductive type semiconductor layer 812, but is not limited thereto.

The first conductive type semiconductor layer 812 may be realized by using a semiconductor compound, for example, a group-group and a compound semiconductor such as a group-group. The first conductive type semiconductor layer 812 may be provided as a single layer or a multi layer. A first conductive type dopant may be doped into the first conductive type semiconductor layer 812. For example, when the first conductive type semiconductor layer 812 is an n-type semiconductor layer, an n-type dopant may be doped. For example, the n-type dopant may include Si, Ge, Sn, Se, and Te, but is not limited thereto. The first conductive type semiconductor layer 812 may include a semiconductor material having a compositional formula of $In_xAl_yGa_{1-x-}$ yP (0≤x≤1, 0≤y≤1, 0≤x+y≤1), but is not limited thereto. For example, the first conductive type semiconductor layer 812 may be made of at least one of AlGaP, InGaP, AlInGaP, InP, GaN, InN, AlN, InGaN, AlGaN, InAIGaN, AlInN, AlGaAs, InGaAs, AlInGaAs, and GaP.

The first conductive type semiconductor layer 812 may be formed by using a method such as chemical vapor deposition (CVD), molecular beam epitaxy (MBE), sputtering, or hydride vapor phase epitaxy (HVPE), but is not limited thereto.

The active layer 814 may be formed on the first conductive type semiconductor layer 812.

The active layer 814 may selectively include a single quantum well structure, a multi quantum well (MQW) structure, a quantum wire structure, or a quantum dot structure. The active layer 814 may be made of a compound semiconductor. The active layer 814 may be realized by using, for example, at least one of a group-group and a group-group compound semiconductor.

The active layer 814 may include a quantum well and a quantum barrier. When the active layer 814 has a multi quantum well structure, the quantum well and the quantum barrier may be alternately disposed. Each of the quantum well and the quantum barrier may be made of a semiconductor material having a compositional formula of $In_xAl_yGa_{1-x-y}P$ (0≤x≤1, 0≤y≤1, 0≤x+y≤1) or have a structure of one or more pairs of GaInP/AlGaInP, GaP/AlGaP, InGaP/AlGaP, InGaN/GaN, InGaN/InGaN, GaN/AlGaN, InAIGaN/GaN, GaAs/AlGaAs, and InGaAs/AlGaAs, but is not limited thereto.

The second conductive type semiconductor layer 816 may be formed on the active layer 814. The second conductive type semiconductor layer 816 may be realized by using a semiconductor compound, for example, a group-group and a group-group compound semiconductor. The second conductive type semiconductor layer 816 may be provided as a single layer or a multi layer. A second conductive type dopant may be doped into the second conductive type semiconductor layer 816. For example, the second conductive type semiconductor layer 816 may include a semiconductor material having a compositional formula of $In_xAl_yGa_{1-x-y}P$ (0≤x≤1, 0≤y≤1, 0≤x+y≤1), but is not limited thereto. For example, the second conductive type semiconductor layer 816 may be made of at least one of AlGaP, InGaP, AlInGaP, InP, GaN, InN, AlN, InGaN, AlGaN, InAIGaN, AlInN, AlGaAs, InGaAs, AlInGaAs, and GaP. When the second conductive type semiconductor layer 816 is a p-type semiconductor layer, the second conductive type dopant may include Mg, Zn, Ca, Sr, or Ba as a p-type dopant.

Although the first conductive type AlGaN-based semiconductor layer 812 is provided as the n-type semiconductor layer, and the second conductive type AlGaN-based semiconductor layer 816 is provided as the p-type semiconductor layer, the first conductive type AlGaN-based semiconductor layer 812 may be provided as the p-type semiconductor layer, and the second conductive type AlGaN-based semiconductor layer 816 is provided as the n-type semiconductor layer, but are not limited thereto. A semiconductor having a polarity opposite to the second conductive type semiconductor, for example, an n-type semiconductor layer (not shown) may be formed on the second conductive type AlGaN-based semiconductor layer 816. Thus, the light emitting structure 810 may have one structure of an n-p junction structure, a p-n junction structure, an n-p-n junction structure, and a p-n-p junction structure.

The window layer 820 may be formed on the second conductive type semiconductor layer 816. The window layer 820 may directly contact the second window semiconductor layer 816. The window layer 820 may be made of a semiconductor material having a compositional formula of $In_xAl_yGa_{1-x-y}P$ (0≤x≤1, 0≤y≤1, 0≤x+y≤1), but is not limited thereto. The window layer 820 may improve the current spreading effect. The window layer 820 may be made of at least one of Zn, Cd, S, Se, Al, Ga, As, Te, In, and P. For example, when the first window semiconductor layer 420 includes Zn, the first window semiconductor layer 420 may be made of a material selected from ZnSe, ZnTe, and ZnS, but is not limited thereto. For example, the window layer 820 may be made of a material selected from InAlGaP, InAlP, GaP, and InGaP as phosphorous (P)-based semiconductors.

The window layer 820 may be formed by using a method such as chemical vapor deposition (CVD), molecular beam epitaxy (MBE), sputtering, or hydride vapor phase epitaxy (HVPE), but is not limited thereto.

The window layer 820 may include a second conductive type dopant. For example, when the second conductive type semiconductor layer 816 includes a p-type dopant, the window layer 820 may include the p-type dopant. The first window layer 820 may include a doping concentration greater than that of the second conductive type semiconductor layer 816, but is not limited thereto.

The window layer 820 may have a thickness greater than that of the second conductive type semiconductor layer 816, but is not limited thereto.

Figure 38:
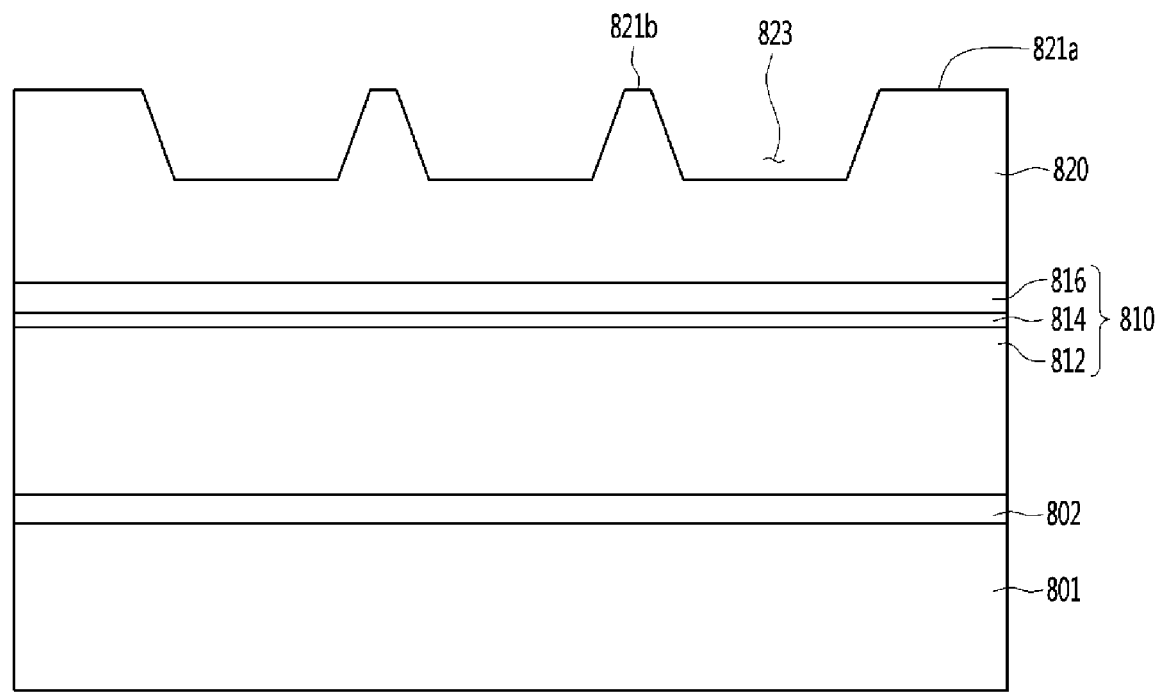

Referring to FIG. 38, a plurality of recesses 823 may be defined in the window layer 820.

The plurality of recesses 823 may be defined in a top surface of the window layer 820. The plurality of recesses 823 may be formed through an etching process using photoresist, but is not limited thereto.

A top surface of the window layer 820 may include a first area 821*a* disposed on an edge of the window layer 820 and a second area 821*b* disposed between the plurality of recesses 823.

Figure 39:
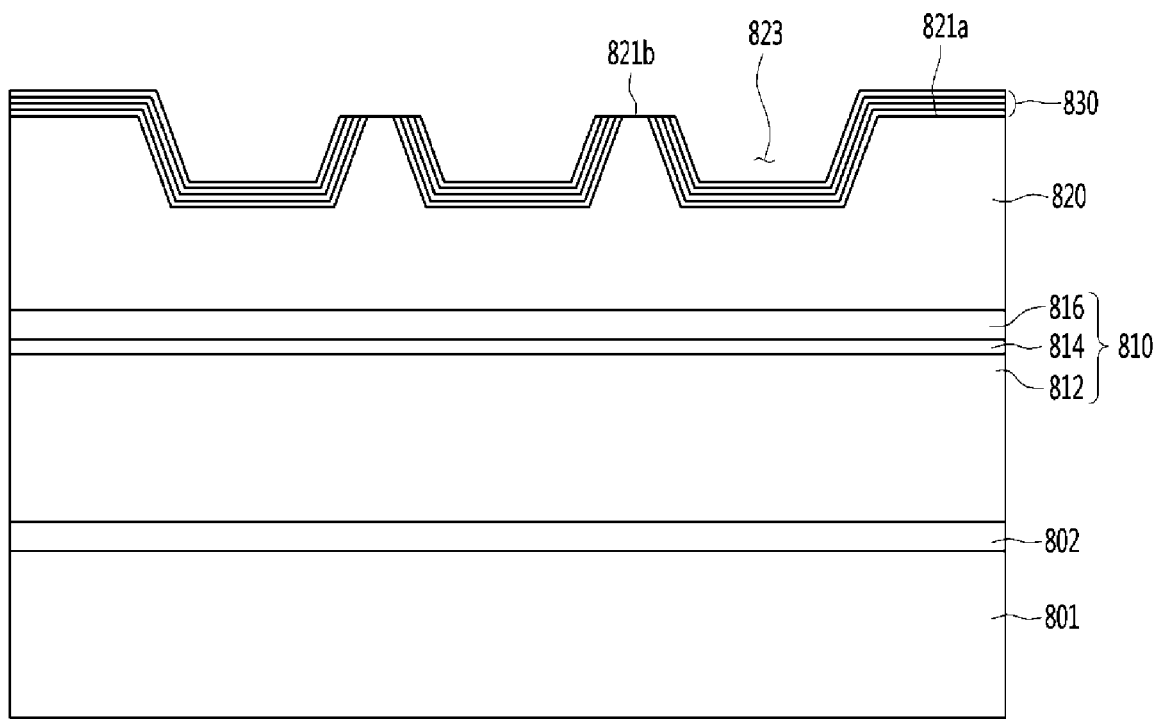

Referring to FIG. 39, a first reflection layer 830 may be formed on the window layer 820. The first reflection layer 830 may be deposited on the window layer 820 and formed through the etching process using the photoresist. The first reflection layer 830 may be formed in the plurality of recesses 823 of the window layer 820 and also formed in the first area 821*a*. The first reflection layer 830 may expose the second area 821*b* of the window layer 820 to the outside.

The first reflection layer 830 may directly contact the window layer 820. The first reflection layer 830 may extend up to an end of the edge of the window layer 820. The first reflection layer 830 may provide a function of reflecting light emitted from the light emitting structure 810 to the outside. The first reflection layer 830 may be formed in the plurality of recesses 823 of the window layer 820 to correspond to the plurality of recesses 823. Thus, the first reflection layer 830 may reflect light emitted from the light emitting structure 810 in various directions to improve light extraction efficiency.

The first reflection layer 830 may include first and second dielectric layers 831 and 132 having refractive indexes different from each other. The first and second dielectric layers 831 and 132 may have a structure of one or more pairs. For example, in the first reflection layer 830, at least four pairs or more of first and second dielectric layers 831 and 132 may be alternately deposited. For example, the first reflection layer 830 may be provided with four pairs to eight pairs of dielectric layers. The first reflection layer 830 may have a thickness of $\lambda/4n$, but is not limited thereto.

Each of the first and second dielectric layers 831 and 132 may include at least one of Si, Zr, Ta, Ti, and Al, but is not limited thereto. For example, the first dielectric layer 831 may include one of SiO2 and Al2O3, and the second dielectric layer 832 may include one of SiN, Si—H, Si3N4, TiO2, and ZrO2, which have a refractive index greater than that of the first dielectric layer 831.

Figure 40:
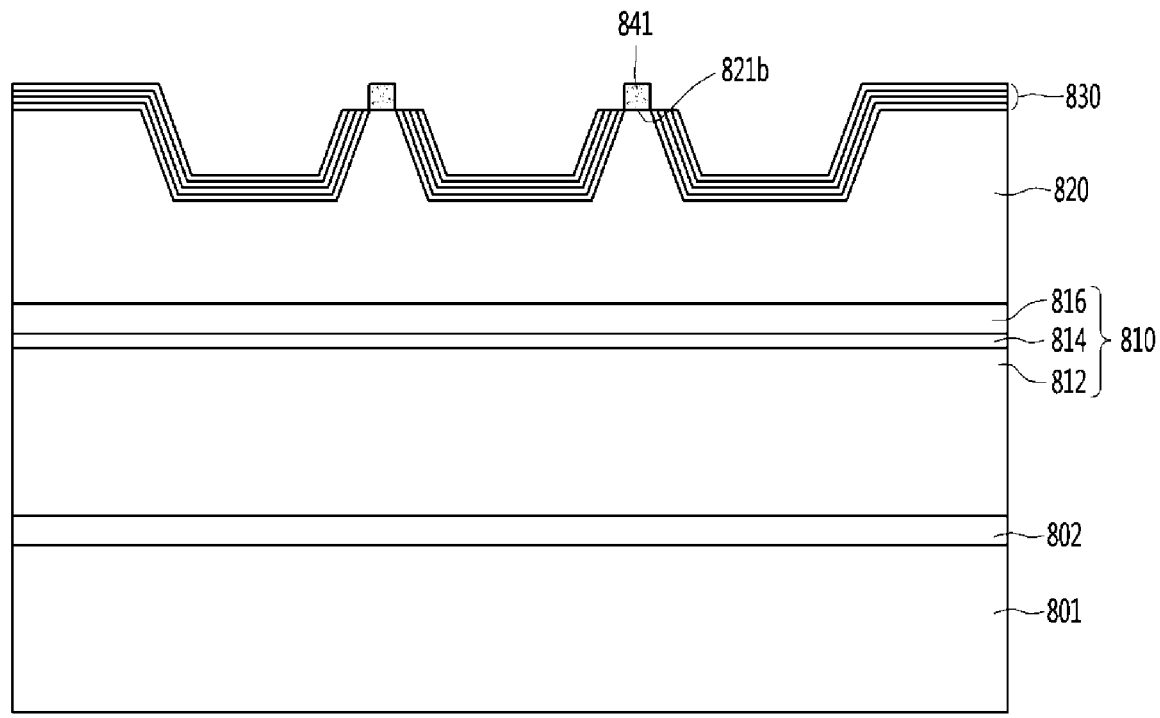

Referring to FIG. 40, a conductive pattern 841 may be formed on the window layer 820. For example, the conductive pattern 841 may be formed on the second area 821b of the window layer 820, which is exposed from the first reflection layer 830. The conductive pattern 841 may be deposited on the window layer 820 and formed through the etching process using the photoresist, but is not limited thereto.

Also, the conductive pattern 841 may be made of a material having superior electrical contact properties with respect to the semiconductor. Also, the conductive pattern 841 may be provided as a single layer or a multi layer. The conductive pattern 841 may include at least one of Ag, Ni, Cr, Ti, Al, Rh, Pd, Ir, Ru, Mg, Zn, Pt, Au, Hf, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZON (IZO Nitride), AGZO (Al—Ga ZnO), IGZO (In—Ga ZnO), ZnO, IrOx, RuOx, NiO, RuOx/ITO, Ni/IrOx/Au, and Ni/IrOx/Au/ITO, but is not limited to the above-described materials.

Figure 41:
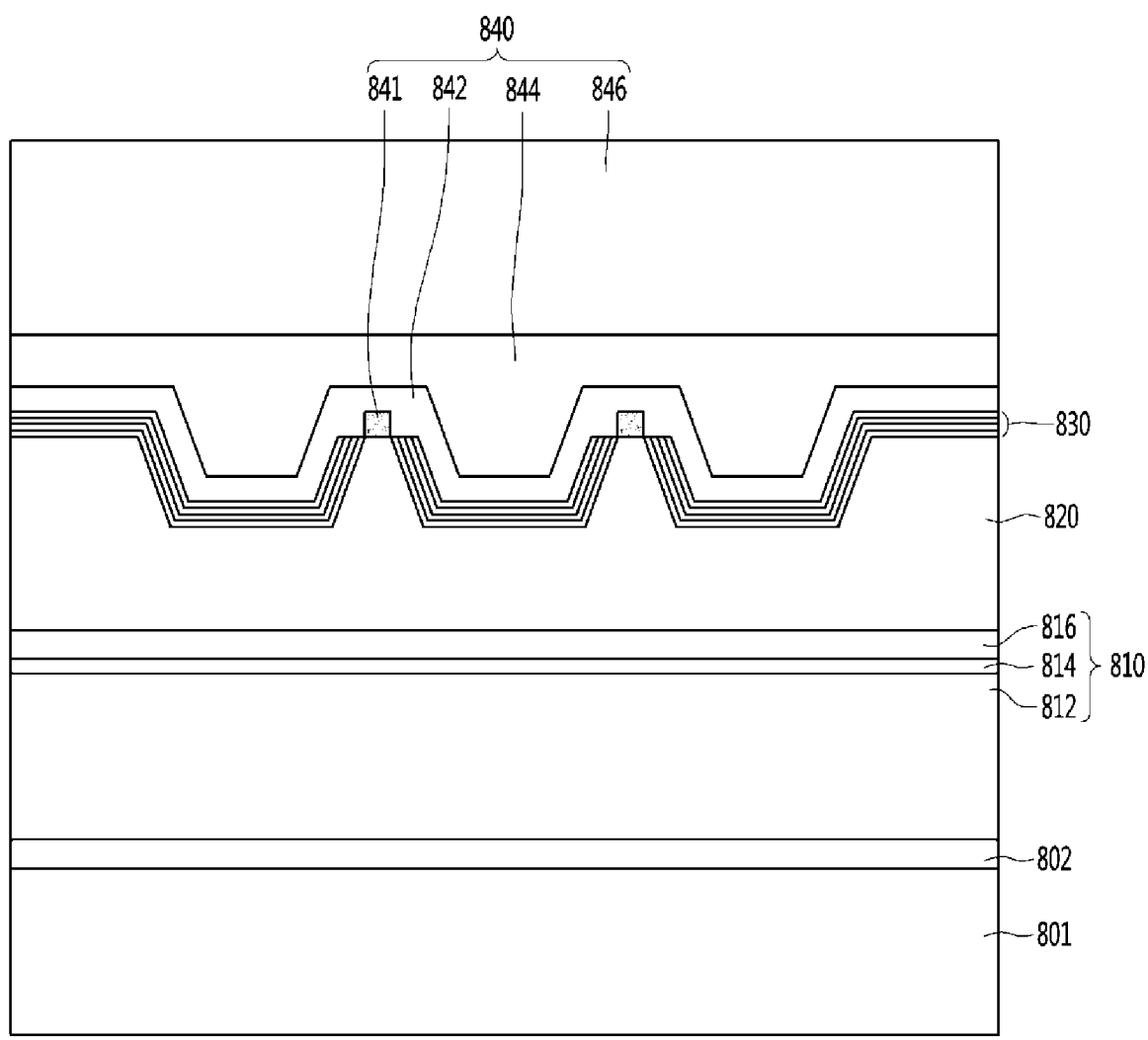

Referring to FIG. 41, a second reflection layer 842, a bonding layer 844, and a support substrate 846 may be formed on the first reflection layer 830 and the conductive pattern 841.

The second reflection layer 842 may be provided as a single layer or a multi layer. The second reflection layer 842 may be made of a material having superior electrical contact properties and high reflectivity. For example, the second reflection layer 842 may be provided as a single layer or a multi layer, which is made of a metal or an alloy including at least one of Pd, Ir, Ru, Mg, Zn, Pt, Ag, Ni, Al, Rh, Au, and Hf.

Also, the bonding layer 844 may be provided as a single layer or a multi layer. Also, the bonding layer 844 may be made of a material having superior electrical contact properties. For example, the bonding layer 844 may be made of at least one of Ni, Ti, Cr, Pt. Au, Sn, In, Pd, Cu, and TiW, but is not limited thereto.

Also, the support substrate 846 may be provided as a single layer or a multi layer. Also, the support substrate 846 may be made of a material having superior electrical contact properties. For example, the support substrate 846 may selectively include a carrier wafer (e.g., GaN, Si, Ge, GaAs, ZnO, SiGe, SiC, etc), Cu, Au, Cu Alloy, Ni, Cu—W, and the like.

Figure 42:
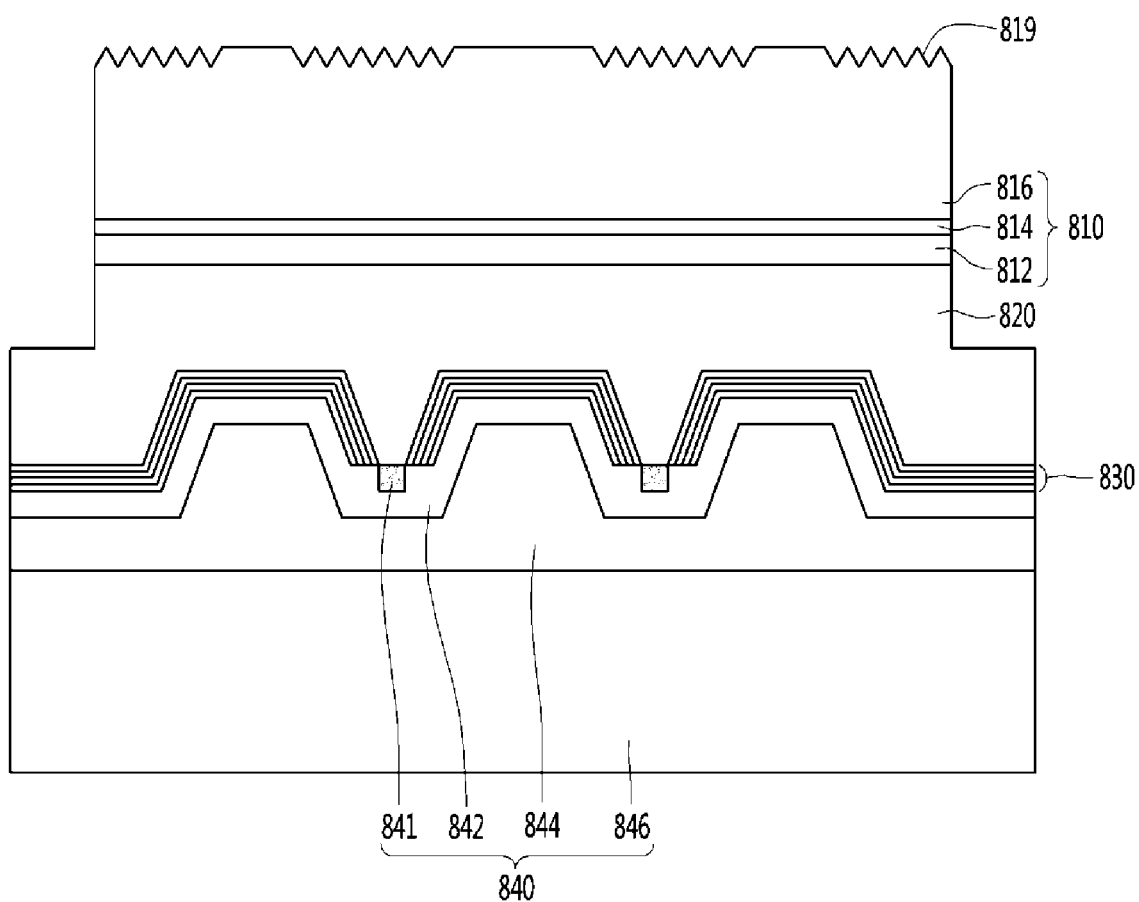

Referring to FIG. 42, the substrate (see reference numeral 101 of FIG. 41) may be removed. The substrate (see reference numeral 101 of FIG. 41) may be removed through laser, chemical etching, or physical etching. For example, the substrate (see reference numeral 101 of FIG. 41) may be removed through a laser lift-off method. According to the laser lift-off method, energy may be applied to an interface between the substrate (see reference numeral 101 of FIG. 41) and the light emitting structure 810 to allow a bonded surface of the light emitting structure 810 to be pyrolyzed, thereby separating the substrate (see reference numeral 101 of FIG. 41) from the light emitting structure 810.

The first conductive type semiconductor layer 812 may be exposed from the substrate (see reference numeral 101 of FIG. 41). A light extraction pattern 819 having a plurality of concave portions and a plurality of convex portions to form a roughness shape may be formed on the surface of the exposed first conductive type semiconductor layer 812.

Figure 43:
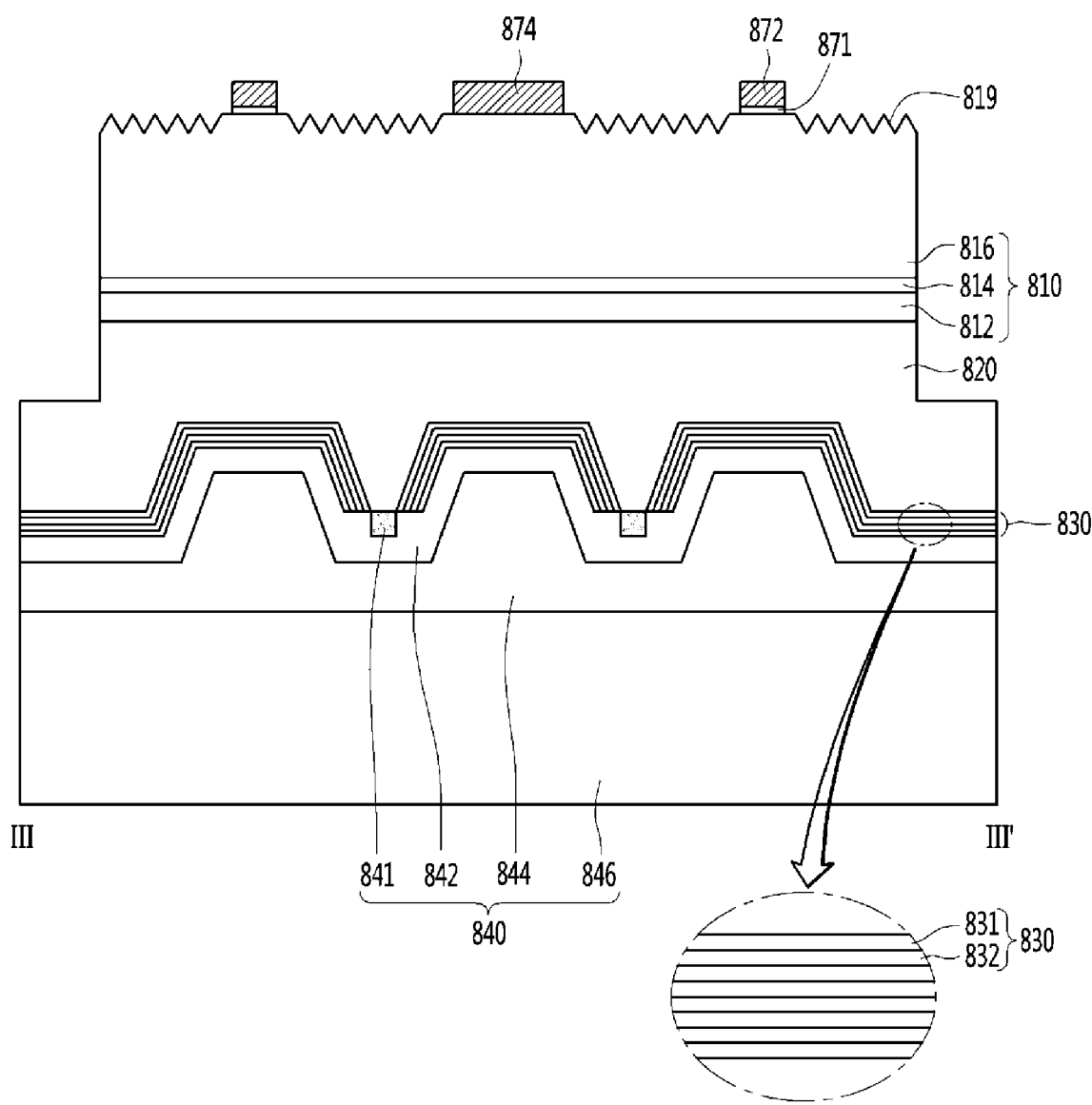

Referring to FIG. 43, the upper electrode pad 874 and the branch electrode 872 may be formed on the exposed first conductive type semiconductor layer 812. The conductive layer 871 may be disposed on the first conductive type semiconductor layer 812. The branch electrode 872 may be disposed below the conductive layer 871. That is, the conductive layer 871 may be disposed between the first conductive type semiconductor layer 812 and the branch electrode 872.

Also, the conductive layer 871 may be provided as a single layer or a multi layer. Also, the conductive layer 871 may be made of a material having superior electrical contact properties with respect to the semiconductor. For example, the conductive layer 871 may include at least one of Ag, Ni, Cr, Ti, Al, Rh, Pd, Ir, Ru, Mg, Zn, Pt, Au, Hf, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZON (IZO Nitride), AGZO (Al—Ga ZnO), IGZO (In—Ga ZnO), ZnO, IrOx, RuOx, NiO, RuOx/ITO, Ni/IrOx/Au, and Ni/IrOx/Au/ITO, but is not limited to the above-described materials.

Each of the upper electrode pad 874 and the branch electrode 872 may be provided as a single layer or a multi layer and also be made of at least one of Ti, Cr, Ni, Al, Pt, Au, W, Cu, Mo, and Cu—W, but is not limited thereto.

Although the method for manufacturing the light emitting device of FIGS. 37 to 43 is described to be limited based on the eighth embodiment, the present invention is not limited thereto. For example, the order of the manufacturing processes may be changed.

In the light emitting device according to the eighth embodiment, the first reflection layer 830 may be disposed on the window layer 820 including the plurality of recesses 823, in the plurality of recesses 823 of the window layer 820, and below the edge of the window layer 820 to reflect light emitted from the light emitting structure 810 in various directions, thereby improving the light extraction efficiency of the light emitting device. That is, in the light emitting device according to the eighth embodiment, the light extraction efficiency may be improved to improve a luminous intensity.

Figure 44:
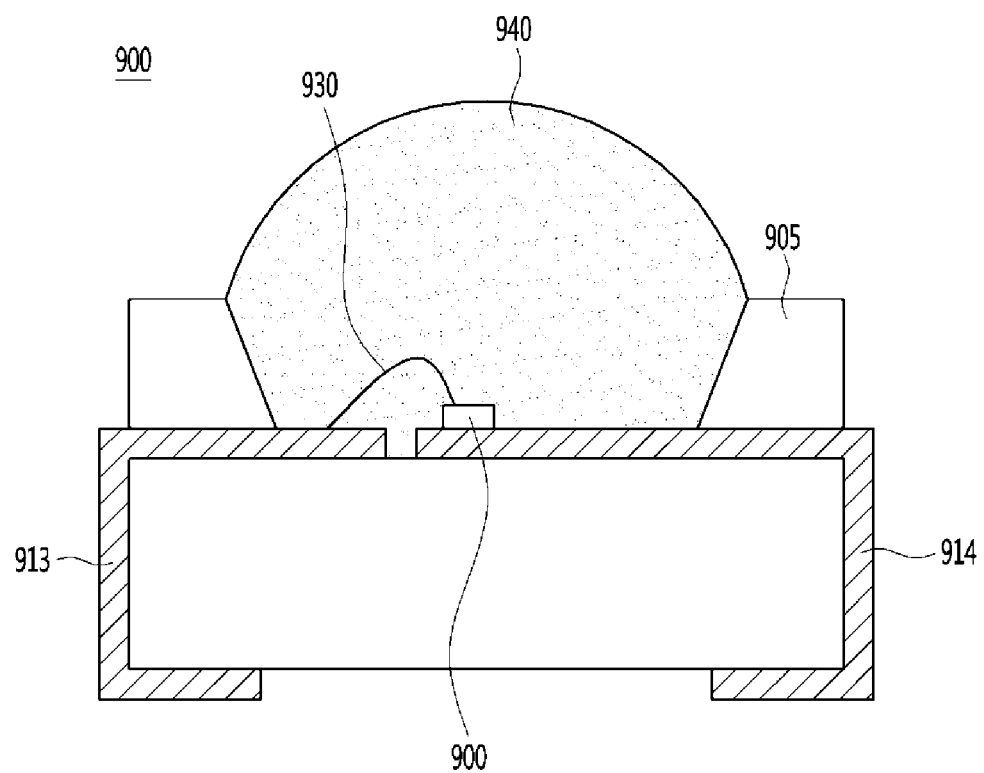
FIG. 44 is a cross-sectional view of a light emitting device package according to an embodiment.

FIG. 44 is a cross-sectional view of a light emitting device package according to an embodiment.

As illustrated in FIG. 44, a light emitting device package 200 according to an embodiment may include a package body 205, first and second lead frames 213 and 214 installed on the package body 205, a light emitting device 800 electrically connected to the first lead frame 213, which is disposed on the second lead frame 213, and the second lead frame 213, and a molding member 240 surrounding the light emitting device 800. The molding member 240 may include a phosphor and have a convex or concave top surface.

The light emitting device 800 may adopt the technical features of FIGS. 1 to 43.

The first lead frame 913 and the second lead frame 914 may be electrically separated from each other. The first lead frame 913 may be electrically connected to the light emitting device 800 by a wire 930 to provide power to the light emitting device 800. Also, the first and second lead frames 913 and 914 may reflect light generated in the light emitting device 800 to increase light efficiency. In addition, the first and second lead frames 913 and 914 may discharge heat generated in the light emitting device 800 to the outside.

The light emitting device 800 may be electrically connected to the first and second lead frames 913 and 914 through one of a wiring process, a flip-chip process, and a die bonding process.

The light emitting device 800 according to an embodiment may be applied to a backlight unit, a lighting unit, a display device, an indicating device, a lamp, a streetlight, a vehicle lighting device, a vehicle display device, a smart watch, and the like, but is not limited thereto.

Features, structures, and effects described in the above embodiments are incorporated into at least one embodiment, but are not limited to only one embodiment. Furthermore, features, structures, and effects exemplified in one embodiment can easily be combined and modified for another embodiment by those skilled in the art. Therefore, these combinations and modifications should be construed as falling within the scope of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A light emitting device comprising:
a lower electrode;
a light emitting structure disposed on the lower electrode and comprising a first conductive type semiconductor layer, an active layer, and a second conductive type semiconductor layer;
an upper electrode pad disposed on the light emitting structure;
at least one branch electrode connected to the upper electrode pad, the at least one branch electrode includes a first branch electrode; and
an upper ohmic layer disposed below the at least one branch electrode,
wherein the upper electrode pad comprises at least one connection electrode connected to the at least one branch electrode, the at least one connection electrode includes a first connection electrode, and
the first connection electrode has an integral structure with the upper electrode pad and protrudes in a first direction from a first side surface of the upper electrode pad by a predetermined distance, and
wherein the first connection electrode includes a first portion that extends in the first direction from a first side to an upper second side, and includes a second portion that extends in the first direction from the first side to a lower second side,
wherein the first branch electrode extends in the first direction from a first end, the first end of the first branch electrode is provided under the first portion of the first connection electrode, and the first end of the first branch electrode directly contacts the lower second side of the second portion of the first connection electrode,
wherein the upper ohmic layer extends in the first direction from a first end, the first end of the upper ohmic layer is provided under the first portion of the first connection electrode, and the first end of the upper ohmic layer directly contacts the lower second side of the second portion of the first connection electrode,
wherein the first portion of the first connection electrode has an area overlapping the first end of the branch electrode and overlapping the first end of the upper ohmic layer,
wherein a top surface of the first portion of the first connection electrode is maintained flat and is coplanar with respect to a top surface of the upper electrode pad such that the area of the first connection electrode overlapping the first end of the branch electrode and overlapping the first end of the upper ohmic layer is maintained flat with respect to remaining area of the top surface of the first portion of the first connection electrode.

2. The light emitting device according to claim 1, wherein the at least one connection electrode one-to-one corresponds to the at least one branch electrode.

3. The light emitting device according to claim 1, wherein the first connection electrode has a width greater than that of the first branch electrode.

4. The light emitting device according to claim 1, wherein the upper electrode pad comprises a first side part, a second side part, a third side part, and a fourth side part facing the first side part,
wherein the at least one connection electrode comprises the first connection electrode protruding from the first side part and a second connection electrode protruding from the fourth side part, and
an end of the first connection electrode is spaced apart from an end of the second connection electrode.

5. The light emitting device according to claim 1, wherein the first connection electrode includes the first portion vertically not overlapping the first branch electrode and the second portion vertically overlapping the first branch electrode and vertically overlaps the upper ohmic layer.

6. The light emitting device according to claim 1, wherein the at least one connection electrode comprises Au, and the at least one branch electrode comprises Au and Ni.

7. The light emitting device according to claim 1, wherein the first portion of the first connection electrode has a first thickness smaller than a second thickness of the second portion of the first connection electrode.

8. The light emitting device according to claim 1, wherein the first end of the first branch electrode has a top surface and at least two side surfaces, the top surface of the first end of the first branch electrode contacting a bottom surface of the first portion of the first connection electrode, and the at least two side surfaces of the first end of the first branch electrode contacting a side surface of the first portion of the first connection electrode and a side surface of the second portion of the first connection electrode.

9. A light emitting device comprising:
a lower electrode;
a light emitting structure disposed on the lower electrode and comprising a first conductive type semiconductor layer, an active layer, and a second conductive type semiconductor layer;
an upper electrode pad disposed on the light emitting structure;
at least one branch electrode connected to the upper electrode pad, the at least one branch electrode includes a first branch electrode; and an upper ohmic layer disposed below the at least one branch electrode, wherein the upper electrode pad comprises at least one connection electrode connected to the at least one branch electrode, the at least one connection electrode includes a first connection electrode, and the first connection electrode has an integral structure with the upper electrode pad and protrudes in a first direction from a first side surface of the upper electrode pad by a predetermined distance, wherein the at least one connection electrode one-to-one corresponds to the at least one branch electrode, and wherein the first connection electrode includes a first portion that extends in the first direction from a first side to an upper second side, and includes a second portion that extends in the first direction from the first side to a lower second side, wherein the first branch electrode extends in the first direction from a first end, the first end of the first branch electrode is provided under the first portion of the first connection electrode, and the first end of the first branch electrode directly contacts the lower second side of the second portion of the first connection electrode, wherein the upper ohmic layer extends in the first direction from a first end, the first end of the upper ohmic layer is provided under the first portion of the first connection electrode, and the first end of the upper ohmic layer directly contacts the lower second side of the second portion of the first connection electrode, wherein the first portion of the first connection electrode has an area overlapping the first end of the branch electrode and overlapping the first end of the upper ohmic layer, wherein a top surface of the first portion of the first connection electrode is maintained flat such that the area of the first connection electrode overlapping the first end of the branch electrode and overlapping the first end of the upper ohmic layer is maintained flat with respect to remaining area of the top surface of the first portion of the first connection electrode.

10. The light emitting device according to claim 9, wherein the first connection electrode has a width greater than that of the first branch electrode.

11. The light emitting device according to claim 9, wherein the upper electrode pad comprises a first side part, a second side part, a third side part, and a fourth side part facing the first side part, wherein the at least one connection electrode comprises first first connection electrode protruding from the first side part and a second connection electrode protruding from the fourth side part, and an end of the first connection electrode is spaced apart from an end of the second connection electrode.

12. The light emitting device according to claim 9, wherein the top surface of the first connection electrode is higher than a top surface of the first branch electrode.

13. The light emitting device according to claim 9, wherein the first connection electrode includes the first portion vertically not overlapping the first branch electrode and the second portion vertically overlapping the first branch electrode and vertically overlaps the upper ohmic layer.

14. The light emitting device according to claim 9, wherein the at least one connection electrode comprises Au, and the at least one branch electrode comprises Au and Ni.

15. The light emitting device according to claim 9, wherein the first portion of the first connection electrode has a first thickness smaller than a second thickness of the second portion of the first connection electrode.

16. The light emitting device according to claim 9, wherein the first end of the first branch electrode has a top surface and at least two side surfaces, the top surface of the first end of the first branch electrode contacting a bottom surface of the first portion of the first connection electrode, and the at least two side surfaces of the first end of the first branch electrode contacting a side surface of the first portion of the first connection electrode and a side surface of the second portion of the first connection electrode.

17. A light emitting device comprising:
a lower electrode;
a light emitting structure disposed on the lower electrode and comprising a first conductive type semiconductor layer, an active layer, and a second conductive type semiconductor layer;
an upper electrode pad disposed on the light emitting structure;
at least one branch electrode connected to the upper electrode pad, the at least one branch electrode includes a first branch electrode; and
an upper ohmic layer disposed below the at least one branch electrode,
wherein the upper electrode pad have a first side part, a second side part, a third side part and a fourth side part,
wherein the upper electrode pad includes at least one connection electrode that protrudes from at least one of the side parts, the at least one connection electrode includes a first connection electrode and a second connection electrode,
wherein the first connection electrode is connected to the first branch electrode, and
the first connection electrode has an integral structure with at least the first side part, the first connection electrode protrudes in a first direction from a side surface of the first side part by a predetermined distance, and the second connection electrode protrudes from a side surface of the fourth side part, and
wherein a top surface of the at least one connection electrode is coplanar with respect to a top surface of the first side part of the upper electrode pad,
wherein the top surface of the at least one connection electrode is higher than a top surface of the at least one branch electrode, and
wherein the first connection electrode includes a first portion that extends in the first direction from a first side to an upper second side, and includes a second portion that extends in the first direction from the first side to a lower second side,
wherein the first branch electrode extends in the first direction from a first end, the first end of the first branch electrode is provided under the first portion of the first connection electrode, and the first end of the first branch electrode directly contacts the lower second side of the second portion of the first connection electrode,
wherein the upper ohmic layer extends in the first direction from a first end, the first end of the upper ohmic layer is provided under the first portion of the first connection electrode, and the first end of the upper ohmic layer directly contacts the lower second side of the second portion of the first connection electrode,
wherein the first portion of the first connection electrode has an area overlapping the first end of the first branch electrode and overlapping the first end of the upper ohmic layer, wherein a top surface of the first portion of the first connection electrode is maintained flat and is coplanar with respect to the top surface of the first side part of the upper electrode pad such that the area of the first connection electrode overlapping the first end of the branch electrode and overlapping the first end of the upper ohmic layer is maintained flat with respect to remaining area of the top surface of the first portion of the first connection electrode.

18. The light emitting device according to claim 17, wherein the at least one connection electrode includes the first connection electrode protruding from the first side part and the second connection electrode protruding from the fourth side part, and
an end of the first connection electrode is spaced apart from an end of the second connection electrode.

19. The light emitting device according to claim 17, wherein the at least one connection electrode one-to-one corresponds to the at least one branch electrode.

20. The light emitting device according to claim 17, wherein the first connection electrode has a width greater than that of the first branch electrode.

21. The light emitting device according to claim 17, wherein the first connection electrode includes the first portion vertically not overlapping the first branch electrode and the second portion vertically overlapping the first branch electrode and vertically overlaps the upper ohmic layer.

22. The light emitting device according to claim 21, wherein a top surface of the first portion and a top surface of the second portion being disposed at a same horizontal plane.

23. The light emitting device according to claim 17, wherein the at least one connection electrode comprises Au, and the at least one branch electrode comprises Au and Ni.

24. The light emitting device according to claim 17, wherein the first portion of the first connection electrode has a first thickness smaller than a second thickness of the second portion of the first connection electrode.

25. The light emitting device according to claim 17, wherein the first end of the first branch electrode has a top surface and at least two side surfaces, the top surface of the first end of the first branch electrode contacting a bottom surface of the first portion of the first connection electrode, and the at least two side surfaces of the first end of the first branch electrode contacting a side surface of the first portion of the first connection electrode and a side surface of the second portion of the first connection electrode.

* * * * *